US007713681B2

(12) United States Patent
Inno et al.

(10) Patent No.: US 7,713,681 B2
(45) Date of Patent: May 11, 2010

(54) METHOD FOR PREPARATION OF LITHOGRAPHIC PRINTING PLATE

(75) Inventors: Toshifumi Inno, Haibara-gun (JP); Keiichi Adachi, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 52 days.

(21) Appl. No.: 11/966,008

(22) Filed: Dec. 28, 2007

(65) Prior Publication Data

US 2008/0160451 A1 Jul. 3, 2008

(30) Foreign Application Priority Data

Dec. 28, 2006 (JP) ............................ 2006-355082
Sep. 26, 2007 (JP) ............................ 2007-250070

(51) Int. Cl.
*G03F 7/26* (2006.01)

(52) U.S. Cl. .................................. 430/302; 430/273.1

(58) Field of Classification Search ............. 430/270.1, 430/302

See application file for complete search history.

(56) References Cited

U.S. PATENT DOCUMENTS

| | | | | |
|---|---|---|---|---|
| 2004/0013968 A1 | | 1/2004 | Teng | |
| 2005/0048404 A1 | * | 3/2005 | Okamoto | 430/302 |
| 2005/0175942 A1 | * | 8/2005 | Ohnishi | 430/434 |
| 2006/0216646 A1 | * | 9/2006 | Goto et al. | 430/302 |
| 2007/0020563 A1 | * | 1/2007 | Inno | 430/302 |
| 2007/0128550 A1 | * | 6/2007 | Inno | 430/302 |

FOREIGN PATENT DOCUMENTS

| | | | |
|---|---|---|---|
| EP | 1349006 A1 | * | 10/2003 |
| EP | 1630618 A2 | * | 3/2006 |
| JP | 2002-365789 A | | 12/2002 |

* cited by examiner

*Primary Examiner*—Mark F Huff
*Assistant Examiner*—Chanceity N Robinson
(74) *Attorney, Agent, or Firm*—Sughrue Mion, PLLC

(57) ABSTRACT

A method for preparation of a lithographic printing plate including: exposing with a laser a lithographic printing plate precursor including a support and a photosensitive layer containing a sensitizing dye, a radical polymerization initiator, a radical polymerizable compound and a binder polymer; and subjecting the exposed lithographic printing plate precursor to development processing with a developer having pH of from 3 to 9 to remove an unexposed area of the photosensitive layer, wherein the binder polymer is a polymer having an acid value of from 10 to 250 mg-KOH/g and the developer contains a compound represented by one of the formulae <1>, <2> and <3> defined herein.

18 Claims, 1 Drawing Sheet

METHOD FOR PREPARATION OF LITHOGRAPHIC PRINTING PLATE

FIELD OF THE INVENTION

The present invention relates to a method for preparation of a lithographic printing plate.

BACKGROUND OF THE INVENTION

In general, a lithographic printing plate has a surface composed of an oleophilic image area and a hydrophilic non-image area. Lithographic printing is a printing method comprising supplying alternately dampening water and oily ink on the surface of lithographic printing plate, making the hydrophilic non-image area a dampening water-receptive area (ink unreceptive area) and depositing the oily ink only to the oleophilic image area by utilizing the nature of the dampening water and oily ink to repel with each other, and then transferring the ink to a printing material, for example, paper.

In order to produce the lithographic printing plate, a lithographic printing plate precursor (PS plate) comprising a hydrophilic support having provided thereon an oleophilic photosensitive layer (image-recording layer) has heretofore been broadly used. Ordinarily, a lithographic printing plate is obtained by conducting plate making by a method of exposing the lithographic printing plate precursor through an original, for example, a lith film, and then treating the exposed lithographic printing plate precursor to remove the photosensitive layer in the unnecessary non-image area by dissolving with a an alkaline developer or an organic solvent thereby revealing a surface of the hydrophilic support to form the non-image area while leaving the photosensitive layer in the image area.

In the hitherto known plate-making process of lithographic printing plate precursor, after the exposure, the step of removing the unnecessary photosensitive layer by dissolving, for example, with a developer is required. However, it is one of the subjects to simplify such an additional wet treatment described above. As one means for the simplification, it has been desired to conduct the development with a nearly neutral aqueous solution or simply with water.

On the other hand, digitalized technique of electronically processing, accumulating and outputting image information using a computer has been popularized in recent years, and various new image outputting systems responding to the digitalized technique have been put into practical use. Correspondingly, attention has been drawn to a computer-to-plate technique of carrying the digitalized image information on highly converging radiation, for example, laser light and conducting scanning exposure of a lithographic printing plate precursor with the light thereby directly preparing a lithographic printing plate without using a lith film. Thus, it is one of the important technical subjects to obtain a lithographic printing plate precursor adaptable to the technique described above.

Based on the background described above, adaptation of plate making operation to both simplification and digitalization has been demanded strongly more and more than ever before.

In response to such a demand, for instance, it is described in JP-A 2002-365789 (the term "JP-A" as used herein means an "unexamined published Japanese patent application") that by incorporating a compound having an ethylene oxide chain into an image-forming layer of a lithographic printing plate precursor comprising a hydrophilic support and the image-forming layer containing a hydrophobic precursor, a hydrophilic resin and a light to heat converting agent, the lithographic printing plate precursor enables printing after conducting exposure and wet development processing using as a developer, water or an appropriate aqueous solution, besides on-machine development.

Also, a processing method of lithographic printing plate precursor is described in U.S. Patent Publication No. 2004/0013968 which comprises preparing a lithographic printing plate precursor comprising (i) a hydrophilic support and (ii) an oleophilic heat-sensitive layer which contains a radical-polymerizable ethylenically unsaturated monomer, a radical polymerization initiator and an infrared absorbing dye, is hardened with infrared laser exposure and is developable with an aqueous developer containing 60% by weight or more of water and having pH of 2.0 to 10.0, exposing imagewise the lithographic printing plate precursor with an infrared laser, and removing the unhardened region of the heat-sensitive layer with the aqueous developer.

However, hitherto known methods for preparation of a lithographic printing plate including development with an aqueous near-neutral solution have problems in that the developing property is poor, in that the photosensitive layer remains in the non-image area, in that satin occurs in the non-image area of a printed material and in that unevenness occurs in the image area of a printed material.

SUMMARY OF THE INVENTION

An object of the present invention is to provide a method for preparation of a lithographic printing plate which exhibits good developing property without residue of the photosensitive layer in the non-image area and which provides a good printed material having no satin in the non-image area and no unevenness in the image area in spite of performing development with an aqueous near-neutral solution.

As a result of intensive investigations based on the recognition in that a combination of a binder polymer used in the photosensitive layer of lithographic printing prate precursor with a surfactant used in the developer is an important factor in the case of performing development with an aqueous near-neutral solution, the inventor has found that the above-described object can be achieved by the following constructions.

(1) A method for preparation of a lithographic printing plate comprising exposing with a laser a lithographic printing plate precursor comprising a support and a photosensitive layer containing (A) a sensitizing dye, (B) a radical polymerization initiator, (C) a radical polymerizable compound and (D) a binder polymer and subjecting the exposed lithographic printing plate precursor to development processing with a developer having pH of 3 to 9 to remove an unexposed area of the photosensitive layer, wherein the binder polymer is a polymer having an acid value of 10 to 250 mg-KOH/g and the developer contains a compound represented by the following formula <1>, <2> or <3>:

<1>

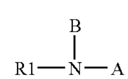

<2>

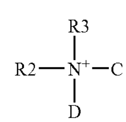

-continued

<3>

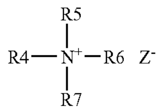

In formula <1>, R1 represents a hydrogen atom, an alkyl group or a substituent having a structure shown below:

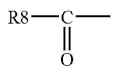

(wherein R8 represents a hydrogen atom or an alkyl group); A represents a hydrogen atom, an alkyl group, a group containing an ethylene oxide group, a group containing a carboxylic acid group or a group containing a carboxylate; and B represents a group containing an ethylene oxide group, a group containing a carboxylic acid group or a group containing a carboxylate. In formula <2>, R2 and R3 each represents a hydrogen atom or an alkyl group, provided that at least one of the alkyl groups may have a substituent or a connecting group; C represents an alkyl group or a group containing an ethylene oxide group; and D represents a group containing a carboxylic acid anion or a group containing an oxide anion ($O^-$). In formula <3>, R4, R5, R6 and R7 each represents a hydrogen atom or an alkyl group; and $Z^-$ represents a counter anion.

(2) A method for preparation of a lithographic printing plate comprising exposing with a laser a lithographic printing plate precursor comprising a support and a photosensitive layer containing (A) a sensitizing dye, (B) a radical polymerization initiator, (C) a radical polymerizable compound and (D) a binder polymer and subjecting the exposed lithographic printing plate precursor to development processing with a developer having pH of 3 to 9 to remove an unexposed area of the photosensitive layer, wherein the binder polymer is a polymer having an aliphatic hydroxy group or an aromatic hydroxy group and the developer contains a compound represented by the following formula <1>, <2> or <3>:

<1>

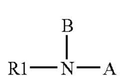

<2>

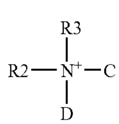

<3>

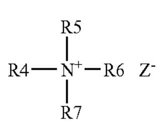

In formula <1>, R1 represents a hydrogen atom, an alkyl group or a substituent having a structure shown below:

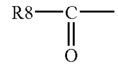

(wherein R8 represents a hydrogen atom or an alkyl group); A represents a hydrogen atom, an alkyl group, a group containing an ethylene oxide group, a group containing a carboxylic acid group or a group containing a carboxylate; and B represents a group containing an ethylene oxide group, a group containing a carboxylic acid group or a group containing a carboxylate. In formula <2>, R2 and R3 each represents a hydrogen atom or an alkyl group, provided that at least one of the alkyl groups may have a substituent or a connecting group; C represents an alkyl group or a group containing an ethylene oxide group; and D represents a group containing a carboxylic acid anion or a group containing an oxide anion ($O^-$). In formula <3>, R4, R5, R6 and R7 each represents a hydrogen atom or an alkyl group; and $Z^-$ represents a counter anion.

(3) The method for preparation of a lithographic printing plate as described in (2) above, wherein the polymer having an aliphatic hydroxy group or an aromatic hydroxy group is a polymer containing at least one monomer unit selected from a group consisting of a hydroxyalkyl(meth)acrylate, allyl alcohol, hydroxystyrene and vinyl alcohol.

(4) A method for preparation of a lithographic printing plate comprising exposing with a laser a lithographic printing plate precursor comprising a support and a photosensitive layer containing (A) a sensitizing dye, (B) a radical polymerization initiator, (C) a radical polymerizable compound and (D) a binder polymer and subjecting the exposed lithographic printing plate precursor to development processing with a developer having pH of 3 to 9 to remove an unexposed area of the photosensitive layer, wherein the binder polymer is a polymer containing at least one monomer unit selected from a group consisting of vinyl caprolactam, vinyl pyrrolidone and an alkylated vinyl pyrrolidone and the developer contains a compound represented by the following formula <1>, <2> or <3>:

<1>

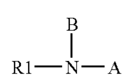

<2>

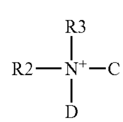

<3>

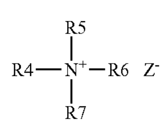

In formula <1>, R1 represents a hydrogen atom, an alkyl group or a substituent having a structure shown below:

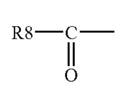

(wherein R8 represents a hydrogen atom or an alkyl group); A represents a hydrogen atom, an alkyl group, a group containing an ethylene oxide group, a group containing a carboxylic acid group or a group containing a carboxylate; and B represents a group containing an ethylene oxide group, a group containing a carboxylic acid group or a group containing a carboxylate. In formula <2>, R2 and R3 each represents a hydrogen atom or an alkyl group, provided that at least one of the alkyl groups may have a substituent or a connecting group; C represents an alkyl group or a group containing an ethylene oxide group; and D represents a group containing a carboxylic acid anion or a group containing an oxide anion ($O^-$). In formula <3>, R4, R5, R6 and R7 each represents a hydrogen atom or an alkyl group; and $Z^-$ represents a counter anion.

(5) The method for preparation of a lithographic printing plate as described in any one of (1) to (4) above, wherein a ratio of weight of (C) the radical polymerizable compound to weight of (D) the binder polymer contained in the photosensitive layer is from 2 to 4.

(6) The method for preparation of a lithographic printing plate as described in any one of (1) to (5) above, wherein (B) the radical polymerization initiator is a hexaarylbiimidazole compound.

(7) The method for preparation of a lithographic printing plate as described in any one of (1) to (6) above, wherein (A) the sensitizing dye has an absorption maximum in a wavelength range of 350 to 450 nm.

(8) The method for preparation of a lithographic printing plate as described in any one of (1) to (7) above, wherein (A) the sensitizing dye is a compound represented by the following formula (I) or (II):

(I)

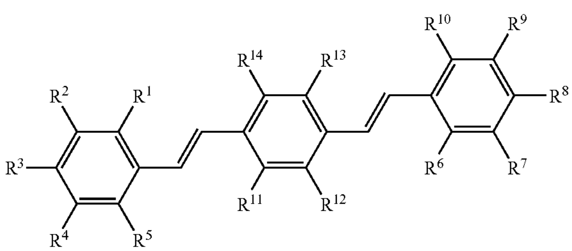

(II)

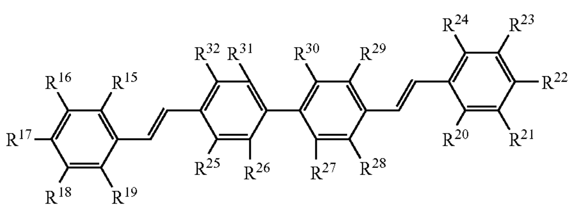

In formula (I), $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms. In formula (II), $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

(9) The method for preparation of a lithographic printing plate as described in any one of (1) to (8) above, wherein the pH of the developer is from 4 to 8.

(10) The method for preparation of a lithographic printing plate as described in any one of (1) to (9) above, wherein the lithographic printing plate precursor has a protective layer containing one or more kinds of polyvinyl alcohol on the photosensitive layer and an average saponification degree of the whole polyvinyl alcohol contained in the protective layer is in a range of 70 to 93% by mole.

(11) The method for preparation of a lithographic printing plate as described in any one of (1) to (9) above, wherein the lithographic printing plate precursor has a protective layer containing at least one kind of acid-modified polyvinyl alcohol on the photosensitive layer.

(12) The method for preparation of a lithographic printing plate as described in (11) above, wherein a content of the acid-modified polyvinyl alcohol is 50% by weight or more of a total solid content of the protective layer.

(13) The method for preparation of a lithographic printing plate as described in (11) or (12) above, wherein the acid-modified polyvinyl alcohol is a carboxy-modified polyvinyl alcohol or a sulfonic acid-modified polyvinyl alcohol.

(14) The method for preparation of a lithographic printing plate as described in any one of (1) to (13) above, wherein the lithographic printing plate precursor is a lithographic printing plate precursor having a protective layer containing one or more kinds of polyvinyl alcohol on the photosensitive layer and the lithographic printing plate precursor is exposed with a laser and without undergoing a water washing step, subjected to development processing with a developer having pH of 3 to 9 to remove the protective layer and an unexposed area of the photosensitive layer.

(15) The method for preparation of a lithographic printing plate as described in any one of (1) to (14) above, wherein the lithographic printing plate precursor is a lithographic printing plate precursor having an undercoat layer and the photosensitive layer in this order on the support and the undercoat layer contains a polymer compound including an ethylenically unsaturated bond group, a functional group capable of interacting with a surface of the support and a hydrophilic group.

According to the present invention, a method for preparation of a lithographic printing plate which provides a good printed material having no satin in the non-image area and no unevenness in the image area in spite of performing development with an aqueous near-neutral solution.

DESCRIPTION OF REFERENCE NUMERALS AND SIGNS

Figure 1:
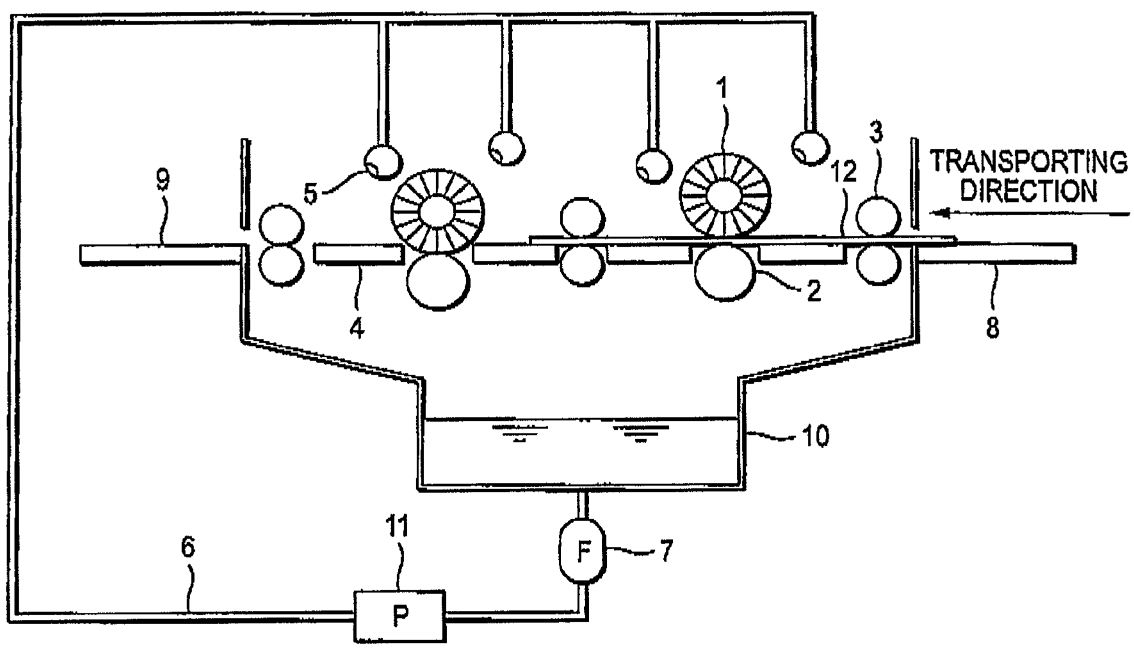
FIG. 1 shows a structure of an automatic development processor.

1: Rotating brush roller
2: Backing roller
3: Transport roller
4: Transport guide plate
5: Spray pipe
6: Pipe line
7: Filter
8: Plate supply table
9: Plate discharge table
10: Developer tank
11: Circulating pump
12: Plate

DETAILED DESCRIPTION OF THE INVENTION

[Lithographic Printing Plate Precursor]

First, the lithographic printing plate precursor comprising a support and a photosensitive layer for use in the invention is described in detail below.

<Photosensitive Layer>

The photosensitive layer of the lithographic printing plate precursor according to the invention contains (A) a sensitizing dye, (B) a radical polymerization initiator, (C) a radical polymerizable compound and (D) a binder polymer.

The photosensitive layer may further contain other components, if desired. The constituting components of the photosensitive layer are described in more detail below.

(A) Sensitizing Dye

As the sensitizing dye according to the invention, any compound capable of absorbing light of a laser used for the exposure and causing energy transfer or electron transfer to the radical polymerization initiator (B) to generate a radical from the radical polymerization initiator (B) may be employed. When a wavelength of the laser used for the exposure is from 350 to 450 nm, the sensitizing dye having an absorption maximum in a wavelength range of 350 to 450 nm is preferably used.

As the sensitizing dye having an absorption maximum in a wavelength range of 350 to 450 nm incorporated into the photosensitive layer according to the invention, for example, merocyanine dyes represented by formula (V) shown below, benzopyranes or coumarins represented by formula (VI) shown below, aromatic ketones represented by formula (VII) shown below and anthracenes represented by formula (VIII) shown below are exemplified.

(V)

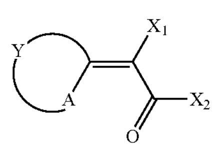

In formula (V), A represents a sulfur atom or $NR_6$, $R_6$ represents a monovalent non-metallic atomic group, Y represents a non-metallic atomic group necessary for forming a basic nucleus of the dye together with adjacent A and the adjacent carbon atom, and $X_1$ and $X_2$ each independently represents a monovalent non-metallic atomic group or $X_1$ and $X_2$ may be combined with each other to form an acidic nucleus of the dye.

(VI)

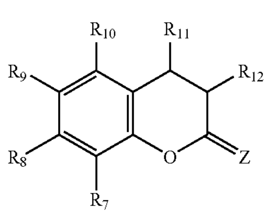

-continued (1')

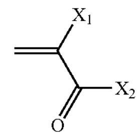

In formula (VI), =Z represents an oxo group, a thioxo group, an imino group or an alkylydene group represented by the partial structural formula (1') described above, $X_1$ and $X_2$ have the same meanings as those defined in formula (V) respectively, and $R_7$ to $R_{12}$ each independently represents a monovalent non-metallic atomic group.

(VII)

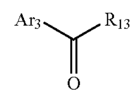

In formula (VII), $Ar_3$ represents an aromatic group which may have a substituent or a heteroaromatic group which may have a substituent, and $R_{13}$ represents a monovalent non-metallic atomic group. $R_{13}$ preferably represents an aromatic group or a heteroaromatic group. $Ar_3$ and $R_{13}$ may be combined with each other to form a ring.

(VIII)

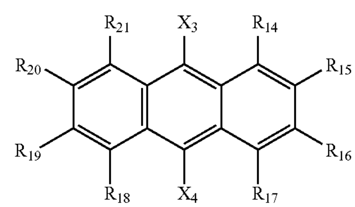

In formula (VIII), $X_3$, $X_4$ and $R_{14}$ to $R_{21}$, each independently represents a monovalent non-metallic atomic group. Preferably, $X_3$ and $X_4$ each independently represents an electron-donating group having a negative Hammett substituent constant.

In formulae (V) to (VIII), preferable examples of the monovalent non-metallic atomic group represented by any one of $X_1$ to $X_4$ and $R_6$ to $R_{21}$, include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrine, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and its conjugated base group (hereinafter referred to as a "phosphonato group"), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and its conjugated base group (hereinafter referred to as an "alkylphosphonato group"), a monoarylphosphono group (—$PO_3H$(aryl)) and its conjugated base group (hereinafter referred to as an "arylphosphonato group"), a phosphonooxy group (—$OPO_3H_2$) and its conjugated base group (hereinafter referred to as a "phosphonatooxy group"), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and its conjugated base group (hereinafter referred to as an "alkylphosphonatooxy group"), a monoarylphosphonooxy group (—$OPO_3H$(aryl)) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (V) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G. Brooker et al., *J. Am. Chem. Soc.*, Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); isoquinolines (for example, isoquinoline or 3,4-dihydroisoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and pyridines (for example, pyridine or 5-methylpyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2]dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolilydene group.

Of the sensitizing dyes having an absorption maximum in a wavelength range of 350 to 450 nm, dyes represented by formula (IX) shown below are more preferable in view of high sensitivity.

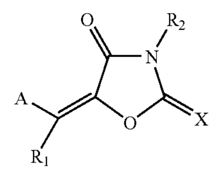

(IX)

In formula (IX), A represents an aromatic cyclic group which may have a substituent or a heterocyclic group which may have a substituent, X represents an oxygen atom, a sulfur atom or =N($R_3$), and $R_1$, $R_2$ and $R_3$ each independently represents a monovalent non-metallic atomic group, or A and $R_1$ or $R_2$ and $R_3$ may be combined with each other to form an aliphatic or aromatic ring.

The formula (IX) will be described in more detail below. $R_1$, $R_2$ and $R_3$ each independently represents a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Preferable examples of $R_1$, $R_2$ and $R_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl- N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and its conjugated base group (hereinafter referred to as a "phosphonato group"), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and its conjugated base group (hereinafter referred to as an "alkylphosphonato group"), a monoarylphosphono group (—$PO_3H$(aryl)) and its conjugated base group (hereinafter referred to as an "arylphosphonato group"), a phosphonooxy group (—$OPO_3H_2$) and its conjugated base group (hereinafter referred to as a "phosphonatooxy group"), a dialkylphosphonooxy group (—$OPO_3$(alkyl)$_2$), a diarylphosphonooxy group (—$OPO_3$(aryl)$_2$), an alkylarylphosphonooxy group (—$OPO_3$(alkyl)(aryl)), a monoalkylphosphonooxy group (—$OPO_3H$(alkyl)) and its conjugated base group (hereinafter referred to as an "alkylphosphonatooxy group"), a monoarylphosphonooxy group (—$OPO_3H$(aryl)) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group include a monocyclic or polycyclic aromatic cyclic group containing at least one of a nitrogen atom, an oxygen atom and a sulfur atom. Examples of especially preferable heteroaryl group include a group derived from a heteroaryl ring, for example, thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine. These groups may be benzo-fused or may have a substituent.

Also, examples of the alkenyl group include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of $G_1$ in the acyl group ($G_1$CO—) include the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of $R_1$, $R_2$ and $R_3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamo-yloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Examples of the preferable substituted or unsubstituted alkenyl group and the preferable substituted or unsubstituted aromatic heterocyclic residue represented by any one of $R_1$, $R_2$ and $R_3$ include those described with respect to the alkenyl group and heteroaryl group described above as the substituent for the substituted alkyl group, respectively.

Next, A in formula (IX) will be described below. A represents an aromatic cyclic group which may have a substituent or heterocyclic group which may have a substituent. Specific examples of the aromatic cyclic group which may have a substituent and heterocyclic group which may have a substituent include those of the aryl group and heteroaryl group described for any one of $R_1$, $R_2$ and $R_3$ in formula (IX), respectively.

The sensitizing dye represented by formula (IX) is obtained by a condensation reaction of an acidic nucleus as described above or an active methyl group-containing acidic nucleus with a substituted or unsubstituted, aromatic ring or hetero ring. Specifically, it can be synthesized with reference to the description of JP-B-59-28329 (the term "JP-B" as used herein means an "examined Japanese patent publication").

Preferable specific examples (D1) to (D75) of the compound represented by formula (IX) are set forth below. Further, when isomers with respect to a double bond connecting an acidic nucleus and a basic nucleus are present in each of the compounds, the invention should not be construed as being limited to any one of the isomers.

(D1)

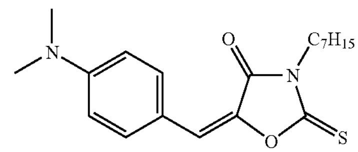

(D2)

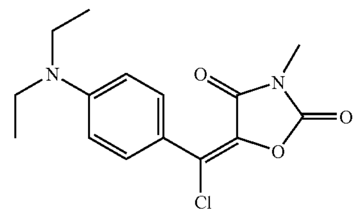

(D3)

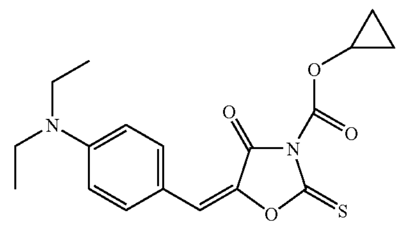

(D4)

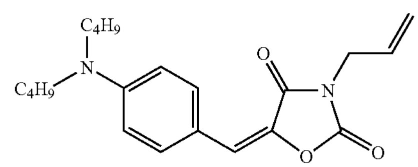

(D5)

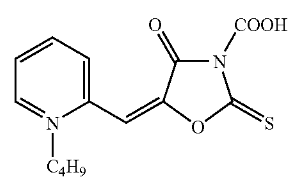

(D6)

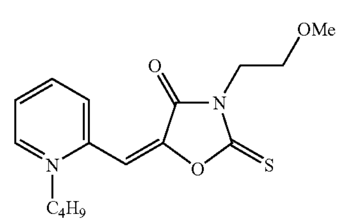

-continued
(D7)
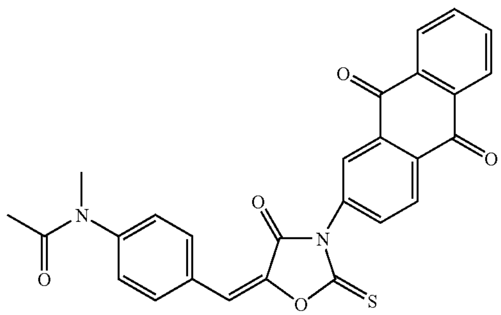
(D8)
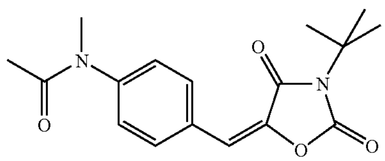
(D9)
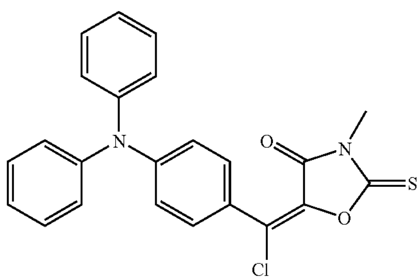
(D10)
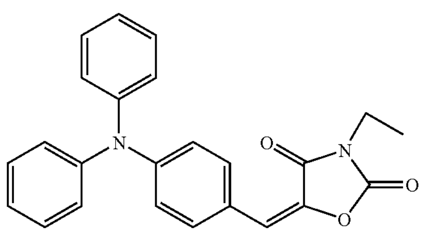
(D11)
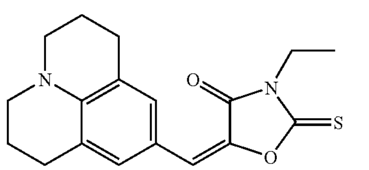
(D12)
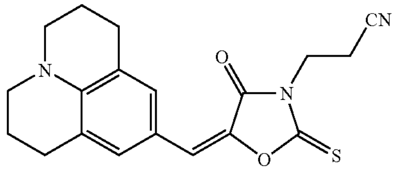
(D13)
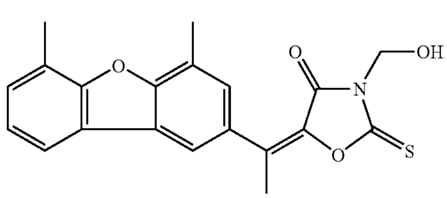
-continued
(D14)
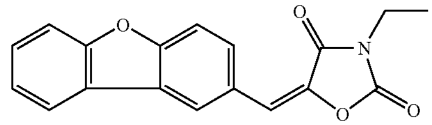
(D15)
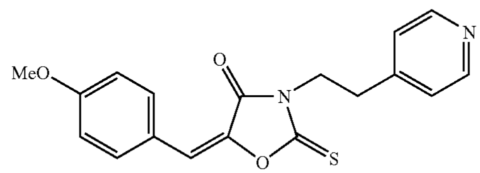
(D16)
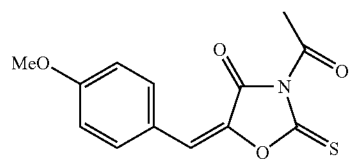
(D17)
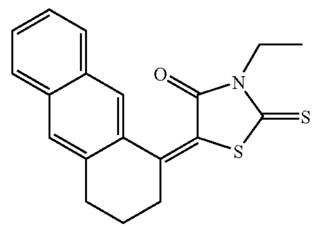
(D18)
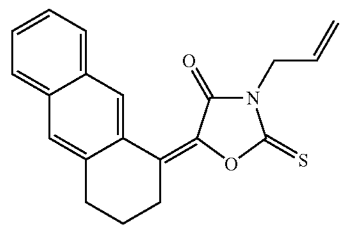
(D19)
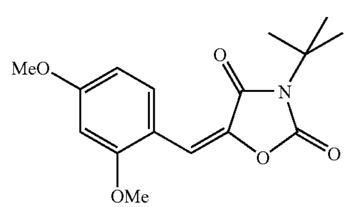
(D20)
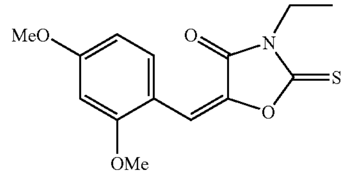
(D21)
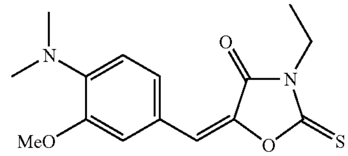

-continued
(D22)
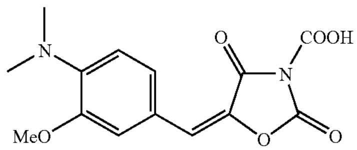
(D23)
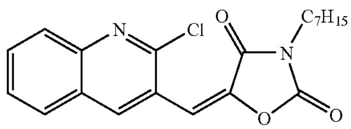
(D24)
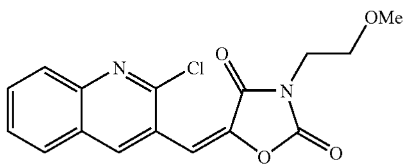
(D25)
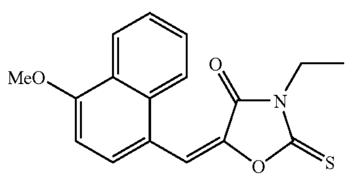
(D26)
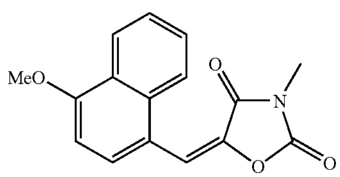
(D27)
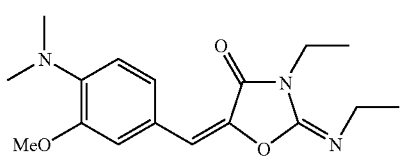
(D28)
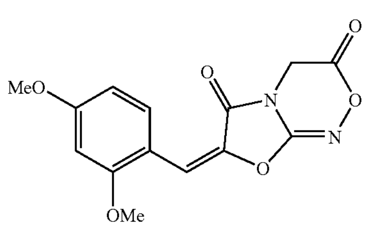
(D29)
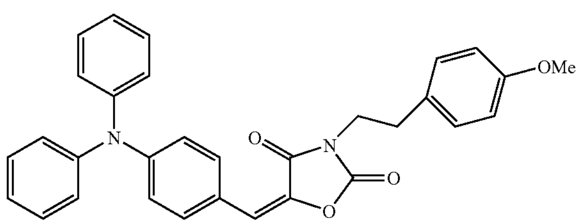
-continued
(D30)
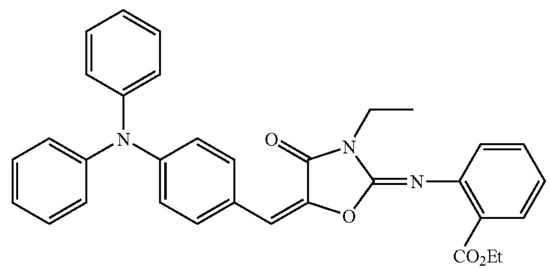
(D31)
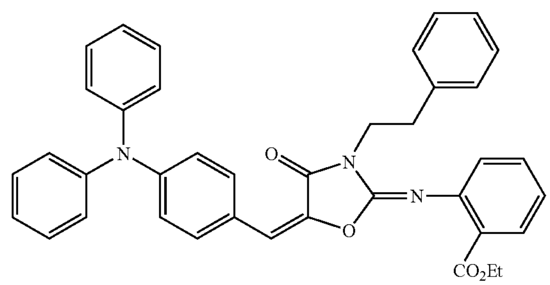
(D32)
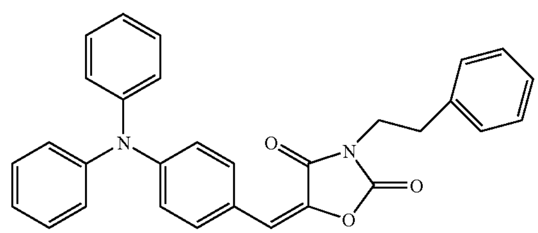
(D33)
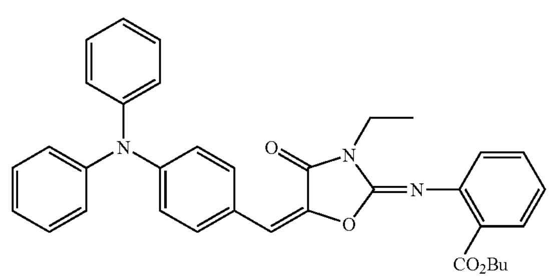
(D34)
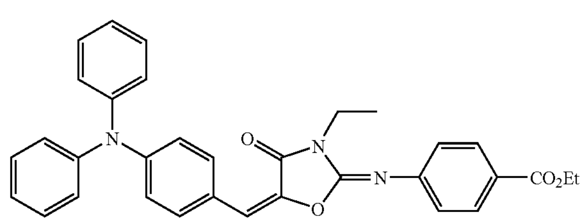

-continued
(D35)
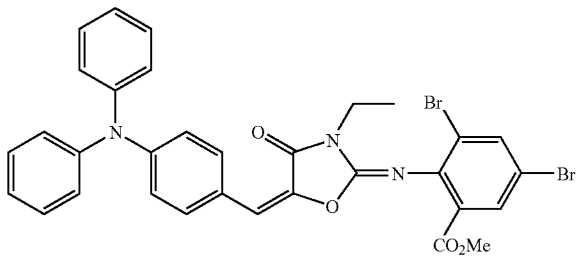
(D36)
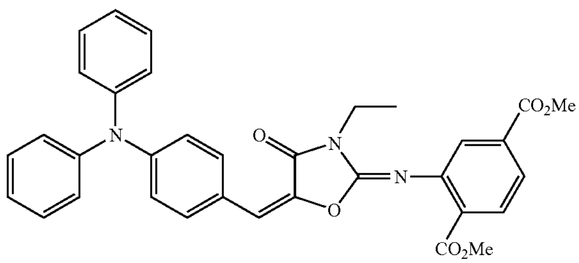
(D37)
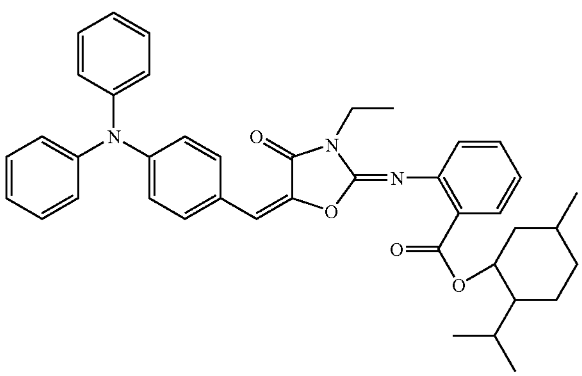
(D38)
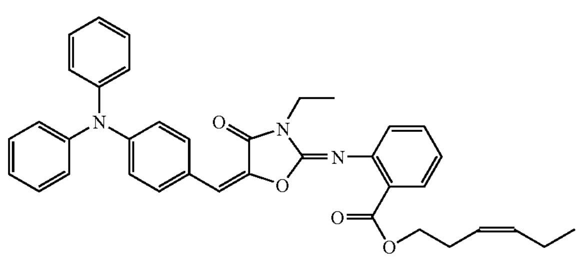
(D39)
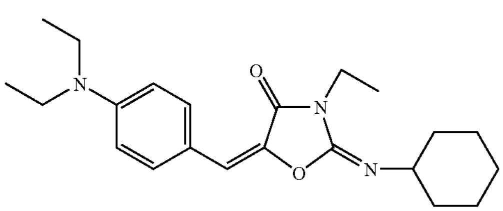
-continued
(D40)
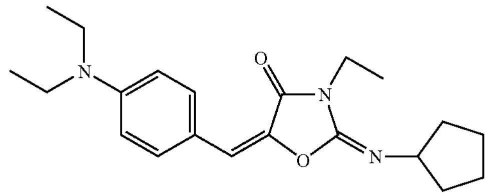
(D41)
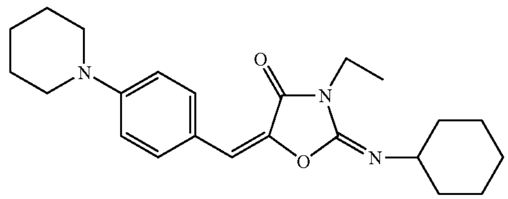
(D42)
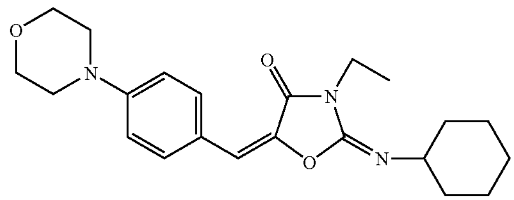
(D43)
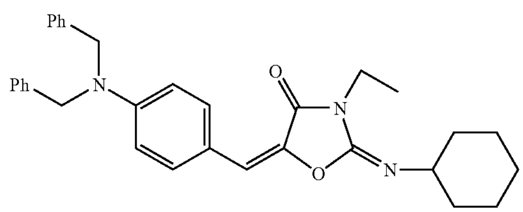
(D44)
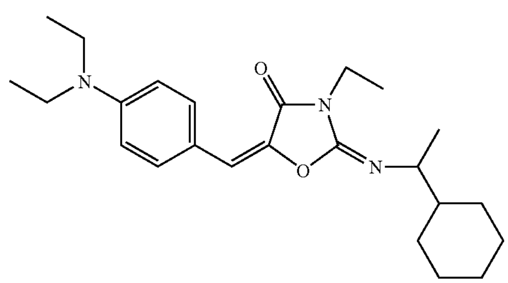
(D45)
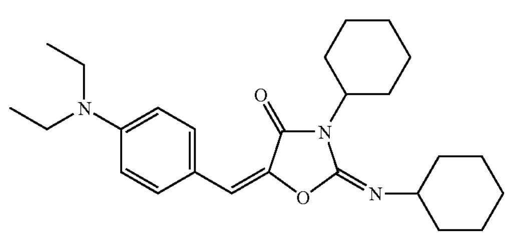

-continued
(D46)
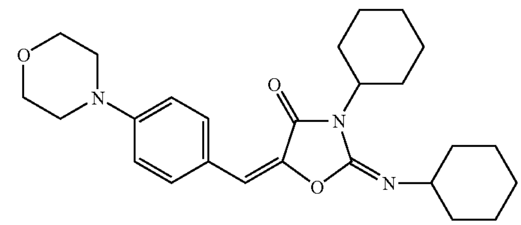
(D47)
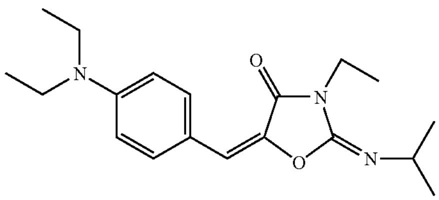
(D48)
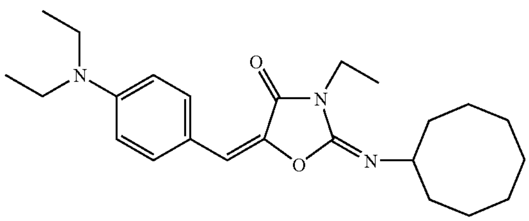
(D49)
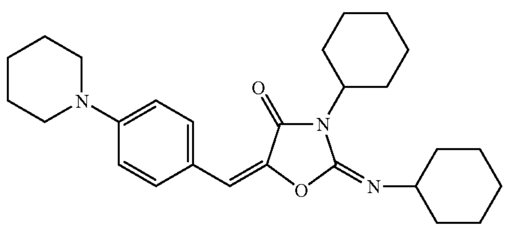
(D50)
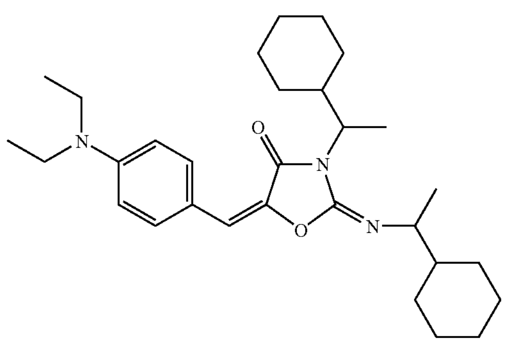
(D51)
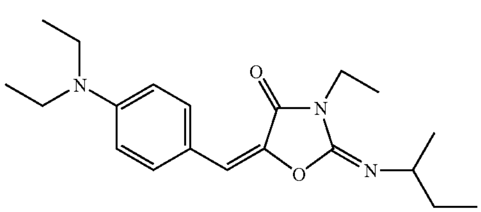
-continued
(D52)
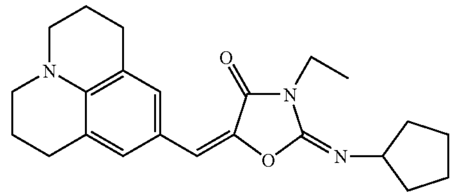
(D53)
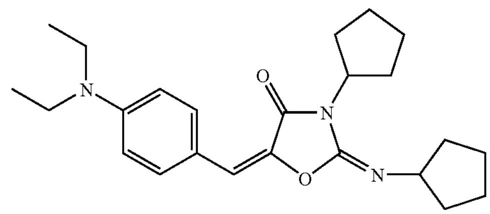
(D54)
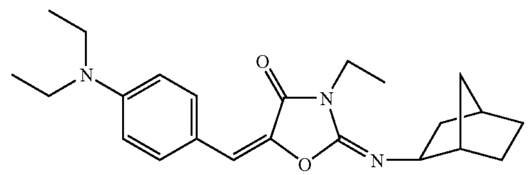
(D55)
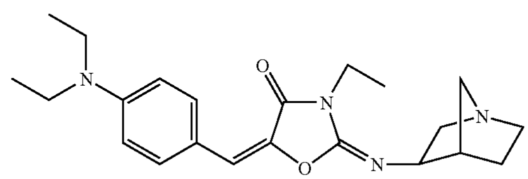
(D56)
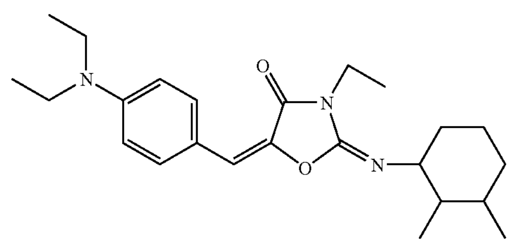
(D57)
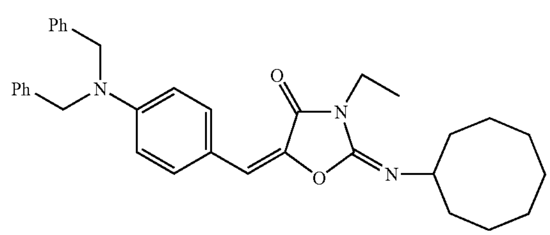
(D58)
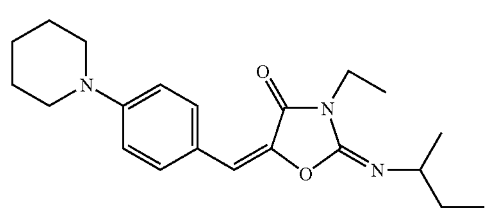

-continued
(D59)
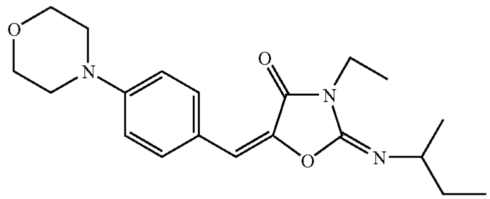
(D60)
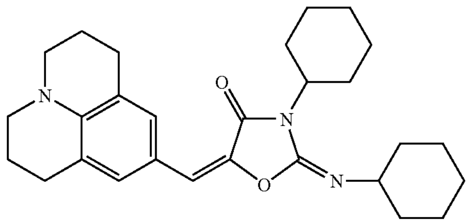
(D61)
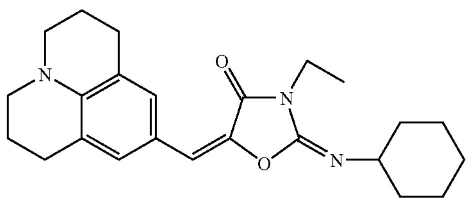
(D62)
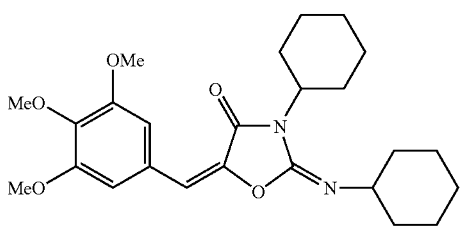
(D63)
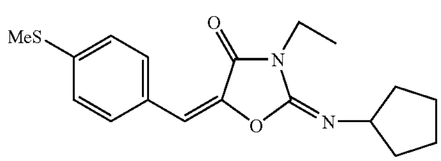
(D64)
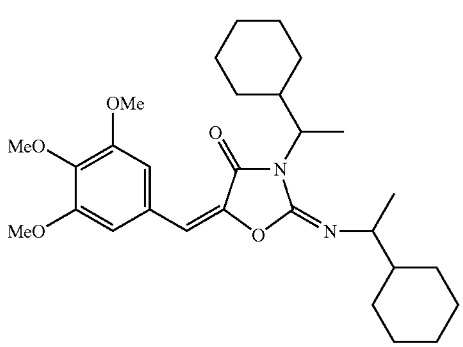
-continued
(D65)
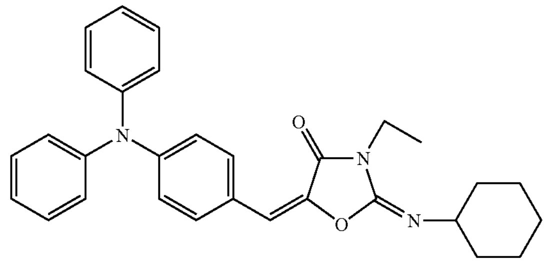
(D66)
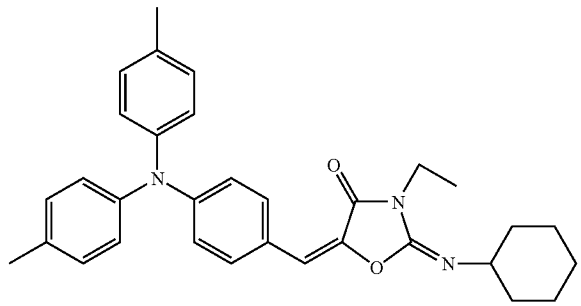
(D67)
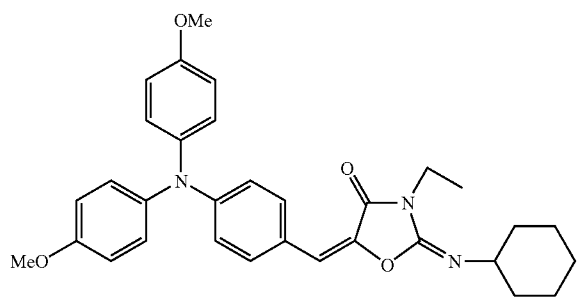
(D68)
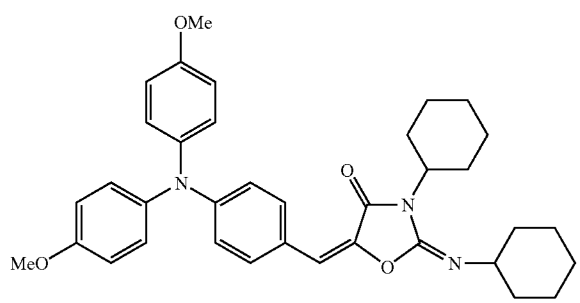
(D69)
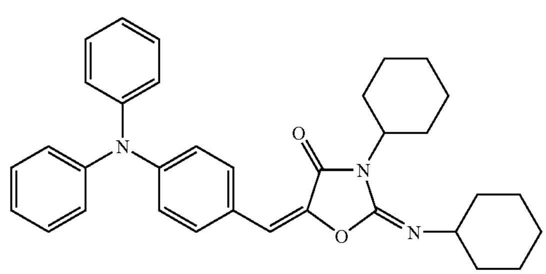

-continued (D70)

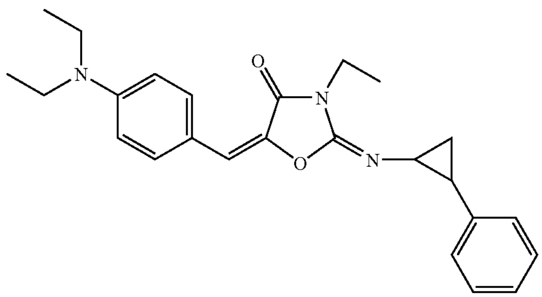

(D71)

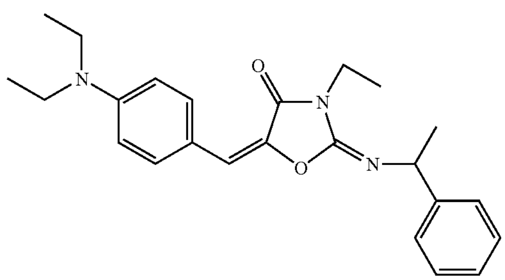

(D72)

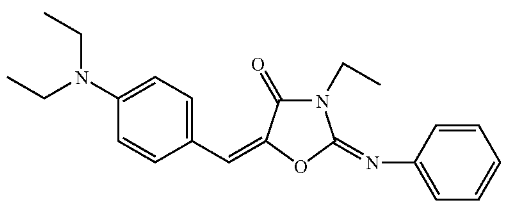

(D73)

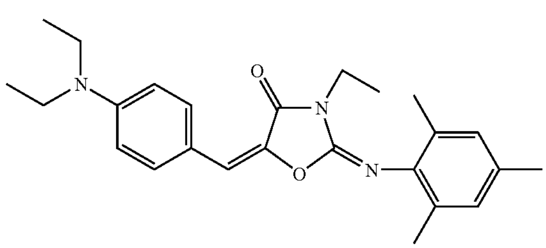

(D74)

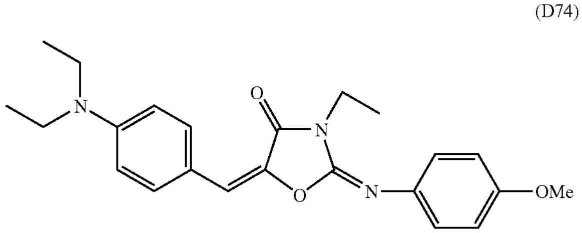

(D75)

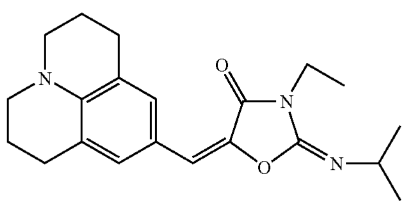

Of the sensitizing dyes for use in the invention, as particularly preferable sensitizing dyes, those specifically described in European Patent 1,349,006 and EP-A-3,103,499 (the term "EP-A" as used herein means an "unexamined published European patent application") and references cited therein are exemplified.

Other examples of particularly preferable sensitizing dyes of the sensitizing dyes for use in the invention include compounds represented by the following formula (I) or (II):

(I)

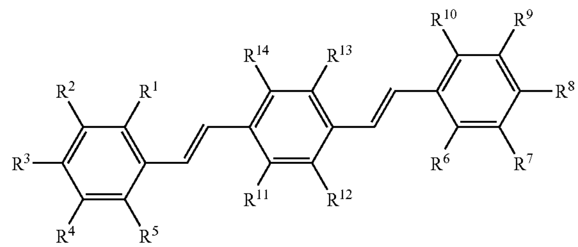

(II)

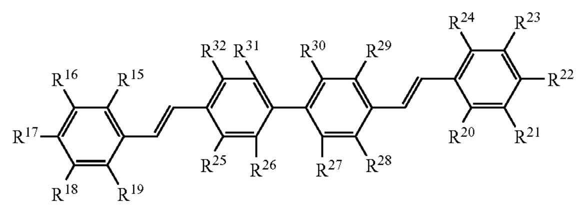

In formula (I), $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms.

In formula (II), $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

The alkyl group or alkoxy group may have a substituent and may be a straight chain or branched form, but the branched form is preferable. Examples of the substituent include a halogen atom and a hydroxy group.

Also, the alkylene chain of the alkyl group or alkoxy group may include an ester bond, an ether bond or a thioether bond.

$R^1$, $R^5$, $R^6$, $R^{10}$, $R^{11}$, $R^{12}$, $R^{13}$ and $R^{14}$ each independently preferably represents a hydrogen atom, a fluorine atom or a chlorine atom. In particular, it is preferable that $R^1$, $R^5$, $R_6$ and $R^{10}$ each represents a hydrogen atom, $R^2$ to $R^4$ and $R^7$ to $R^9$ each independently represents an alkoxy group, and at least two of $R^2$ to $R^4$ and $R^7$ to $R^9$ each represents a branched alkoxy group having from 3 to 15 carbon atoms.

Also, it is especially preferable that $R^2$, $R^4$, $R^7$ and $R^9$ each represents a methoxy group, and $R^3$ and $R^8$ each represents a branched alkoxy group having from 3 to 15 carbon atoms.

$R^{15}$, $R^{19}$, $R^{20}$, $R^{24}$ and $R^{25}$ to $R^{32}$ each independently preferably represents a hydrogen atom, a fluorine atom or a chlorine atom. In particular, it is preferable that $R^{15}$, $R^{19}$, $R^{20}$ and $R^{24}$ each represents a hydrogen atom, $R^{16}$ to $R^{18}$ and $R^{21}$to $R^{23}$ each independently represents an alkoxy group, and at least two of $R^{16}$ to $R^{18}$ and $R^{21}$ to $R^{13}$ each represents a branched alkoxy group having from 3 to 15 carbon atoms.

Also, it is especially preferable that $R^{16}$, $R^{18}$, $R^{21}$ and $R^{23}$ each represents a methoxy group, and $R^{17}$ and $R^{22}$ each represents a branched alkoxy group having from 3 to 15 carbon atoms.

Specific examples of the compound represented by formula (I) or (II) are set forth below, but the invention should not be construed as being limited thereto.
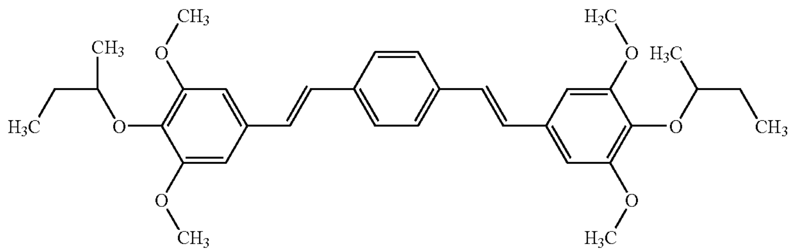
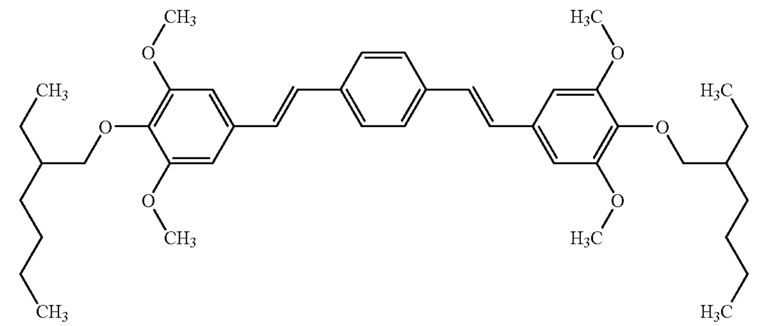
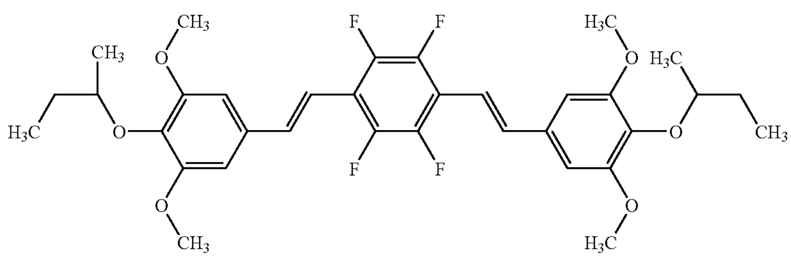
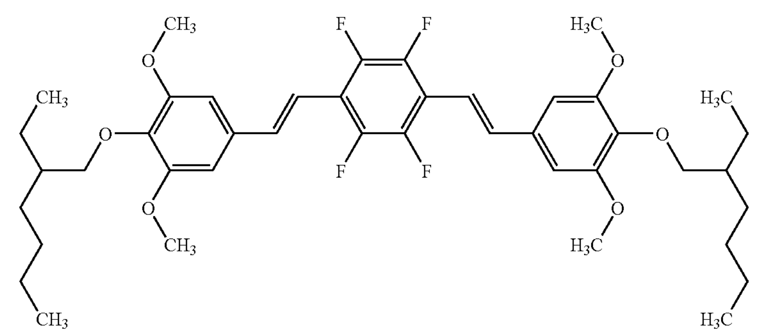
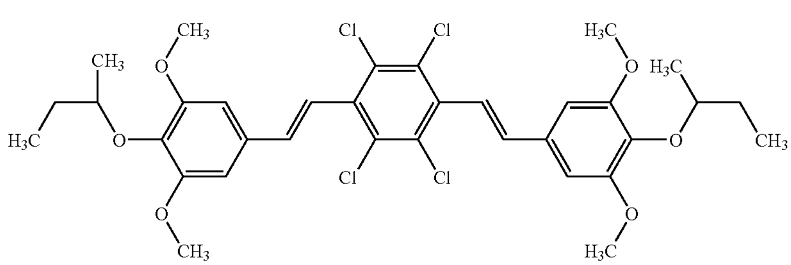

-continued
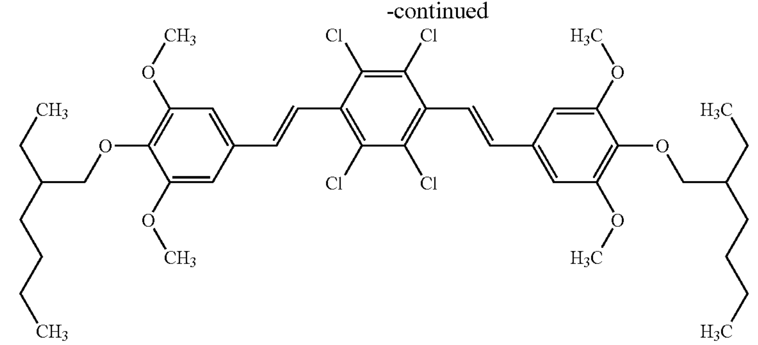
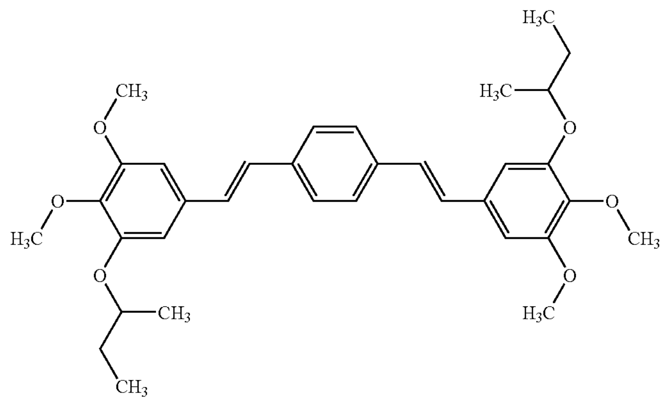
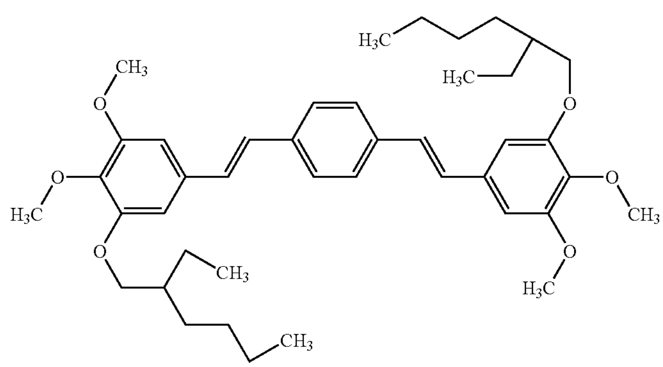
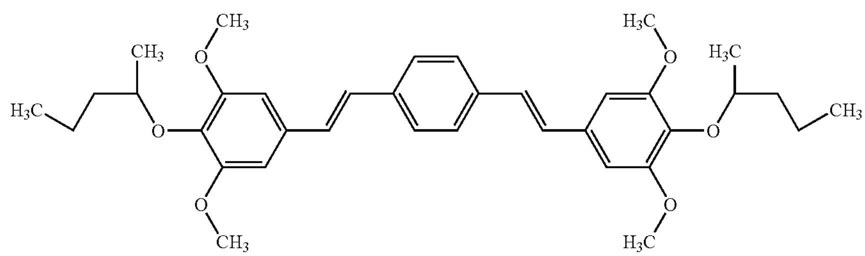
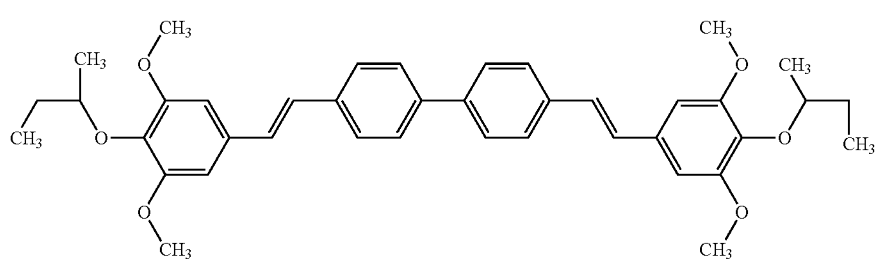

-continued

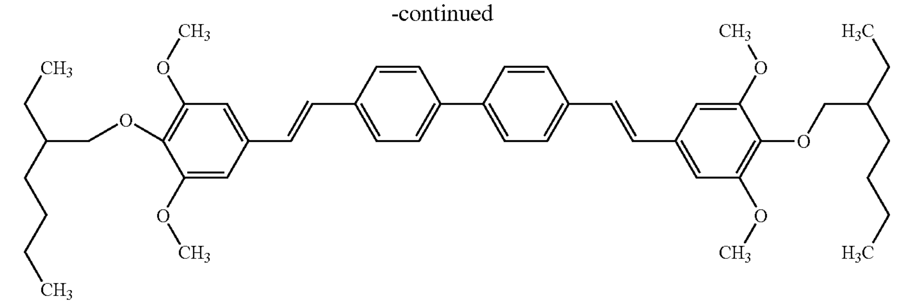

The sensitizing dye represented by formula (I) or (II) can be synthesized according to known methods, for example, methods described in WO2005/029187.

Details of the method of using the sensitizing dye, for example, selection of the structure, individual or combination use or an amount added, can be appropriately determined in accordance with the characteristic design of the final lithographic printing plate precursor.

For instance, when two or more sensitizing dyes are used in combination, the compatibility thereof in the photosensitive layer can be increased. For the selection of sensitizing dye, the molar absorption coefficient thereof at the emission wavelength of the light source used is an important factor in addition to the photosensitivity. Use of the dye having a large molar absorption coefficient is profitable, because the amount of dye added can be made relatively small. Also, in case of using in a lithographic printing plate precursor, the use of such a dye is advantageous in view of physical properties of the photosensitive layer. Since the photosensitivity and resolution of the photosensitive layer and the physical properties of the exposed area of the photosensitive layer are greatly influenced by the absorbance of sensitizing dye at the wavelength of light source, the amount of the sensitizing dye added is appropriately determined by taking account of these factors.

However, for the purpose of hardening a layer having a large thickness, for example, of 5 μm or more, low absorbance is sometimes rather effective for increasing the curing degree. In the case of using in a lithographic printing plate precursor where the photosensitive layer has a relatively small thickness, the amount of the sensitizing dye added is preferably selected such that the photosensitive layer has an absorbance from 0.1 to 1.5, preferably from 0.25 to 1. Ordinarily, the amount of the sensitizing dye added is preferably from 0.05 to 30 parts by weight, more preferably from 0.1 to 20 parts by weight, and most preferably from 0.2 to 10 parts by weight, per 100 parts by weight of the total solid content of the photosensitive layer.

(B) Radical Polymerization Initiator

The radical polymerization initiator (hereinafter also simply referred to as a polymerization initiator) for use in the invention includes, for example, a trihalomethyl compound, a carbonyl compound, an organic peroxide, an azo compound, an azide compound, a metallocene compound, a hexaarylbiimidazole compound, an organic boron compound, a disulfone compound, an oxime ester compound and an onium salt compound. Among them, at least one compound selected from the group consisting of the hexaarylbiimidazole compound, onium salt compound, trihalomethyl compound and metallocene compound is preferable, and the hexaarylbiimidazole compound is particularly preferable.

The hexaarylbiimidazole compound includes, for example, lophine dimers described in JP-B-45-37377 and JP-B-44-86516, specifically, 2,2'-bis(o-chlorophenyl)-4,4',5,5'-tetraphenylbiimidazole,
2,2'-bis(o-bromophenyl)-4,4',5,5'-tetraphenylbiimidazole,
2,2'-bis(o,p-dichlorophenyl)-4,4',5,5'-tetraphenylbiimidazole,
2,2'-bis(o-chlorophenyl)-4,4',5,5'-tetra(m-methoxyphenyl) biimidazole,
2,2'-bis(o,o'-dichlorophenyl)-4,4',5,5'-tetraphenylbiimidazole,
2,2'-bis(o-nitrophenyl)-4,4',5,5'-tetraphenylbiimidazole,
2,2'-bis(o-methylphenyl)-4,4',5,5'-tetraphenylbiimidazole and 2,2'-bis(o-trifluoromethylphenyl)-4,4',5,5'-tetraphenylbiimidazole.

The trihalomethyl compound preferably includes trihalomethyl-s-triazines, and specifically s-triazine derivatives having a tri-halogen-substituted methyl group described in JP-A-58-29803, for example, 2,4,6-tris(trichloromethyl)-s-triazine, 2-methoxy-4,6-bis(trichloromethyl)-s-triazine, 2-amino-4,6-bis(trichloromethyl)-s-triazine and 2-(p-methoxystyryl)-4,6-bis(trichloromethyl)-s-triazine.

The onium salt includes, for example, onium salts represented by the following formula (III):

Formula (III):

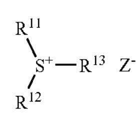

In formula (III), $R^{11}$, $R^{12}$ and $R^{13}$, which may be the same or different,each represents a hydrocarbon group having 20 or less carbon atoms which may have a substituent. Preferable examples of the substituent include a halogen atom, a nitro group, an alkyl group having 12 or less carbon atoms, an alkoxy group having 12 or less carbon atoms and an aryloxy group having 12 or less carbon atoms.

$Z^-$ represents a counter ion selected from the group consisting of a halogen ion, a perchlorate ion, a tetrafluoroborate ion, a hexafluorophosphate ion, a carboxylate ion and a sulfonate ion, and is preferably a perchlorate ion, a hexafluorophosphate ion, a carboxylate ion or an arylsulfonate ion.

The metallocene compound can be used by appropriately selecting, for example, from known compounds described in JP-A-59-152396 and JP-A-61-151197.Specific examples thereof include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6- trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl and bis(cyclopentadienyl)-bis-(2,6-difluoro-3-(pyr-1-yl)phenyl)titanium.

Examples of the carbonyl compound include, benzophenone derivatives, for example, benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, for example, 2,2-dimethoxy-2-phenylacetophenone, 2,2-diethoxyacetophenone, 1-hydroxycyclohexylphenylketone, α-hydroxy-2-methylphenylpropane, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propane or 1,1,1,-trichloromethyl-(p-butylphenyl)ketone, thioxantone derivatives, for example, thioxantone, 2-ethylthioxantone, 2-isopropylthioxantone, 2-chlorothioxantone, 2,4-dimethylthioxantone, 2,4-dietylthioxantone or 2,4-diisopropylthioxantone,and benzoic acid ester derivatives, for example, ethyl p-dimethylaminobenzoate or ethyl p-diethylaminobenzoate.

Examples of the oxime ester compound include compounds described in *J. C. S. Perkin II,* 1653-1660 (1979), *J. C. S. Perkin II,* 156-162 (1979), *Journal of Photopolymer Science and Technology,* 202-232 (1995) and JP-A-2000-66385, and compounds described in JP-A-2000-80068.

The polymerization initiators according to the invention can be preferably used individually or in combination of two or more thereof.

An amount of the polymerization initiator used in the photosensitive layer according to the invention is preferably from 0.01 to 20% by weight, more preferably from 0.1 to 15% by weight, still more preferably from 1.0 to 10% by weight, based on the total solid content of the photosensitive layer.

(C) Radical Polymerizable Compound

The radical polymerizable compound (hereinafter also simply referred to as a polymerizable compound) for use in the photosensitive layer according to the invention is an addition-polymerizable compound having at least one ethylenically unsaturated double bond, and it is selected from compounds having at least one, preferably two or more, terminal ethylenically unsaturated double bonds. Such compounds are widely known in the art and they can be used in the invention without any particular limitation. The compound has a chemical form, for example, a monomer, a prepolymer, specifically, a dimer, a trimer or an oligomer, or a copolymer thereof, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, isocyanuric acid ethylene oxide (EO) modified triacrylate or polyester acrylate oligomer;

methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane;

itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; crotonic acid esters, for example, ethylene glycol dicrotonate, tetramethylene glycol dicrotonate, pentaerythritol dicrotonate or sorbitol tetracrotonate; isocrotonic acid esters, for example, ethylene glycol diisocrotonate, pentaerythritol diisocrotonate or sorbitol tetraisocrotonate;

and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferred examples of the amide monomer include amides having a cyclohexylene structure described in JP-B-54-21726.

Urethane type addition-polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2{=}C(R_4)COOCH_2CH(R_5)OH \quad (A)$$

wherein $R_4$ and $R_5$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Further, a photosensitive composition having remarkably excellent photo-speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with (meth) acrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable compound, for example, selection of the structure, individual or combination use or an amount added, can be appropriately determined in accordance with the characteristic design of the final lithographic printing plate precursor. For instance, the compound is selected from the following standpoints.

In view of the sensitivity, a structure having a large content of unsaturated group per molecule is preferred and in many cases, a difunctional or more functional compound is preferred. Also, in order to increase the strength of the image area, that is, hardened layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the polymerizable compound are also important factors for the compatibility and dispersibility with other components (for example, a binder polymer, a polymerization initiator or a coloring agent) in the photosensitive layer. For instance, the compatibility may be improved in some cases by using the compound of low purity or using two or more kinds of the compounds in combination. A specific structure may be selected for the purpose of improving an adhesion property to a support, a protective layer or the like described hereinafter.

The polymerizable compound is used preferably in a range of 5 to 80% by weight, more preferably in a range of 25 to 75% by weight, based on the total solid content of the photosensitive layer. The polymerizable compounds may be used individually or in combination of two or more thereof. With respect to the method of using the polymerizable compound, the structure, blend and amount added can be appropriately selected by taking account of the degree of polymerization inhibition due to oxygen, resolution, fogging property, change in refractive index, surface tackiness and the like. Further, depending on the case, a layer construction, for example, an undercoat layer or an overcoat layer, and a coating method, may also be considered.

(D) Binder Polymer

The binder polymer used in the photosensitive layer according to the invention is a polymer which is removed in the non-image area with a developer having pH of 3 to 9 and containing a surfactant represented by formula <1>, <2> or (3) described in detail hereinafter. Specifically, a polymer having an acid value of 10 to 250 mg-KOH/g (Embodiment 1), a polymer having an aliphatic hydroxy group or an aromatic hydroxy group (Embodiment 2) or a polymer containing at least one monomer unit selected from a group consisting of vinyl caprolactam, vinyl pyrrolidone and an alkylated vinyl pyrrolidone (Embodiment 3) is used.

Useful examples of the binder polymer include the following: chlorinated polyalkylene (particularly, chlorinated polyethylene and chlorinated polypropylene), poly(alkyl(meth) acrylate) or poly(alkenyl(meth)acrylate) (particularly, poly (methyl (meth)acrylate), poly(ethyl(meth)acrylate), poly (butyl(meth)acrylate), poly(isobutyl (meth)acrylate), poly (hexyl(meth)acrylate), poly(2-ethylhexyl(meth)acrylate), and copolymer of alkyl(meth)acrylate or alkenyl(meth)acrylate with other copolymerizable monomer (particularly, (meth)acrylonitrile, vinyl chloride, vinylidene chloride, styrene and/or butadiene), polyvinyl chloride (PVC, vinyl chloride/(meth)acrylonitrile copolymer), poly vinylidene chloride (PVDC), vinylidene chloride/(meth)acrylonitrile copolymer, polyvinyl acetate, polyvinyl alcohol, polyvinyl pyrrolidone, copolymer of vinyl pyrrolidone or alkylated vinyl pyrrolidone, polyvinyl caprolactam, copolymer of vinyl caprolactam, poly(meth)acrylonitrile,(meth)acrylonitrile/styrene copolymer,(meth)acrylamide/alkyl (meth)acrylate copolymer,(meth)acrylonitrile/butadiene/styrene (ABS) terpolymer, polystyrene, poly(α-methylstyrene), polyamide, polyurethane, polyester, methyl cellulose, ethyl cellulose, hydroxy($C_1$ to $C_4$-alkyl)cellulose, carboxymethyl cellulose, polyvinyl formal and polyvinyl butyral.

Particularly preferable binders include polymers containing as a monomer unit, vinyl caprolactam, vinyl pyrrolidone or an alkylated vinyl pyrrolidone. The alkylated vinyl pyrrolidone polymer can be obtained by grafting an alpha olefin to vinyl pyrrolidone polymer skeleton. Typical examples of the reaction product include Agrimer AL Graft polymers commercially available from ISP. The length of alkylation group can be varied in a range of $C_4$ to $C_{30}$.

As other useful binders, binders containing carboxyl groups, particularly, copolymers containing α, β-unsaturated carboxylic acid monomer unit or α, β-unsaturated dicarboxylic acid monomer unit (preferably, acrylic acid, methacrylic acid, crotonic acid, vinyl acetic acid, maleic acid or itaconic acid) are exemplified.

The term "copolymer" as used herein means a polymer containing at least two different kind monomer units and includes a terpolymer and a polymer of higher order.

Specific examples of the useful copolymer include copolymers including (meth)acrylic acid unit and alkyl(meth)acrylate, allyl(meth)acrylate and/or (meth)acrylonitrile unit, copolymers including crotonic acid unit and alkyl(meth)acrylate and/or(meth)acrylonitrile unit and vinyl acetic acid/alkyl (meth)acrylate copolymers. Copolymers including maleic anhydride unit or monoalkyl maleate unit are also suitable. Such copolymers include, for example, copolymer including maleic anhydride unit and styrene, unsaturated ether or ester or unsaturated aliphatic hydrocarbon unit and esterated reaction products obtained from such copolymers.

Reaction products obtained by conversion of hydroxy-containing polymer using intramolecular dicarboxylic acid anhydride are also preferable binders. Further, polymers including groups having a hydrogen atom of acid wherein a part or all of the groups are converted with activated isocyanates are also useful as the binder. Such copolymers also include reaction products obtained by conversion of hydroxy-containing polymer using aliphatic or aromatic sulfonyl isocyanate or phosphonic acid isocyanate.

The polymer having an aliphatic hydroxy group or an aromatic hydroxy group, for example, copolymers including hydroxyalkyl(meth)acrylate, allyl alcohol, hydroxystyrene or vinyl alcohol unit, and epoxy resins (which must have sufficient numbers of free hydroxy groups) are also preferable. Particularly useful binders and particularly useful reactive binders are described in European Patents 1,369,232, 1,369,231 and 1,341,040, U.S. Patent Publication No. 2003/0124460, European Patents 1,241,002 and 1,288,720 and U.S. Pat. Nos. 6,027,857, 6,171,735 and 6,420,089.

More specifically, as preferable binders, copolymers of vinyl acetate and vinyl alcohol containing preferably in a range of 10 to 98% by mole, more preferably in a range of 35 to 95% by mole, most preferably in a range of 40 to 75% by mole, of vinyl alcohol are exemplified. When the copolymer containing from 50 to 65% by mole of vinyl alcohol is used, the optimum result is obtained. An ester value of the copolymer of vinyl acetate and vinyl alcohol measured according to the method defined in DIN 53 401 is preferably in a range of 25 to 700 mg KOH/g, more preferably in a range of 50 to 500 mg KOH/g, most preferably in a range of 100 to 300 mg KOH/g. A viscosity of the copolymer of vinyl acetate and vinyl alcohol measured according to the method defined in DIN 53 015 at 20° C. using a 4% by weight aqueous solution thereof is preferably in a range of 3 to 60 mPa·s, more preferably in a range of 4 to 30 mPa·s, most preferably in a range of 5 to 25 mPa·s. An average molecular weight (Mw) of the copolymer of vinyl acetate and vinyl alcohol is preferably in a range of 5,000 to 500,000 g/mol, more preferably in a range of 10,000 to 400,000 g/mol, most preferably in a range of 15,000 to 250,000 g/mol.

An organic polymer used as the binder polymer typically has an average molecular weight (Mw) in a range of 600 to 200,000, preferably in a range of 1,000 to 100,000. The polymer having an acid value in a range of 10 to 250, preferably in a range of 20 to 200 or a hydroxyl value in a range of 50 to 750, preferably in a range of 100 to 500 is more preferable. The amount of the single or plural binders is ordinarily in a range of 10 to 90% by weight, preferably in a range of 20 to 80% by weight, based on the total weight of the nonvolatile component of the photosensitive layer.

According to the invention, by adjusting a ratio of the radical polymerizable compound and the binder polymer in the photosensitive layer of the lithographic printing plate precursor, the effects of the invention are more achieved. Specifically, a weight ratio of radical polymerizable compound/binder polymer in the photosensitive layer is preferably 1.2 or more, more preferably from 1.25 to 4.5, most preferably from 2 to 4. Thus, permeability of the developer into the photosensitive layer further increases and the developing property is more improved.

(E) Chain Transfer Agent

It is preferred to incorporate a chain transfer agent into the photosensitive layer according to the invention. The chain transfer agent contributes to improvements in the sensitivity and preservation stability. Compounds which function as the chain transfer agents include, for example, compounds containing SH, PH, SiH or GeH in their molecules. Such a compound donates hydrogen to a radical species of low activity to generate a radical, or is oxidized and then deprotonated to generate a radical.

In the photosensitive layer according to the invention, a thiol compound (for example, a 2-mercaptobenzimidazole) is particularly preferably used as the chain transfer agent.

Among them, a thiol compound represented by formula (T) shown below is particularly preferably used. By using the thiol compound represented by formula (T) as the chain transfer agent, a problem of the odor and decrease in sensitivity due to evaporation of the compound from the photosensitive layer or diffusion thereof into other layers are avoided and a lithographic printing plate precursor which is excellent in preservation stability and exhibits high sensitivity and good printing durability is obtained.

Formula (T):

(T)

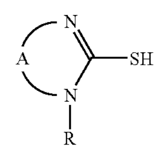

In formula (T), R represents an alkyl group which may have a substituent or an aryl group which may have a substituent; and A represents an atomic group necessary for forming a 5-membered or 6-membered hetero ring containing a carbon atom together with the N═C—N linkage, and A may have a substituent.

Compounds represented by formulae (T-1) and (T-2) shown below are more preferably used.

(T-1)

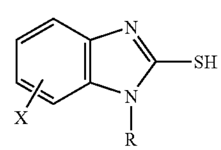

(T-2)

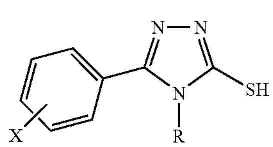

In formulae (T-1) and (T-2), R represents an alkyl group which may have a substituent or an aryl group which may have a substituent; and X represents a halogen atom, an alkoxy group which may have a substituent, an alkyl group which may have a substituent or an aryl group which may have a substituent.

Specific examples of the compound represented by formula (T) are set forth below, but the invention should not be construed as being limited thereto.

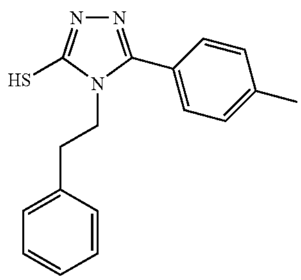
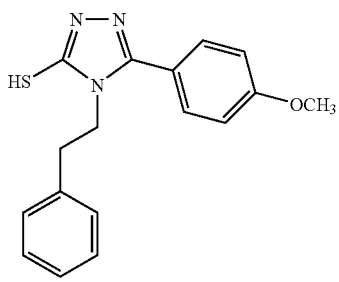
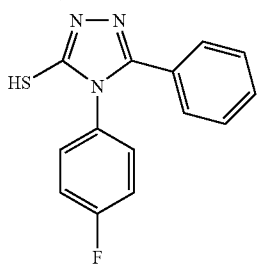
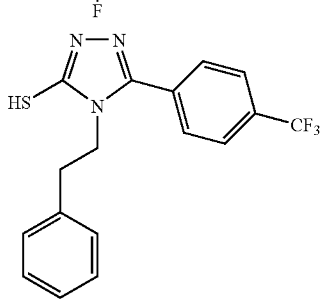
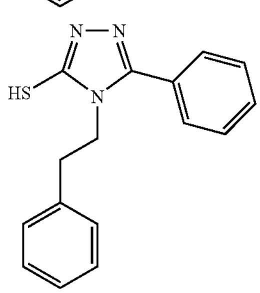
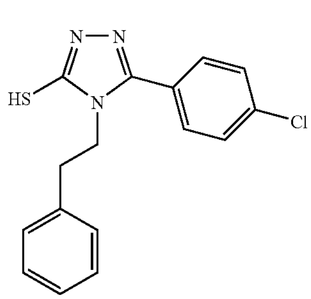
-continued
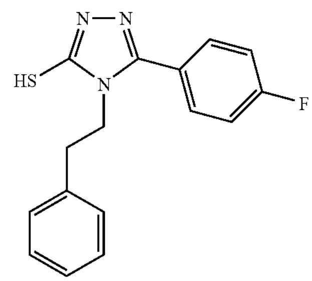
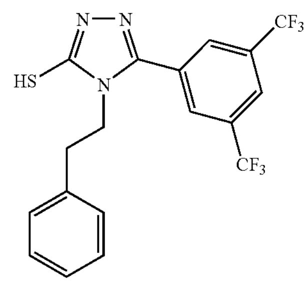
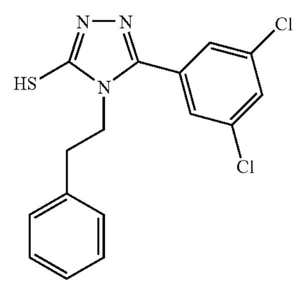
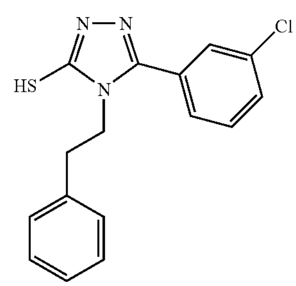
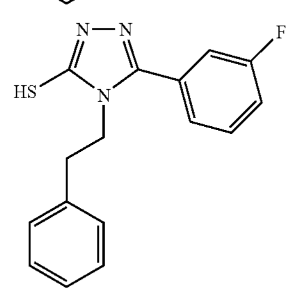
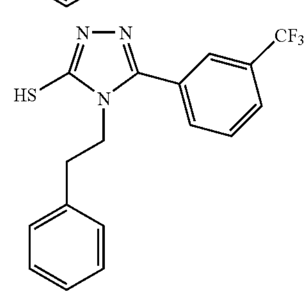

-continued
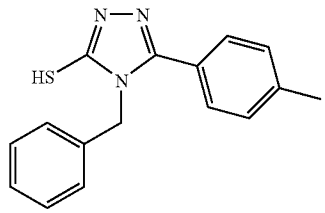
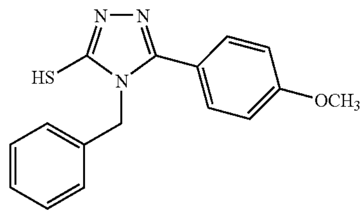
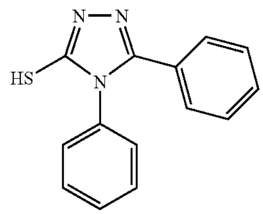
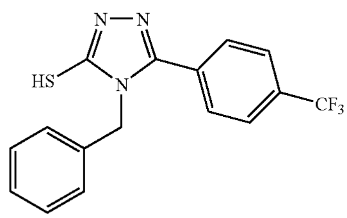
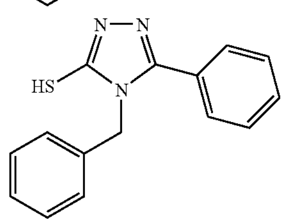
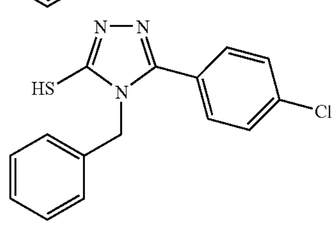
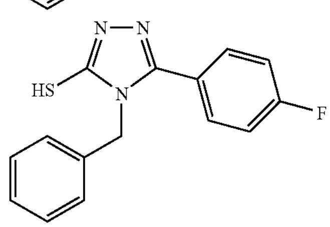
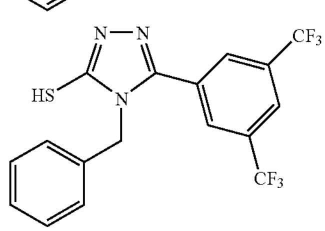
-continued
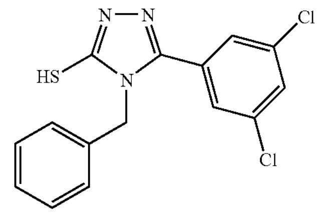
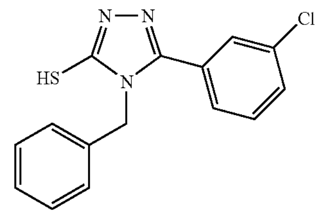
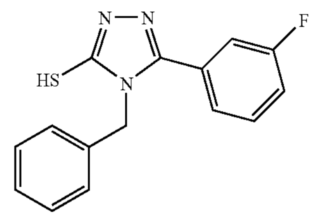
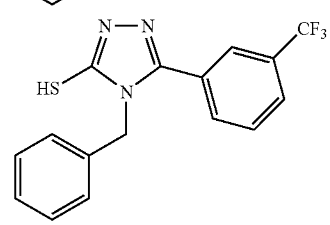
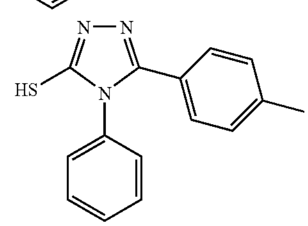
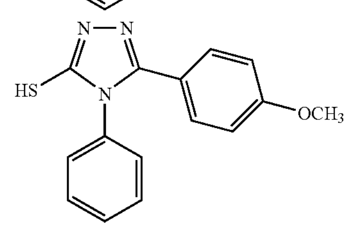
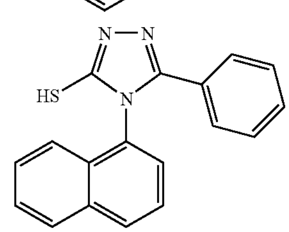
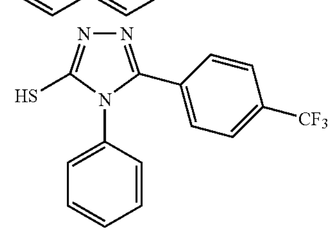

-continued
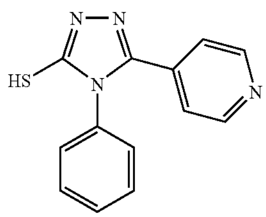
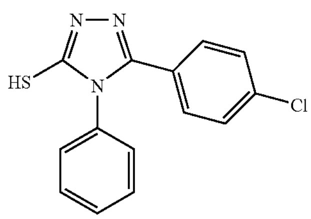
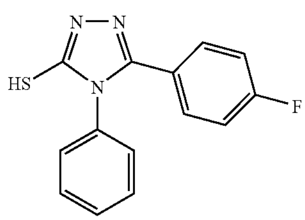
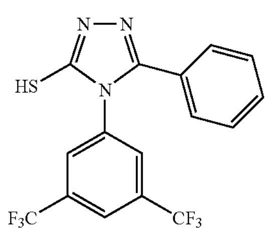
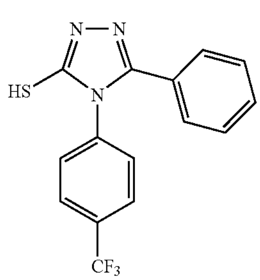
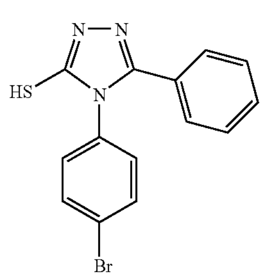
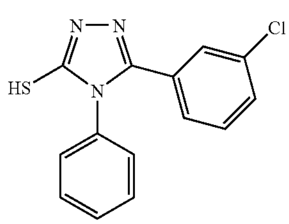
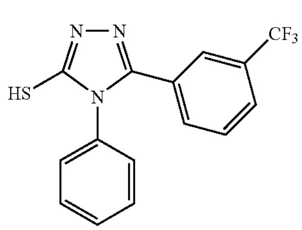
-continued
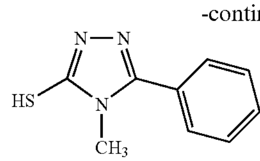
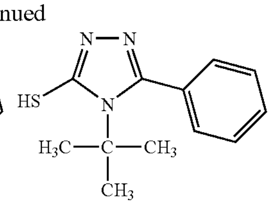
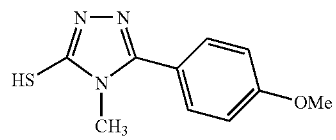
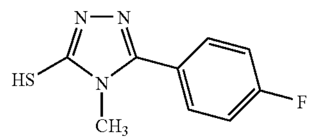
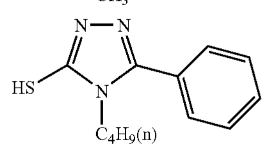
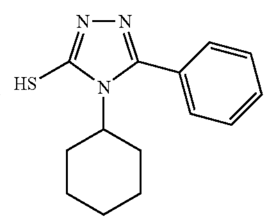
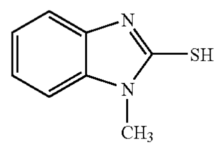
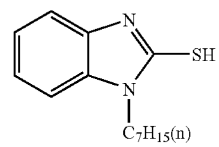
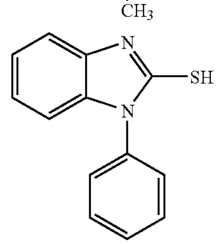
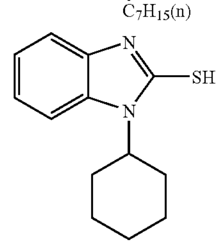
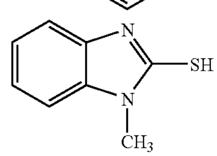
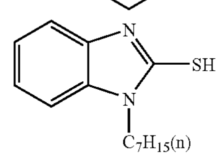
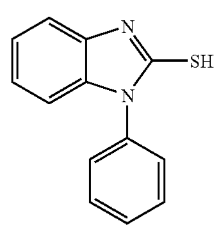
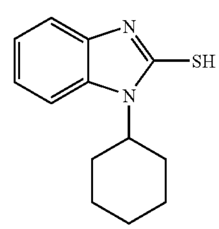
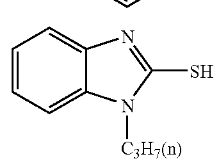
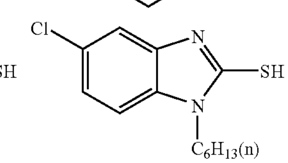
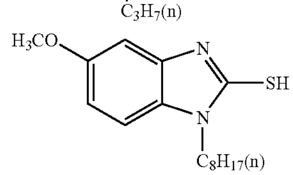

-continued

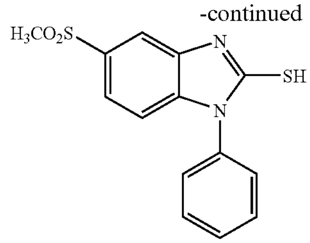

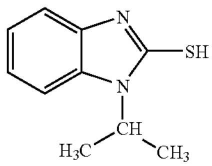

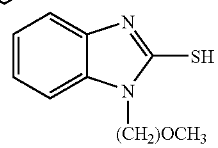

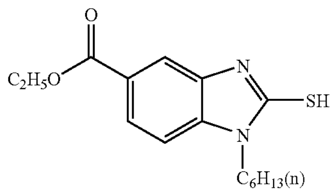

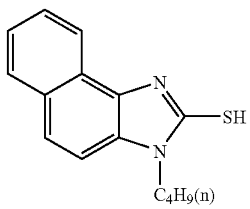

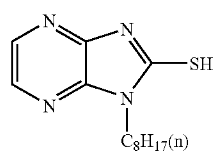

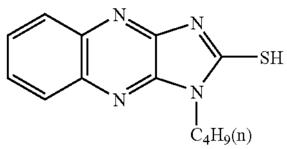

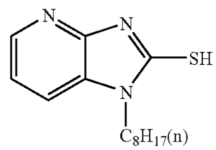

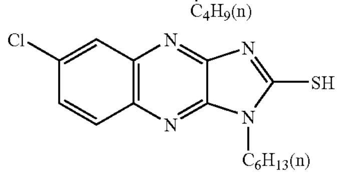

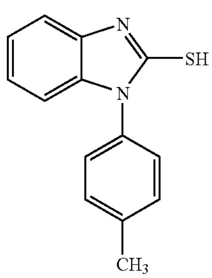

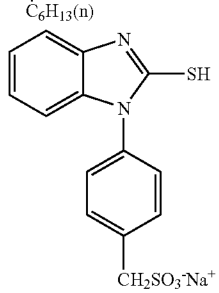

An amount of the chain transfer agent (for example, the thiol compound) used is preferably from 0.01 to 20% by weight, more preferably from 0.1 to 15% by weight, and still more preferably from 1.0 to 10% by weight, based on the total solid content of the photosensitive layer.

(F) Co-sensitizer

In the invention, a co-sensitizer may be used. The co-sensitizer is an additive capable of further increasing the sensitivity of the photosensitive layer, when it is added to the photosensitive layer. The operation mechanism of the co-sensitizer is not quite clear but may be considered to be mostly based on the following chemical process. Specifically, the co-sensitizer reacts with various intermediate active species (for example, a radical, a peroxide, an oxidizing agent or a reducing agent) generated during the process of photo-reaction initiated by the polymerization initiator and subsequent addition-polymerization reaction to produce new active radicals. The co-sensitizers are roughly classified into (a) a compound which is reduced to produce an active radical, (b) a compound which is oxidized to produce an active radical and (c) a compound which reacts with a radical having low activity to convert it into a more highly active radical or acts as a chain transfer agent. However, in many cases, a common view about that an individual compound belongs to which type is not present.

(a) Compound which is Reduced to Produce an Active Radical

Compound Having Carbon-Halogen Bond:

An active radical is considered to be generated by the reductive cleavage of the carbon-halogen bond. Specific examples of the compound preferably used include a trihalomethyl-s-triazine and a trihalomethyloxadiazole.

Compound Having Nitrogen-nitrogen Bond:

An active radical is considered to be generated by the reductive cleavage of the nitrogen-nitrogen bond. Specific examples of the compound preferably used include a hexaarylbiimidazole.

Compound Having Oxygen-oxygen Bond:

An active radical is considered to be generated by the reductive cleavage of the oxygen-oxygen bond. Specific examples of the compound preferably used include an organic peroxide.

Onium Compound:

An active radical is considered to be generated by the reductive cleavage of a carbon-hetero bond or oxygen-nitrogen bond. Specific examples of the compound preferably used include a diaryliodonium salt, a triarylsulfonium salt and an N-alkoxypyridinium(azinium) salt.

(b) Compound which is Oxidized to Produce an Active Radical

Alkylate Complex:

An active radical is considered to be generated by the oxidative cleavage of a carbon-hetero bond. Specific examples of the compound preferably used include a triaryl alkyl borate.

Alkylamine Compound:

An active radical is considered to be generated by the oxidative cleavage of a C—X bond on the carbon adjacent to nitrogen, wherein X is preferably, for example, a hydrogen atom, a carboxyl group, a trimethylsilyl group or a benzyl group. Specific examples of the compound include an ethanolamine, an N-phenylglycine and an N-trimethylsilylmethylaniline.

Sulfur-Containing or Tin-Containing Compound:

A compound in which the nitrogen atom of the above-described amine is replaced by a sulfur atom or a tin atom is considered to generate an active radical in the same manner. Also, a compound having an S—S bond is known to effect sensitization by the cleavage of the S—S bond.

α-Substituted Methylcarbonyl Compound:

An active radical can be generated by the oxidative cleavage of carbonyl-α-carbon bond. The compound in which the carbonyl is converted into an oxime ether also shows the similar function. Specific examples of the compound include an 2-alkyl-1-[4-(alkylthio)phenyl]-2-morpholinopronone-1, an oxime ether obtained by a reaction of the 2-alkyl-1-[4-(alkylthio)phenyl]-2-morpholinopronone-1 with a hydroxyamine and subsequent etherification of the N—OH and an oxime ester obtained by a reaction of the 2-alkyl-1-[4-(alkylthio)phenyl]-2-morpholinopronone-1 with a hydroxyamine and subsequent esterification of the N—OH.

Sulfinic Acid Salt:

An active radical can be reductively generated. Specific examples of the compound include sodium arylsulfinate.

(c) Compound which Reacts with a Radical to Convert it into a More Highly Active Radical or Acts as a Chain Transfer Agent:

For example, a compound having SH, PH, SiH or GeH in its molecule is used as the compound which reacts with a radical to convert it into a more highly active radical or acts as a chain transfer agent. The compound donates hydrogen to a low active radical species to generate a radical or is oxidized and deprotonized to generate a radical. Specific examples of the compound include a 2-mercaptobenzimidazole.

Specific examples of the co-sensitizer include compounds described in JP-A-9-236913 as additives for the purpose of increasing sensitivity. Some of them are set forth below, but the invention should not be construed as being limited thereto.

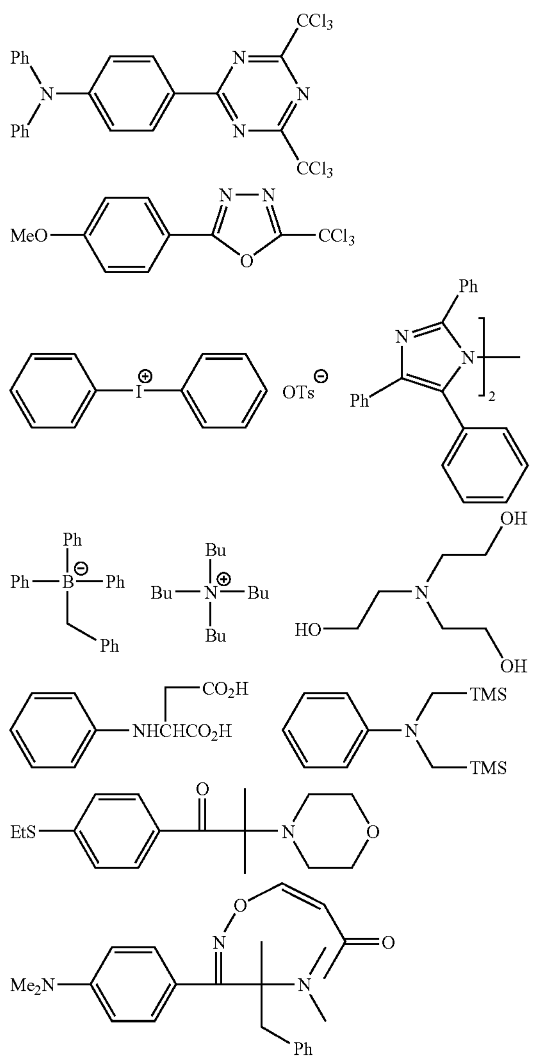

-continued

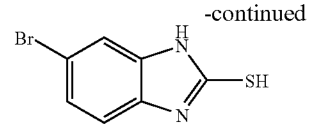

Similarly to the above-described sensitizing dye, the co-sensitizer can be subjected to various chemical modifications so as to improve the characteristics of the photosensitive layer of the lithographic printing plate precursor. For instance, methods, for example, binding to the sensitizing dye, polymerization initiator, polymerizable compound or other radical-generating part, introduction of a hydrophilic site, introduction of a substituent for improving compatibility or inhibiting deposition of crystal, introduction of a substituent for improving adhesion, and formation of a polymer, may be used. The co-sensitizers may be used individually or in combination of two or more thereof. The amount of the co-sensitizer used is ordinarily from 0.05 to 100 parts by weight, preferably from 1 to 80 parts by weight, and more preferably from 3 to 50 parts by weight, per 100 parts by weight of the polymerizable compound.

<Micro Capsule>

In the invention, in order to incorporate the above-described constituting components of the photosensitive layer and other constituting components described hereinafter into the photosensitive layer, a part or whole of the constituting components is encapsulated into microcapsules and added to the photosensitive layer as described, for example, in JP-A-2001-277740 and JP-A-2001-277742. In such a case, each constituting component may be present inside or outside the microcapsule in an appropriate ratio.

As a method of microencapsulating the constituting components of the photosensitive layer, known methods can be used. Methods for the production of microcapsules include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by polymerization of monomer described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and particularly polyurea and polyurethane are preferred. Further, a compound having a crosslinkable functional group, for example, an ethylenically unsaturated bond group, capable of being introduced into the hydrophobic binder polymer described above may be introduced into the micro capsule wall.

An average particle size of the microcapsule is preferably from 0.01 to 3.0 μm, more preferably from 0.05 to 2.0 μm, and particularly preferably from 0.10 to 1.0 μm. In the above-described range, preferable resolution and good preservation stability can be achieved.

<Other Constituting Components of Photosensitive Layer>

Into the photosensitive layer according to the invention, various additives can further be incorporated, if desired. Such additives are described in detail below.

<Surfactant>

In the invention, it is preferred to use a surfactant in the photosensitive layer in order to progress the developing property and to improve the state of surface coated. The surfactant includes, for example, a nonionic surfactant, an anionic surfactant, a cationic surfactant, an amphoteric surfactant and a fluorine-based surfactant.

The nonionic surfactant used in the invention is not particular restricted, and nonionic surfactants hitherto known can be used. Examples of the nonionic surfactant include polyoxyethylene alkyl ethers, polyoxyethylene alkyl phenyl ethers, polyoxyethylene polystyryl phenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerol fatty acid partial esters, polyoxyethylenated castor oils, polyoxyethylene glycerol fatty acid partial esters, fatty acid diethanolamides, N,N-bis-2-hydroxyalkylamines, polyoxyethylene alkylamines, triethanolamine fatty acid esters, trialylamine oxides, polyethylene glycols, and copolymers of polyethylene glycol and polypropylene glycol.

The anionic surfactant used in the invention is not particularly restricted and anionic surfactants hitherto known can be used. Examples of the anionic surfactant include fatty acid salts, abietic acid salts, hydroxyalkanesulfonic acid salts, alkanesulfonic acid salts, dialkylsulfosuccinic ester salts, straight-chain alkylbenzenesulfonic acid salts, branched alkylbenzenesulfonic acid salts, alkylnaphthalenesulfonic acid salts, alkylphenoxypolyoxy ethylene propylsulfonic acid salts, polyoxyethylene alkylsulfophenyl ether salts, N-methyl-N-oleyltaurine sodium salt, N-alkylsulfosuccinic monoamide disodium salts, petroleum sulfonic acid salts, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styrylphenyl ether sulfate ester salts, alkyl phosphate ester salts, polyoxyethylene alkyl ether phosphate ester salts, polyoxyethylene alkyl phenyl ether phosphate ester salts, partial saponification products of styrene/maleic anhydride copolymer, partial saponification products of olefin/maleic anhydride copolymer and naphthalene sulfonate formalin condensates.

The cationic surfactant used in the invention is not particularly restricted and cationic surfactants hitherto known can be used. Examples of the cationic surfactant include alkylamine salts, quaternary ammonium salts, polyoxyethylene alkyl amine salts and polyethylene polyamine derivatives.

The amphoteric surfactant used in the invention is not particularly restricted and amphoteric surfactants hitherto known can be used. Examples of the amphoteric surfactant include carboxybetaines, aminocarboxylic acids, sulfobetaines, aminosulfuric esters and imidazolines.

In the surfactants described above, the term "polyoxyethylene" can be replaced with "polyoxyalkylene", for example, polyoxymethylene, polyoxypropylene or polyoxybutylene, and such surfactants can also be used in the invention.

Further, a preferred surfactant includes a fluorine-based surfactant containing a perfluoroalkyl group in its molecule. Examples of the fluorine-based surfactant include an anionic type, for example, perfluoroalkyl carboxylates, perfluoroalkyl sulfonates or perfluoroalkylphosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants may be used individually or in combination of two or more thereof A content of the surfactant is preferably from 0.001 to 10% by weight, more preferably from 0.01 to 7% by weight, based on the total solid content of the photosensitive layer.

<Hydrophilic Polymer>

In the invention, a hydrophilic polymer may be incorporated into the photosensitive layer in order to improve the developing property and dispersion stability of microcapsule.

Preferable examples of the hydrophilic polymer include those having a hydrophilic group, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group.

Specific examples of the hydrophilic polymer include gum arabic, casein, gelatin, a starch derivative, carboxymethyl cellulose or a sodium salt thereof, cellulose acetate, sodium alginate, a vinyl acetate-maleic acid copolymer, a styrene-maleic acid copolymer, polyacrylic acid or a salt thereof, polymethacrylic acid or a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, polyethylene glycol, a hydroxypropylene polymer, polyvinyl alcohol, a hydrolyzed polyvinyl acetate having a hydrolysis degree of 60% by mole or more, preferably 80% by mole or more, polyvinyl formal, polyvinyl butyral, polyvinylpyrrolidone, a homopolymer or polymer of acrylamide, a homopolymer or copolymer of methacrylamide, a homopolymer or copolymer of N-methylolacrylamide, polyvinylpyrrolidone, an alcohol-soluble nylon, and a polyether of 2,2-bis(4-hydroxyphenyl)propane with epichlorohydrin.

The hydrophilic polymer preferably has a weight average molecular weight of 5,000 or more, more preferably from 10,000 to 300,000. The hydrophilic polymer may be any of a random polymer, a block polymer, a graft polymer or the like.

The content of the hydrophilic polymer in the photosensitive layer is preferably 20% by weight or less, more preferably 10% by weight or less, based on the total solid content of the photosensitive layer.

<Coloring Agent>

In the invention, a dye having large absorption in the visible light region can be used as a coloring agent for the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI45170B), Malachite Green (CI42000), Methylene Blue (CI52015), and dyes described in JP-A-62-293247. Also, a pigment, for example, phthalocyanine-based pigment, azo-based pigment, carbon black and titanium oxide can be preferably used.

It is preferable to add the coloring agent, because the image area and the non-image area after the image formation can be easily distinguished. The amount of the coloring agent added is preferably from 0.01 to 10% by weight based on the total solid content of the photosensitive layer.

<Print-out Agent>

In the photosensitive layer according to the invention, a compound capable of undergoing discoloration by the effect of an acid or a radical can be added in order to form a print-out image. As such a compound, for example, various dyes, e.g., diphenylmethane-based, triphenylmethane-based, thiazine-based, oxazine-based, xanthene-based, anthraquinone-based, iminoquinone-based, azo-based and azomethine-based dyes are effectively used.

Specific examples thereof include dyes, for example, Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH (produced by Hodogaya Chemical Co., Ltd.), Oil Blue #603 (produced by Orient Chemical Industry Co., Ltd.), Oil Pink #312 (produced by Orient Chemical Industry Co., Ltd.), Oil Red 5B (produced by Orient Chemical Industry Co., Ltd.), Oil Scarlet #308 (produced by Orient Chemical Industry Co., Ltd.), Oil Red OG (produced by Orient Chemical Industry Co., Ltd.), Oil Red RR (produced by Orient Chemical Industry Co., Ltd.), Oil Green #502 (produced by Orient Chemical Industry Co., Ltd.), Spiron Red BEH Special (produced by Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carboxystearyl-amino-4-p-N,N-bis (hydroxyethyl)aminophenyliminonaphthoquinone, 1-phenyl-3-methyl-4-p-diethylaminophenylimino-5-pyrazolone and 1-β-naphthyl-4-p-diethylaminophenylimino-5-pyrazolone, and leuco dyes, for example, p,p',p"-hexamethyltriaminotriphenyl methane (leuco Crystal Violet) and Pergascript Blue SRB (produced by Ciba Geigy).

Other preferable examples include leuco dyes known as a material for heat-sensitive paper or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl)aminofluorane, 2-anilino-3-methyl-6-(N-ethyl-p-toluidino)fluorane, 3,6-dimethoxyfluorane, 3-(N,N-diethylamino)-5-methyl-7-(N,N-dibenzylamino)fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidinofluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilinofluorane, 3,3-bis(1-ethyl-2-methylindol-3-yl) phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl)phthalide.

The dye capable of undergoing discoloration by the effect of an acid or a radical is preferably added in an amount of 0.01 to 15% by weight based on the total solid content of the photosensitive layer.

<Thermal Polymerization Inhibitor>

In the photosensitive layer according to the invention, a small amount of a thermal polymerization inhibitor is preferably added in order to prevent the radical polymerizable compound from undergoing undesirable thermal polymerization during the preparation or preservation of the photosensitive layer.

Preferable examples of the thermal polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the photosensitive layer.

<Higher Fatty Acid Derivative>

In the photosensitive layer according to the invention, for example, a higher fatty acid derivative, e.g., behenic acid or behenic acid amide may be added and localized on the surface of the photosensitive layer during the process of drying after coating in order to avoid polymerization inhibition due to oxygen. The amount of the higher fatty acid derivative added is preferably from about 0.1 to about 10% by weight based on the total solid content of the photosensitive layer.

<Plasticizer>

The photosensitive layer according to the invention may contain a plasticizer. Preferable examples of the plasticizer include a phthalic acid ester, for example, dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate; a glycol ester, for example, dimethyl glycol phthalate, ethyl phthalylethyl glycolate, methyl phthalylethyl glycolate, butyl phthalylbutyl glycolate or triethylene glycol dicaprylic acid ester; a phosphoric acid ester, for example, tricresyl phosphate or triphenyl phosphate; an aliphatic dibasic acid ester, for example, diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate. The content of the plasticizer is preferably about 30% by weight or less based on the total solid content of the photosensitive layer.

<Fine Inorganic Particle>

The photosensitive layer according to the invention may contain fine inorganic particle in order to increase strength of the hardened layer in the image area. The fine inorganic particle preferably includes, for example, silica, alumina, magnesium oxide, titanium oxide, magnesium carbonate, calcium alginate and a mixture thereof. Even if the fine inorganic particle has no light to heat converting property, it can be used, for example, for strengthening the layer or enhancing interface adhesion property due to surface roughening. The fine inorganic particle preferably has an average particle size from 5 nm to 10 μm and more preferably from 0.5 to 3 μm. In the above-described range, it is stably dispersed in the photosensitive layer, sufficiently maintains the film strength of the photosensitive layer and can form the non-image area excellent in hydrophilicity and preventing from stain at the printing.

The fine inorganic particle described above is easily available as a commercial product, for example, colloidal silica dispersion.

The content of the fine inorganic particle is preferably 20% by weight or less, and more preferably 10% by weight or less based on the total solid content of the photosensitive layer.

<Hydrophilic Low Molecular Weight Compound>

The photosensitive layer according to the invention may contain a hydrophilic low molecular weight compound in order to improve the developing property. The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine or pentaerythritol, an organic amine, e.g., triethanol amine, diethanol amine or monoethanol amine, or a salt thereof, an organic sulfonic acid, e.g., toluene sulfonic acid or benzene sulfonic acid, or a salt thereof, an organic phosphonic acid, e.g., phenyl phosphonic acid, or a salt thereof, an organic carboxylic acid, e.g., tartaric acid, oxalic acid, citric acid, maleic acid, lactic acid, gluconic acid or an amino acid, or a salt thereof, and an organic quaternary ammonium salt, e.g., tetraethyl ammonium hydrochloride.

<Formation of Photosensitive Layer>

The photosensitive layer according to the invention is formed by dispersing or dissolving each of the necessary constituting components described above to prepare a coating solution and coating the solution. The solvent used include, for example, ethylene dichloride, cyclohexanone, methyl ethyl ketone, methanol, ethanol, propanol, ethylene glycol monomethyl ether, 1-methoxy-2-propanol, 2-methxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid concentration of the coating solution is preferably from 1 to 50% by weight.

The photosensitive layer according to the invention may also be formed by preparing plural coating solutions by dispersing or dissolving the same or different components described above into the same or different solvents and conducting repeatedly plural coating and drying.

The coating amount (solid content) of the photosensitive layer on the support after the coating and drying may be varied depending on the use, but ordinarily, it is preferably from 0.3 to 3.0 g/m$^2$. In the above-described range, the preferable sensitivity and good film property of the photosensitive layer can be obtained.

Various methods can be used for the coating. Examples of the method include bar coater coating, spin coating, spray coating, curtain coating, dip coating, air knife coating, blade coating and roll coating.

(Protective Layer)

In the lithographic printing plate precursor according to the invention, a protective layer (oxygen-blocking layer) is preferably provided on the photosensitive layer in order to prevent diffusion and penetration of oxygen which inhibits the polymerization reaction at the time of exposure. The protective layer for use in the invention preferably has oxygen permeability (A) at 25° C. under one atmosphere of $1.0 \leqq (A) \leqq 20$ (ml/m$^2$·day). When the oxygen permeability (A) is extremely lower than 1.0 (ml/m$^2$·day), problems may occur in that an undesirable polymerization reaction arises during the production or preservation before image exposure and in that undesirable fog or spread of image line occurs at the image exposure. On the contrary, when the oxygen permeability (A) greatly exceeds 20 (ml/m$^2$·day), decrease in sensitivity may be incurred. The oxygen permeability (A) is more preferably in a range of $1.5 \leqq (A) \leqq 12$ (ml/m$^2$·day), and still more preferably in a range of $2.0 \leqq (A) \leqq 10.0$ (ml/m$^2$·day). Besides the above described oxygen permeability, as for the characteristics required of the protective layer, it is desired that the protective layer does not substantially hinder the transmission of light for the exposure, is excellent in adhesion to the photosensitive layer, and can be easily removed during a development step after the exposure. Contrivances on the protective layer have been heretofore made and described in detail in U.S. Pat. No. 3,458,311 and JP-B-55-49729.

As the material of the protective layer, for example, a water-soluble polymer compound relatively excellent in crystallizability is preferably used. Specifically, a water-soluble polymer, for example, polyvinyl alcohol, vinyl alcohol/vinyl phthalate copolymer, vinyl acetate/vinyl alcohol/vinyl phthalate copolymer, vinyl acetate/crotonic acid copolymer, polyvinyl pyrrolidone, oxygen bondable polymer containing an aliphatic amine group described, for example, in European Patent 352,630B1, methyl vinyl ether/maleic anhydride copolymer, poly(ethyleneoxide), copolymer of ethyleneoxide and poly(vinyl alcohol), carbohydrate, carbohydrate derivative (for example, hydroxyethyl cellulose or acidic cellulose), gelatin, gum arabic, polyacrylic acid or polyacrylamide is exemplified. The water-soluble polymer compounds may be used individually or as a mixture. Of the compounds, when polyvinyl alcohol is used as a main component, the most preferable results can be obtained in the fundamental characteristics, for example, oxygen-blocking property and removability of the protective layer by development.

Polyvinyl alcohol for use in the protective layer may be partially substituted with ester, ether or acetal as long as it contains unsubstituted vinyl alcohol units for achieving the necessary oxygen-blocking property and water solubility. Also, a part of polyvinyl alcohol may have other copolymer component. As specific examples of polyvinyl alcohol, those having a saponification degree (hydrolysis degree) of 71 to 100% by mole and a polymerization repeating unit number of 300 to 2,400 are exemplified. The term "saponification degree" of polyvinyl alcohol as used herein means a ratio of vinyl alcohol unit to the sum total of vinyl alcohol unit and other hydrolysable vinyl alcohol derivative unit (for example, ester, ether or acetal).

According to the invention, an average saponification degree of the whole polyvinyl alcohol contained in the protective layer is preferably in a range of 70 to 93% by mole, more preferably in a range of 80 to 92% by mole. The term "average saponification degree" as used herein means a saponification degree to the total polyvinyl alcohol when plural kind of polyvinyl alcohols having different saponification degrees are used and a value obtained by calculation from 75 MHz $^{13}$C-NMR spectrum of a DMSO solution of the sample used in the protective layer. As the polyvinyl alcohol having the above-described range of average saponification degree, those comprising vinyl alcohol unit and vinyl acetate unit are preferable. As long as the above-described average saponification degree is fulfilled, polyvinyl alcohol having saponification degree without the range of 70 to 93% by mole may be used in the mixture of polyvinyl alcohol.

The polyvinyl alcohol has preferably viscosity of a 4% by weight aqueous solution thereof at 20° C. from 4 to 60 mPa·s, more preferably from 4 to 20 mPa·s, particularly preferably from 4 to 10 mPa·s.

Specific examples of the polyvinyl alcohol used in the invention include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 (produced by Kuraray Co., Ltd.). They can be used individually or as a mixture. According to a preferred embodiment, the content of polyvinyl alcohol in the protective layer is from 20 to 95% by weight, more preferably from 30 to 90% by weight.

Also, known modified polyvinyl alcohol can be preferably used. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are exemplified.

In particular, an acid-modified polyvinyl alcohol is preferably used. As the acid-modified polyvinyl alcohol, any vinyl alcohol polymer containing a prescribed amount of an acid group is used without particular restriction. A vinyl alcohol polymer containing a prescribed amount of a sulfonic acid group or carboxyl group is particularly preferably used and the former is referred to as a sulfonic acid-modified polyvinyl alcohol and the latter is referred to as a carboxy-modified polyvinyl alcohol.

Synthesis of the acid-modified polyvinyl alcohol is preferably performed according to a method wherein a monomer having an acid group is copolymerized with vinyl acetate and then the vinyl acetate is partially or wholly saponified to change to vinyl alcohol. However, it is also possible to synthesis by connecting a compound having an acid group to a hydroxy group of polyvinyl alcohol.

Examples of the monomer having a sulfonic acid group include ethylenesulfonic acid, allylsulfonic acid, methallylsulfonic acid, 2-acrylamido-2-methylpropanesulfonic acid and salts thereof. Examples of the compound having a sulfonic acid group include an aldehyde derivative having a sulfonic acid group, for example, p-sulfonic acid benzaldehyde and salts thereof. The compound can be introduced by a conventionally known acetalization reaction.

Examples of the monomer having a carboxyl group include fumaric acid, maleic acid, itaconic acid, maleic anhydride, phthalic anhydride, trimellitic anhydride, acrylic acid and salts thereof, an acrylic acid ester, for example, methyl acrylate, and a methacrylic acid ester, for example, methyl methacrylate. Examples of the compound having a carboxyl group include a monomer, for example, acrylic acid. The compound can be introduced according to a conventionally known Michael addition reaction.

The acid-modified polyvinyl alcohol may be a compound appropriately synthesized or a commercially available compound. The acid-modified polyvinyl alcohol has an effect of preventing degradation of the removability of photosensitive layer by development. Particularly, the acid-modified polyvinyl alcohol having a saponification degree of 91% by mole or more is preferable.

Examples of the acid-modified polyvinyl alcohol having such a high saponification degree include as the carboxy-modified polyvinyl alcohol, KL-118 (saponification degree: 97% by mole, average polymerization degree: 1,800), KM-618 (saponification degree: 94% by mole, average polymerization degree: 1,800), KM-118 (saponification degree: 97% by mole, average polymerization degree: 1,800) and KM-106 (saponification degree: 98.5% by mole, average polymerization degree: 600) produced by Kuraray Co., Ltd., Gosenal T-330H (saponification degree: 99% by mole, average polymerization degree: 1,700), Gosenal T-330 (saponification degree: 96.5% by mole, average polymerization degree: 1,700), Gosenal T-350 (saponification degree: 94% by mole, average polymerization degree: 1,700), Gosenal T-230 (saponification degree: 96.5% by mole, average polymerization degree: 1,500), Gosenal T-215 (saponification degree: 96.5% by mole, average polymerization degree: 1,300) and Gosenal T-HS-1 (saponification degree: 99% by mole, average polymerization degree: 1,300) produced by Nippon Synthetic Chemical Industry Co., Ltd., and AF-17 (saponification degree: 96.5% by mole, average polymerization degree: 1,700) and AT-17 (saponification degree: 93.5% by mole, average polymerization degree: 1,700) produced by Japan VAM & Poval Co., Ltd.

Examples of the sulfonic acid-modified polyvinyl alcohol include SK-5102 (saponification degree: 98% by mole, average polymerization degree: 200) produced by Kuraray Co., Ltd. and Goseran CKS-50 (saponification degree: 99% by mole, average polymerization degree: 300) produced by Nippon Synthetic Chemical Industry Co., Ltd.

In view of preventing more effectively the degradation of the removability of photosensitive layer by development, it is particularly preferable to use the acid-modified polyvinyl alcohol having an average polymerization degree of vinyl alcohol unit of 100 to 800. By using the acid-modified polyvinyl alcohol having such a low polymerization degree and a high saponification degree, a protective layer which is effectively preventing the degradation of the removability of photosensitive layer by development while maintaining the excellent characteristic of oxygen-blocking property can be obtained.

As the acid-modified polyvinyl alcohol having such a low polymerization degree and a high saponification degree, a carboxy-modified polyvinyl alcohol modified with itaconic acid or maleic acid or a sulfonic acid-modified polyvinyl alcohol having a saponification degree of 91% by mole or more and an average polymerization degree of vinyl alcohol unit of 100 to 800 is preferable.

The modification degree of the acid-modified polyvinyl alcohol is preferably from 0.1 to 20% by mole, more preferably from 0.2 to 5% by mole. The modification degree of the acid-modified polyvinyl alcohol means a molar ratio of unit having an acid group contained in a copolymer of the acid-modified polyvinyl alcohol.

The acid-modified polyvinyl alcohol is preferably included in an amount of 20% by weight or more, more preferably in an amount of 50% by weight or more, still more preferably in a range of 50 to 97% by weight, further more preferably in a range of 60 to 95% by weight, based on the total solid content of the protective layer.

The acid-modified polyvinyl alcohol is used at least one kind but two or more kinds thereof may be used together. In case of using two or more kinds of the acid-modified polyvinyl alcohol, the total amount thereof is preferably in the range described above.

As a component used as a mixture with polyvinyl alcohol, polyvinyl pyrrolidone or a modified product thereof is preferable from the viewpoint of the oxygen-blocking property and removability by development. The content thereof is ordinarily from 3.5 to 80% by weight, preferably from 10 to 60% by weight, and more preferably from 15 to 30% by weight, in the protective layer.

The components of the protective layer (selection of polyvinyl alcohol and use of additives) and the coating amount are determined taking into consideration fog-preventing property, adhesion property and scratch resistance besides the oxygen-blocking property and removability by development. In general, the higher the hydrolysis rate of the polyvinyl alcohol used (the higher the unsubstituted vinyl alcohol unit content in the protective layer) and the larger the layer thickness, the higher is the oxygen-blocking property, thus it is advantageous in the point of sensitivity. The molecular weight of the polymer compound, for example, polyvinyl alcohol (PVA) is ordinarily in a range of 2,000 to 10,000,000, preferably in a range of 20,000 to 3,000,000.

As other additive of the protective layer, glycerin, dipropylene glycol or the like can be added in an amount corresponding to several % by weight of the polymer compound to provide flexibility. Further, an anionic surfactant, for example, sodium alkylsulfate or sodium alkylsulfonate; an amphoteric surfactant, for example, alkyl aminocarboxylate and alkyl aminodicarboxylate; or a nonionic surfactant, for example, polyoxyethylene alkyl phenyl ether can be added in an amount corresponding to several % by weight of the polymer compound. Further, a surface wetting agent, a coloring agent, a complexing agent, a fungicide or the like is exemplified as other additive of the protective layer. For example, a polyoxyethylenated polyamine compound can be used as the complexing agent.

The protective layer must be transparent to the laser light. Preferably, the protective layer is homogenous, substantially impermeable to oxygen and water-permeable. The protective layer is preferably removed with a developer used for the formation of a lithographic printing plate after the imagewise laser exposure of the photosensitive layer. While the photosensitive layer is imagewise removable, the protective layer is overall removable.

The protective layer can be coated on the photosensitive layer according to known techniques. A coating solution for protective layer preferably contains water or a mixture of water and an organic solvent. In order to achieve more preferable wettability, the coating solution for protective layer contains a surfactant preferably 10% by weight or less, particularly preferably 5% by weight or less, based on the solid content of the coating solution. Representative examples of the suitable surfactant include an anionic, cationic or nonionic surfactant, for example, sodium alkyl sulfate or sulfonate having from 12 to 18 carbon atoms, for example, sodium dodecylsulfate, N-cetyl or C-cetyl betaine, alkyl aminocarboxylate or alkyl aminodicalboxylate or polyethylene glycol having an average molar weight of 400 or less.

The adhesion property of the protective layer to the photosensitive layer and scratch resistance are also extremely important in view of handling of the printing plate precursor. Specifically, when a hydrophilic layer comprising a water-soluble polymer is laminated on a oleophilic photosensitive layer, layer peeling due to insufficient adhesion is liable to occur, and the peeled portion causes such a defect as failure in hardening of the photosensitive layer due to polymerization inhibition by oxygen. Various proposals have been made for improving the adhesion between the photosensitive layer and the protective layer. For example, it is described in U.S. Pat. Nos. 292,501 and 44,563 that a sufficient adhesion property can be obtained by mixing from 20 to 60% by weight of an acryl-based emulsion or a water-insoluble vinyl pyrrolidone/vinyl acetate copolymer with a hydrophilic polymer mainly comprising polyvinyl alcohol and laminating the resulting mixture on the photosensitive layer. Any of these known techniques can be applied to the protective layer according to the invention. Coating methods of the protective layer are described in detail, for example, in U.S. Pat. No. 3,458,311 and JP-B-55-49729.

Further, it is also preferred to incorporate an inorganic stratiform compound into the protective layer of the lithographic printing plate precursor according to the invention for the purpose of improving the oxygen-blocking property and property for protecting the surface of photosensitive layer.

The inorganic stratifonm compound used here is a particle having a thin tabular shape and includes, for instance, mica, for example, natural mica represented by the following formula: $A(B, C)_{2-5} D_4 O_{10} (OH, F, O)_2$, (wherein A represents any one of K, Na and Ca, B and C each represents any one of Fe (II), Fe(III), Mn, Al, Mg and V, and D represents Si or Al) or synthetic mica; talc represented by the following formula: $3MgO.4SiO.H_2O$; teniolite; montmorillonite; saponite; hectolite; and zirconium phosphate.

Of the micas, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{2.5}(Si_4O_{10})F_2$, Na or Li teniolite $(Na, Li)Mg_2Li(Si_4O_{10})F_2$, or montmorillonite based Na or Li hectolite $(Na, Li)_{1/8}Mg_{2/5}Li_{1/8}(Si_4O_{10})F_2$. Synthetic smectite is also useful.

Of the inorganic stratiform compounds, fluorine based swellable mica, which is a synthetic inorganic stratiform compound, is particularly useful in the invention. Specifically, the swellable synthetic mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, $Na^+$, $Ca^{2+}$ or $Mg^{2+}$, is adsorbed between the lattice layers. The cation existing between the lattice layers is referred to as an exchangeable cation and is exchangeable with various cations. In particular, in the case where the cation between the lattice layers is Li+ or $Na^+$, because of a small ionic radius, a bond between the stratiform crystal lattices is week, and the inorganic stratiform compound greatly swells upon contact with water. When share is applied under such condition, the stratiform crystal lattices are easily cleaved to form a stable sol in water.

The bentnite and swellable synthetic mica have strongly such tendency and are useful in the invention. Particularly, the swellable synthetic mica is preferably used.

With respect to the shape of the inorganic stratiform compound used in the invention, the thinner the thickness or the larger the plain size as long as smoothness of coated surface and transmission of actinic radiation are not damaged, the better from the standpoint of control of diffusion. Therefore, an aspect ratio of the inorganic stratiform compound is ordinarily 20 or more, preferably 100 or more, and particularly preferably 200 or more. The aspect ratio is a ratio of thickness to major axis of particle and can be determined, for example, from a projection drawing of particle by a microphotography. The larger the aspect ratio, the greater the effect obtained.

As for the particle size of the inorganic stratiform compound used in the invention, an average major axis is ordinarily from 0.3 to 20 μm, preferably from 0.5 to 10 μm, and particularly preferably from 1 to 5 μm. An average thickness of the particle is ordinarily 0.1 μm or less, preferably 0.05 μm or less, and particularly preferably 0.01 μm or less. For example, in the swellable synthetic mica that is the representative compound of the inorganic stratiform compounds, thickness is approximately from 1 to 50 nm and plain size is approximately from 1 to 20 μm.

When such an inorganic stratiform compound particle having a large aspect ratio is incorporated into the protective layer, strength of coated layer increases and penetration of oxygen or moisture can be effectively inhibited so that the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

The content of the inorganic stratiform compound in the protective layer is preferably from 5/1 to 1/100 in terms of weight ratio to the amount of binder used in the protective layer. When a plurality of inorganic stratiform compounds is used in combination, it is also preferred that the total amount of the inorganic stratiform compounds fulfills the above-described weight ratio.

An example of common dispersing method for the inorganic stratiform compound used in the protective layer is described below. Specifically, from 5 to 10 parts by weight of a swellable stratiform compound that is exemplified as a preferred inorganic stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand a grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having a Polman whistle. A dispersion containing from 5 to 10% by weight of the inorganic stratiform compound thus prepared is highly viscous or gelled and exhibits extremely good preservation stability. In the formation of a coating solution for protective layer using the dispersion, it is preferred that the dispersion is diluted with water, sufficiently stirred and then mixed with a binder solution.

To the coating solution for protective layer can be added known additives, for example, a surfactant for improving coating property or a water-soluble plasticizer for improving physical property of coated layer in addition to the inorganic stratiform compound. Examples of the water-soluble plasticizer include propionamide, cyclohexanediol, glycerin or sorbitol. Also, a water-soluble(meth)acrylic polymer can be added. Further, to the coating solution may be added known additives for increasing adhesion to the photosensitive layer or for improving preservation stability of the coating solution.

The coating solution for protective layer thus-prepared is coated on the photosensitive layer provided on the support and then dried to form a protective layer. The coating solvent may be appropriately selected in view of the binder used, and when a water-soluble polymer is used, distilled water or purified water is preferably used as the solvent. A coating method of the protective layer is not particularly limited, and known methods, for example, methods described in U.S. Pat. No. 3,458,311 and JP-B-55-49729 can be utilized. Specific examples of the coating method for the protective layer include a blade coating method, an air knife coating method, a gravure coating method, a roll coating method, a spray coating method, a dip coating method and a bar coating method.

A coating amount of the protective layer is preferably in a range from 0.05 to 10 g/m$^2$ in terms of the coating amount after drying. When the protective layer contains the inorganic stratiform compound, it is more preferably in a range from 0.1 to 0.5 g/m$^2$, and when the protective layer does not contain the inorganic stratiform compound, it is more preferably in a range from 0.5 to 5 g/m$^2$.

[Support]

The support for use in the lithographic printing plate precursor according to the invention is not particularly restricted as long as it is a dimensionally stable plate-like hydrophilic support. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetatebutyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials known and used conventionally can be appropriately utilized.

The thickness of the support is preferably from 0.1 to 0.6 mm, more preferably from 0.15 to 0.4 mm, and still more preferably from 0.2 to 0.3 mm.

Prior to the use of aluminum plate, a surface treatment, for example, roughening treatment or anodizing treatment is preferably performed. The surface treatment facilitates improvement in the hydrophilic property and ensures adhesion between the photosensitive layer and the support. In advance of the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, a ball grinding method, a brush grinding method, a blast grinding method or a buff grinding method can be used.

The electrochemical roughening treatment method includes, for example, a method of conducting it by passing alternating current or direct current in an electrolyte containing an acid, for example, hydrochloric acid or nitric acid. Also, a method of using a mixed acid described in JP-A-54-63902 can be used.

The aluminum plate after the roughening treatment is then subjected, if desired, to an alkali etching treatment using an aqueous solution, for example, of potassium hydroxide or sodium hydroxide and further subjected to a neutralizing treatment, and then subjected to an anodizing treatment in order to enhance the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte.

Since the conditions of the anodizing treatment are varied depending on the electrolyte used, they cannot be defined generally. However, it is ordinarily preferred that electrolyte concentration in the solution is from 1 to 80% by weight, liquid temperature is from 5 to 70° C., current density is from 5 to 60 A/dm$^2$, voltage is from 1 to 100 V, and electrolysis time is from 10 seconds to 5 minutes. The amount of the anodized film formed is preferably from 1.0 to 5.0 g/m$^2$ and more preferably from 1.5 to 4.0 g/m$^2$. In the above-described range, good printing durability and favorable scratch resistance in the non-image area of lithographic printing plate can be achieved.

The aluminum plate subjected to the surface treatment and having the anodized film is used as it is as the support in the invention. However, in order to more improve adhesion to a layer provided thereon, hydrophilicity, resistance to stain, heat insulating property or the like, other treatment, for example, a treatment for enlarging micropores or a sealing treatment of micropores of the anodized film described in JP-A-2001-253181 and JP-A-2001-322365, or a surface hydrophilizing treatment by immersing in an aqueous solution containing a hydrophilic compound, may be appropriately conducted. Needless to say, the enlarging treatment and sealing treatment are not limited to those described in the above-described patents and any conventionally known method may be employed.

As the sealing treatment, as well as a sealing treatment with steam, a sealing treatment with an aqueous solution containing an inorganic fluorine compound, for example, fluorozirconic acid alone or sodium fluoride, a sealing treatment with steam having added thereto lithium chloride or a sealing treatment with hot water may be employed.

Among them, the sealing treatment with an aqueous solution containing an inorganic fluorine compound, the sealing treatment with water vapor and a sealing treatment with hot water are preferred.

The hydrophilizing treatment includes an alkali metal silicate method described in U.S. Pat. Nos. 2,714,066, 3,181,461, 3,280,734 and 3,902,734. In the method, the support is subjected to an immersion treatment or an electrolytic treatment in an aqueous solution, for example, of sodium silicate. In addition, the hydrophilizing treatment includes, for example, a method of treating with potassium fluorozirconate described in JP-B-36-22063 and a method of treating with polyvinylphosphonic acid described in U.S. Pat. Nos. 3,276,868, 4,153,461, and 4,689,272.

In the case of using a support having a surface of insufficient hydrophilicity, for example, a polyester film, in the invention, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic thin layer having a surface containing metal oxide. Among them, the hydrophilic layer formed by coating a coating solution containing a colloid of oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion of the hydrophilic layer to the support. As the antistatic layer, a polymer layer having fine particles of metal oxide or a matting agent dispersed therein described in JP-A-2002-79772 can be used.

The support preferably has a center line average roughness of 0.10 to 1.2 μm. In the above-described range, good adhesion to the photosensitive layer, good printing durability, and good stain resistance can be achieved.

The color density of the support is preferably from 0.15 to 0.65 in terms of the reflection density value. In the above-described range, good image-forming property by preventing halation at the image exposure and good aptitude for plate inspection after development can be achieved.

(Undercoat Layer)

In the lithographic printing plate precursor for use in the method for preparation of a lithographic printing plate according to the invention, an undercoat layer can be provided between the photosensitive layer and the support, if desired.

As a compound for the undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are preferably exemplified.

As the most preferable undercoat layer, an undercoat layer containing a polymer compound including a crosslinkable group (preferably, an ethylenically unsaturated bond group, a functional group capable of interacting with a surface of the support and a hydrophilic group is exemplified.

As the polymer compound, a polymer resin obtained by copolymerization of a monomer having an ethylenically unsaturated bond group, a monomer having a functional group capable of interacting with a surface of the support and a monomer having a hydrophilic group is exemplified.

Since the polymer compound incorporated into the undercoat layer has the functional group capable of interacting with a surface of the support and the ethylenically unsaturated bond group capable of undergoing a crosslinking or polymerization reaction, the strong adhesion property between the support and the photosensitive layer is generated in the exposed area, and since the polymer compound further has the hydrophilic group, high hydrophilicity is obtained in the unexposed area after the removal of the photosensitive layer with development. Thus, both printing durability in the exposed area and stain resistance in the unexposed area can be achieved.

As the functional group capable of interacting with a surface of the support, a group capable of undergoing interaction, for example, forming a covalent bond, an ionic bond or a hydrogen bond or undergoing polar interaction or van der Waals interaction, with metal, metal oxide, hydroxy group or the like present on the support is exemplified. Among them, a functional group (an adsorbing group) adsorbing to the support is preferable.

Whether the adsorptivity to the surface of support is present or not can be judged, for example, by the following method.

Specifically, a test compound is dissolved in a solvent in which the test compound is easily soluble to prepare a coating solution, and the coating solution is coated and dried on a support so as to have the coating amount after drying of 30 mg/m$^2$. After thoroughly washing the support coated with the test compound using the solvent in which the test compound is easily soluble, the residual amount of the test compound that has not been removed by the washing is measured to calculate the adsorption amount to the support. For measurement of the residual amount, the amount of the residual test compound may be directly determined, or it may be calculated from the amount of the test compound dissolved in the washing solution. The determination for the compound can be performed, for example, by fluorescent X-ray measurement, reflection spectral absorbance measurement or liquid chromatography measurement. The compound having the adsorptivity to support means a compound that remains by 0.1 mg/m$^2$ or more even after conducting the washing treatment described above.

The adsorbing group to the surface of support is a functional group capable of forming a chemical bond (for example, an ionic bond, a hydrogen bond, a coordinate bond or a bond with intermolecular force) with a substance (for example, metal or metal oxide) or a functional group (for example, a hydroxy group) present on the surface of support. The adsorbing group is preferably an acid group or a cationic group.

The acid group preferably has an acid dissociation constant (pKa) of 7 or less. Examples of the acid group include a phenolic hydroxy group, a carboxyl group, —$SO_3H$, —$OSO_3H$, —$PO_3H_2$, —$OPO_3H_2$, —$CONHSO_2$—, —$SO_2NHSO_2$— and —$COCH_2COCH_3$. Among them, a phosphoric acid group (—$OPO_3H_2$ or —$PO_3H_2$) is particularly preferred. The acid group may be the form of a metal salt.

The cationic group is preferably an onium group. Examples of the onium group include an ammonium group, a phosphonium group, an arsonium group, a stibonium group, an oxonium group, a sulfonium group, a selenonium group, a stannonium group and iodonium group. Among them, the ammonium group, phosphonium group and sulfonium group are preferred, the ammonium group and phosphonium group are more preferred, and the ammonium group is most preferred.

Examples of the functional group adsorbing to the surface of support are set forth below.

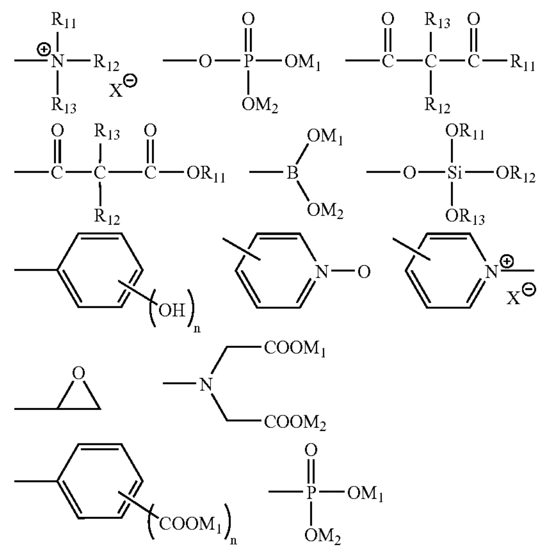

In the above-formulae, $R_{11}$, to $R_{13}$ each independently represents a hydrogen atom, an alkyl group, an aryl group, an alkynyl group or an alkenyl group; $M_1$ and $M_2$ each independently represents a hydrogen atom, a metal atom or an ammonium group; and $X^-$ represents a counter anion.

As the adsorbing group, an onium group (for example, an ammonium group or a pyridinium group), a phosphoric ester group, a boric acid group and a β-diketone group (for example, an acetylacetone group) is particularly preferable.

Particularly preferable examples of the monomer having the adsorbing group include compounds represented by the following formula (VII) or (VIII):

(VII)

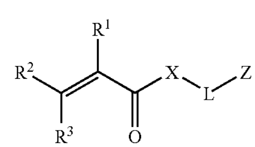

(VIII)

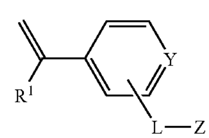

In formula (VII) or (VIII), $R^1$, $R^2$ and $R^3$ each independently represents a hydrogen atom, halogen atom or an alkyl group having from 1 to 6 carbon atoms. $R^1$ and $R^2$ and $R^3$ each independently represents preferably a hydrogen atom or an alkyl group having from 1 to 6 carbon atoms, more preferably a hydrogen atom or an alkyl group having from 1 to 3 carbon atoms, and most preferably a hydrogen atom or a methyl group. It is particularly preferred that $R^2$ and $R^3$ each represents a hydrogen atom.

In the formula (VII), X represents an oxygen atom (—O—) or imino group (—NH—). Preferably, X represents an oxygen atom. In the formula (VII) or (VIII), L represents a divalent connecting group. It is preferred that L represents a divalent aliphatic group (for example, an alkylene group, a substituted alkylene group, an alkenylene group, a substituted alkenylene group, an alkinylene group or a substituted alkinylene group), a divalent aromatic group (for example, an arylene group or a substituted arylene group), a divalent heterocyclic group or a combination of each of the groups described above with an oxygen atom (—O—), a sulfur atom (—S—), an imino group (—NH—), a substituted imino group (—NR—, wherein R represents an aliphatic group, an aromatic group or a heterocyclic group) or a carbonyl group (—CO—).

The aliphatic group may form a cyclic structure or a branched structure. The number of carbon atoms of the aliphatic group is preferably from 1 to 20, more preferably from 1 to 15, and most preferably from 1 to 10. It is preferred that the aliphatic group is a saturated aliphatic group rather than an unsaturated aliphatic group. The aliphatic group may have a substituent. Examples of the substituent include a halogen atom, a hydroxy group, an aromatic group and a heterocyclic group.

The number of carbon atoms of the aromatic group is preferably from 6 to 20, more preferably from 6 to 15, and most preferably from 6 to 10. The aromatic group may have a substituent. Examples of the substituent include a halogen atom, a hydroxy group, an aliphatic group, an aromatic group and a heterocyclic group.

It is preferred that the heterocyclic group has a 5-membered or 6-membered ring as the hetero ring. Other heterocyclic ring, an aliphatic ring or an aromatic ring may be condensed to the heterocyclic ring. The heterocyclic group may have a substituent. Examples of the substituent include a halogen atom, a hydroxy group, an oxo group (═O), a thioxo group (═S), an imino group (═NH), a substituted imino group (═N—R, wherein R represents an aliphatic group, an aromatic group or a heterocyclic group), an aliphatic group, an aromatic group and a heterocyclic group.

It is preferred that L represents a divalent connecting group containing a plurality of polyoxyalkylene structures. It is more preferred that the polyoxyalkylene structure is a polyoxyethylene structure. Specifically, it is preferred that L contains —$(OCH_2CH_2)_n$— (wherein n is an integer of 2 or more).

In the formula (VII) or (VIII), Z represents a functional group adsorbing to the hydrophilic surface of support. In the formula (VIII), Y represents a carbon atom or a nitrogen atom. In the case where Y is a nitrogen atom and L is connected to Y to form a quaternary pyridinium group, Z is not mandatory, because the quaternary pyridinium group itself exhibits the adsorptivity. The adsorptive functional group is the same as that described above.

Representative examples of the monomer represented by formula (VII) or (VIII) are set forth below.

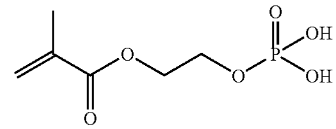
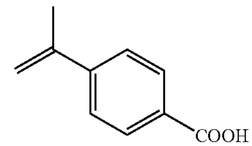
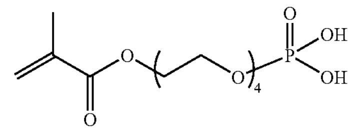
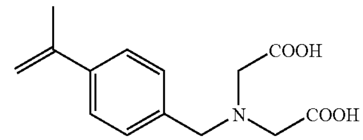
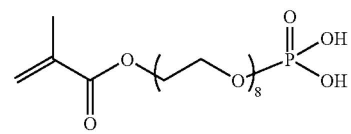
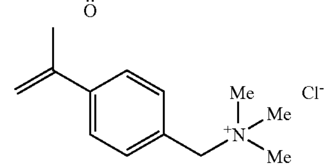
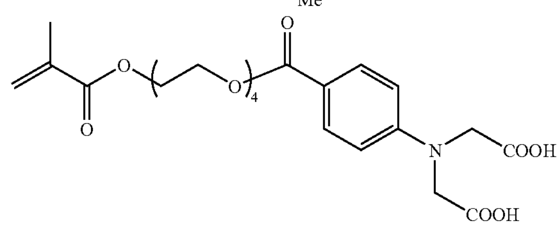
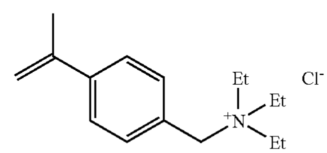
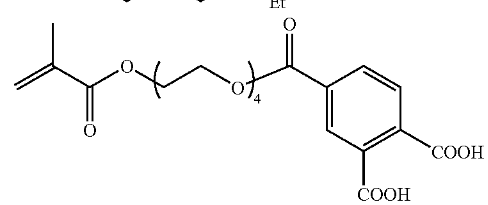
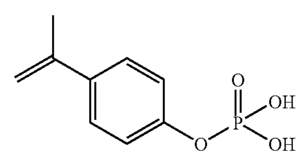
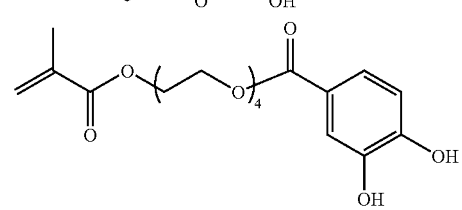

-continued

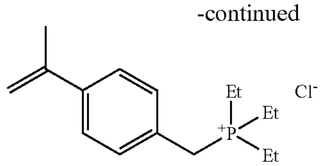

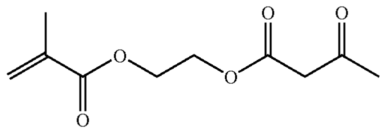

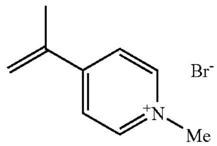

The hydrophilic group in the polymer resin for undercoat layer which can be used in the invention includes, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfonic acid group and a phosphoric acid group. A monomer containing such a hydrophilic group and a polymerizable group is employed as a copolymerization component of the polymer resin for undercoat layer.

According to the invention, the functional group capable of interacting with the surface of support undergoes interaction with the surface of support to contribute improvement in the adhesion property between the polymer resin for undercoat layer and the support. When the functional group capable of interacting with the surface of support also exhibits high hydrophilicity in the unexposed area after the removal of the photosensitive layer with development to contribute stain resistance in the unexposed area, the polymer resin for undercoat layer only having the functional group capable of interacting with the surface of support is used and the hydrophilic group having a structure different from the functional group can be omitted. Further, when the hydrophilic group also has a function as the functional group capable of interacting with the surface of support in addition to the above-described function, the polymer resin for undercoat layer only having the hydrophilic group is used and the functional group capable of interacting with the surface of support having a structure different from the hydrophilic group can be omitted.

The polymer resin for undercoat layer which can be used in the invention preferably includes a crosslinkable group. By the crosslinkable group, increase in adhesion to the image area can be achieved. In order to impart the crosslinkable property to the polymer resin for the undercoat layer, introduction of a crosslinkable functional group, for example, an ethylenically unsaturated bond group into the side chain of the polymer resin, or introduction by formation of a salt structure between a polar substituent of the polymer resin and a compound containing a substituent having a counter charge to the polar substituent of the polymer resin and an ethylenically unsaturated bond group is carried out.

Examples of the polymer having an ethylenically unsaturated bond group in the side chain thereof include a polymer of an ester or amide of acrylic acid or methacrylic acid, which is a polymer wherein the ester or amide residue (R in —COOR or —CONHR) has an ethylenically unsaturated bond group.

Examples of the residue (R described above) having an ethylenically unsaturated bond group include $-(CH_2)_nCR_1{=}CR_2R_3$, $-(CH_2O)_nCH_2CR_1{=}CR_2R_3$, $-(CH_2CH_2O)_nCH_2CR_1{=}CR_2R_3$, $-(CH_2)_nNH-CO-O-CH_2CR_1{=}CCR_2R_3$, $-(CH_2)_n-O-CO-CR_1{=}CCR_2R_3$ and $-(CH_2CH_2O)_2-X$ (wherein $R_1$ to $R_3$ each independently represents a hydrogen atom, a halogen atom or an alkyl group having from 1 to 20 carbon atoms, an aryl group, alkoxy group or aryloxy group, or $R_1$ and $R_2$ or $R_1$ and $R_3$ may be combined with each other to form a ring. n represents an integer of 1 to 10. X represents a dicyclopentadienyl residue).

Specific examples of the ester residue include $-CH_2CH{=}CH_2$ (described in JP-B-7-21633) $-CH_2CH_2O-CH_2CH{=}CH_2$, $-CH_2C(CH_3){=}CH_2$, $-CH_2CH{=}CH-C_6H_5$, $-CH_2CH_2OCOCH{=}CH-C_6H_5$, $-CH_2CH_2NHCOO-CH_2CH{=}CH_2$ and $-CH_2CH_2O-X$ (wherein X represents a dicyclopentadienyl residue).

Specific examples of the amide residue include $-CH_2CH{=}CH_2$, $-CH_2CH_2O-Y$ (wherein Y represents a cyclohexene residue) and $-CH_2CH_2-OCO-CH{=}CH_2$.

As the monomer having a crosslinkable group for the polymer resin for the undercoat layer, an ester or amide of acrylic acid or methacrylic acid having the above-described crosslinkable group is preferable.

A content of the crosslinking group (content of the radical polymerizable unsaturated double bond determined by iodine titration) in the polymer resin for undercoat layer is preferably from 0.1 to 10.0 mmol, more preferably from 1.0 to 7.0 mmol, most preferably from 2.0 to 5.5 mmol, based on 1 g of the polymer resin. In the above-described range, preferable compatibility between the good sensitivity and good stain resistance and good preservation stability can be achieved.

A weight average molecular weight of the polymer resin for undercoat layer is preferably 5,000 or more, more preferably from 10,000 to 300,000. A number average molecular weight of the polymer resin for undercoat layer is preferably 1,000 or more, more preferably from 2,000 to 250,000. The polydispersity (weight average molecular weight/number average molecular weight) thereof is preferably from 1.1 to 10.

The polymer resin for undercoat layer may be any of a random polymer, a block polymer and a graft polymer, and it is preferably a random polymer.

As the polymer resin for undercoat layer, a polymer resin including a repeating unit represented by formula (I) shown below is preferable. This polymer resin for undercoat layer is also referred to as a specific copolymer, hereinafter.

$$-(A_1)_x-(A_2)_y- \qquad (I)$$

In formula (I), $A_1$ represents a repeating unit having at least one ethylenically unsaturated bond group, $A_2$ represents a repeating unit having at least one functional group capable of interacting with the surface of support. x and y each represents a copolymerization ratio.

In formula (I), the repeating unit represented by formula $A_1$ is preferably represented by the following formula (A1):

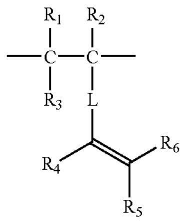

(A1)

In formula (A1), $R_1$ to $R_3$ each independently represents a hydrogen atom, an alkyl group having from 1 to 6 carbon atoms or a halogen atom. $R_4$ to $R_6$ each independently represents a hydrogen atom, an alkyl group having from 1 to 6 carbon atoms, a halogen atom, an acyl group or an acyloxy group. Alternatively, $R_4$ and $R_5$ or $R_5$ and $R_6$ may be combined with each other to form a ring. L represents a divalent connecting group selected from —CO—, —O—, —NH—, a divalent aliphatic group, a divalent aromatic group and a combination thereof.

Specific examples of the combination of groups represented by L are set forth below. In each of the specific examples shown below, the left side connects to the main chain and the right side connects to the ethylenic unsaturated bond group.

L1: —CO—NH-divalent aliphatic group-O—CO—

L2: —CO-divalent aliphatic group-O—CO—

L3: —CO—O-divalent aliphatic group-O—CO—

L4: —divalent aliphatic group-O—CO—

L5: —CO—NH-divalent aromatic group-O—CO—

L6: —CO-divalent aromatic group-O—CO—

L7: —divalent aromatic group-O—CO—

L8: —CO—O-divalent aliphatic group-CO—O-divalent aliphatic group-O—CO—

L9: —CO—O-divalent aliphatic group-O—CO-divalent aliphatic group-O—CO—

L10: —CO—O-divalent aromatic group-CO—O-divalent aliphatic group-O—CO—

L11: —CO—O-divalent aromatic group-O—CO-divalent aliphatic group-O—CO—

L12: —CO—O-divalent aliphatic group-CO—O-divalent aromatic group-O—CO—

L13: —CO—O-divalent aliphatic group-O—CO-divalent aromatic group-O—CO—

L14: —CO—O-divalent aromatic group-CO—O-divalent aromatic group-O—CO—

L15: —CO—O-divalent aromatic group-O—CO-divalent aromatic group-O—CO—

L16: —CO—O-divalent aromatic group-O—CO—NH-divalent aliphatic group-O—CO—

L17: —CO—O-divalent aliphatic group-O—CO—NH-divalent aliphatic group-O—CO—

The divalent aliphatic group includes an alkylene group, a substituted alkylene group, an alkenylene group, a substituted alkenylene group, an alkinylene group, a substituted alkinylene group and a polyalkyleneoxy group. Among them, an alkylene group, a substituted alkylene group, an alkenylene group and a substituted alkenylene group are preferable, and an alkylene group and a substituted alkylene group are more preferable.

Of the divalent aliphatic groups, a chain structure is preferable than a cyclic structure, and further a straight chain structure is more preferable than a branched chain structure.

A number of carbon atoms included in the divalent aliphatic group is preferably from 1 to 20, more preferably from 1 to 15, still more preferably from 1 to 12, yet still more preferably from 1 to 10, and most preferably from 1 to 8.

Examples of the substituent for the divalent aliphatic group include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

The divalent aromatic group includes an arylene group and a substituted arylene group. It preferably includes a phenylene group, a substituted phenylene group, a naphthylene group and a substituted naphthylene group.

Examples of the substituent for the divalent aromatic group include an alkyl group in addition to the substituents described for the divalent aliphatic group described above.

Of L1 to L17 described above, L1, L3, L5, L7 and L17 are preferable.

In formula (I), the repeating unit represented by formula $A_2$ is specifically represented by the following formula (A2):

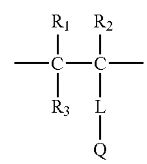

(A2)

In formula (A2), $R_1$ to $R_3$ and L have the same meanings as those defined in formula (A1), respectively. Q represents a functional group (hereinafter, also referred to as a "specific functional group") capable of interacting with the surface of support.

As the specific functional group, for example, a group capable of undergoing interaction, for example, forming a covalent bond, an ionic bond or a hydrogen bond or undergoing polar interaction or van der Waals interaction, with metal, metal oxide, hydroxy group or the like present on the support is exemplified.

Specific examples of the specific functional group are set forth below.

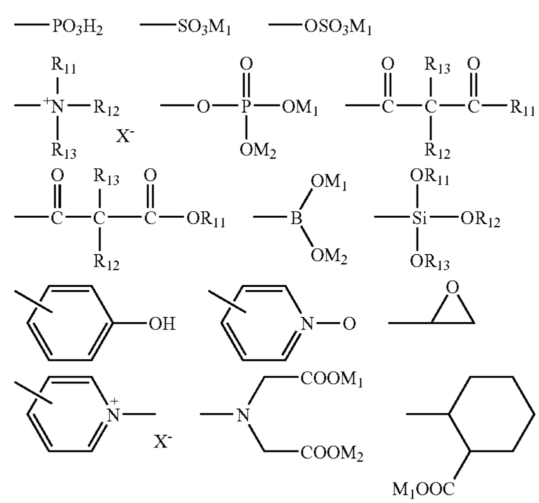

-continued

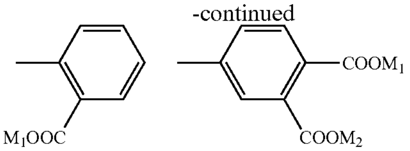

In the above-formulae, $R_{11}$, to $R_{13}$ each independently represents a hydrogen atom, an alkyl group, an aryl group, an alkynyl group or an alkenyl group; $M_1$ and $M_2$ each independently represents a hydrogen atom, a metal atom or an ammonium group; and $X^-$ represents a counter anion.

Of the specific functional groups, an onium salt group, for example, an ammonium group or a pyridinium group, a phosphoric ester group, a phosphonic acid group, a boric acid group or a β-diketone group, for example, an acetylacetone group is preferable.

In formula (A2), L represents a divalent connecting group selected from —CO—, —O—, —NH—, a divalent aliphatic group, a divalent aromatic group and a combination thereof.

Specific examples of the combination of groups represented by L include the following groups in addition to the specific examples set forth for L in formula (A1). In each of the specific examples shown below, the left side connects to the main chain.

L18: —CO—NH—

L19: —CO—O—

L20: —divalent aromatic group—

The repeating unit represented by formula (A2) may contain a hydrophilic group. When the repeating unit represented by formula (A2) does not contain a hydrophilic group or when the functional group capable of interacting with the surface of support does not have a function as a hydrophilic group, it is preferred that the above-described copolymer for use in the invention further contains a repeating unit represented by formula (A3) shown below as a copolymerization component.

(A3)

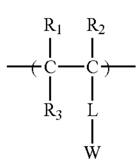

In formula (A3), $R_1$ to $R_3$ and L have the same meanings as those defined in formula (A1), respectively. W represents a group shown below.

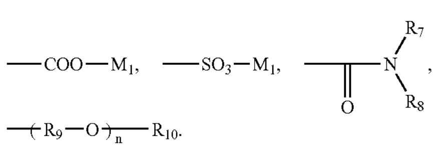

In the formulae, $M_1$ has the same meaning as that defined with respect to formula (A2) above. $R_7$ and $R_8$ each independently represents a hydrogen atom or a straight chin or branched alkyl group having from 1 to 6 carbon atoms. $R_9$ represents a straight chin or branched alkylene group having from 1 to 6 carbon atoms, and preferably an ethylene group. $R_{10}$ represents a hydrogen atom or an alkyl group having from 1 to 12 carbon atoms. n represents an integer of 1 to 100, and preferably an integer of 1 to 30.

The repeating unit having at least one hydroxy group represented by formula (A3) preferably has log P of −3 to 3, more preferably from −1 to 2. In the above described range, preferable development property is achieved.

The term "log P" as used herein means a logarithm of octanol/water partition coefficient (P) of a compound calculated using software PC Models developed by Medicinal Chemistry Project, Pomona College, Claremont, Calif. and available from Daylight Chemical Information Systems, Inc.

As W above, the group containing an alkylene oxy group is preferable.

With respect to a molecular weight of the specific copolymer, a range of 10,000 to 300,000 is preferable and a range of 50,000 to 200,000 is more preferable, in terms of a weight average molecular weight. The content of the repeating unit represented by (A1) is preferably from 5 to 80% by mole, more from 10 to 50% by mole, based on the total copolymerization monomers. The content of the repeating unit represented by (A2) is preferably from 5 to 80% by mole, more from 10 to 50% by mole, based on the total copolymerization monomers. The content of the repeating unit represented by (A3) is preferably from 5 to 80% by mole, more from 10 to 50% by mole, based on the total copolymerization monomers.

Specific examples of the specific copolymer for use in the invention are set forth below, but the invention should not be construed as being limited thereto.

1

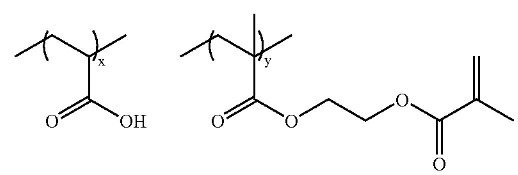

2

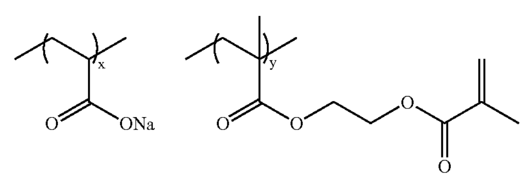

3

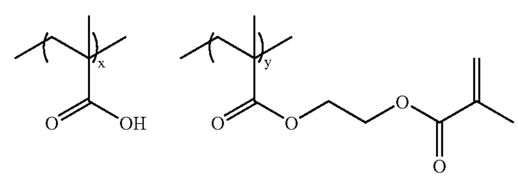

4

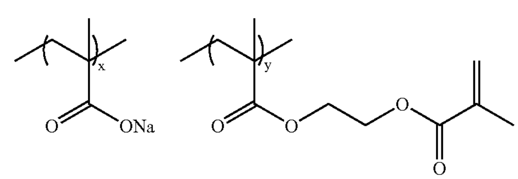

-continued
5
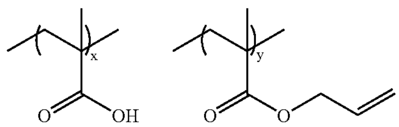
6
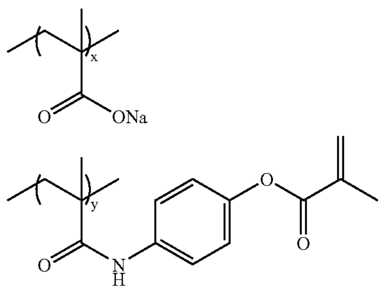
7
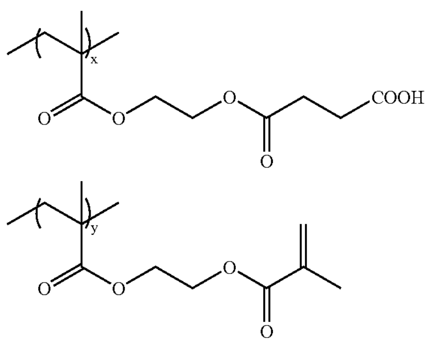
8
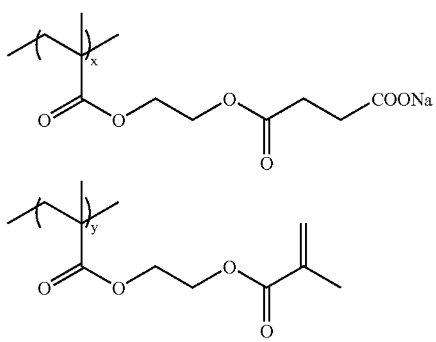
9
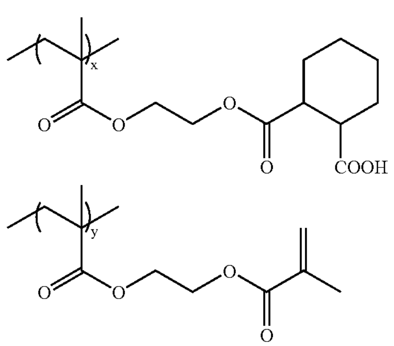
10
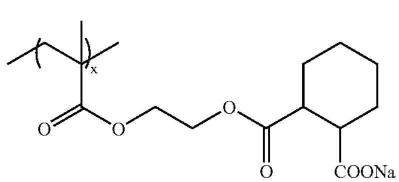
-continued
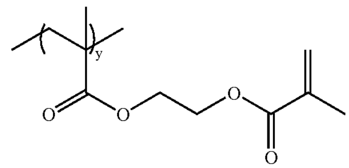
11
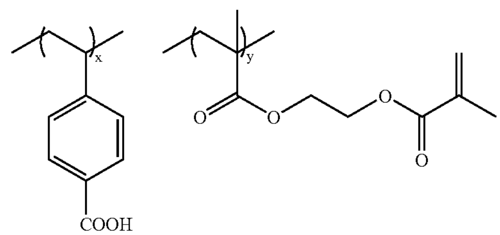
12
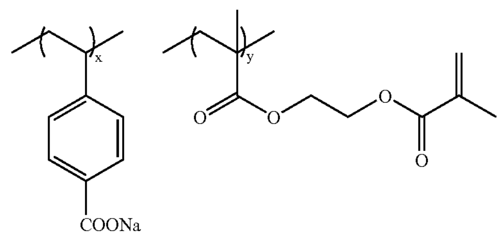
13
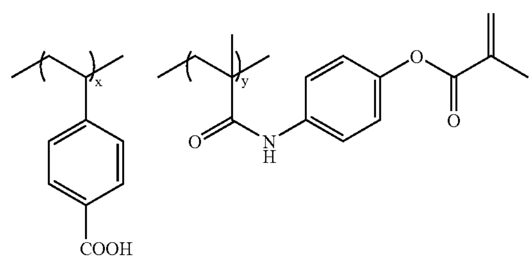
14
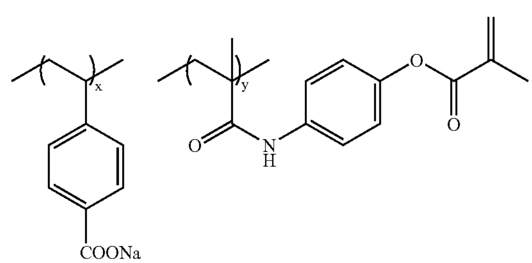
15
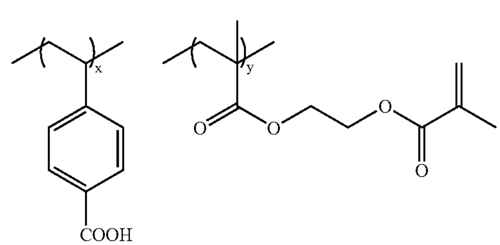
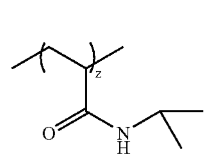

-continued
16
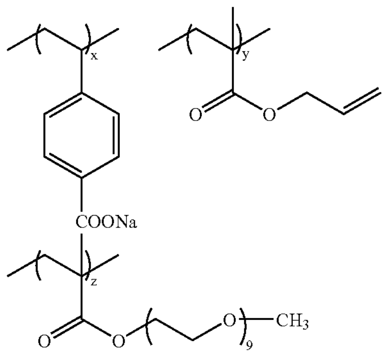
17
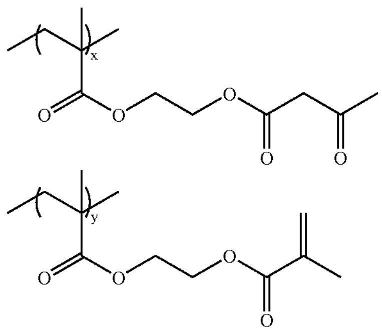
18
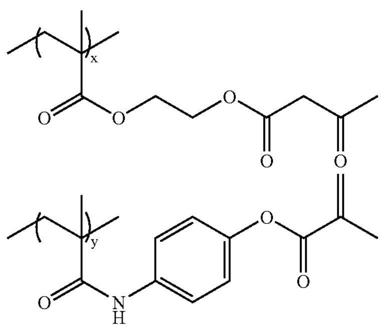
19
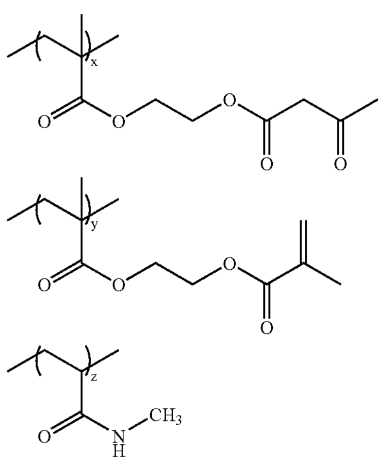
20
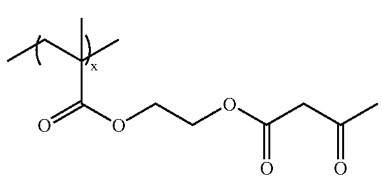
-continued
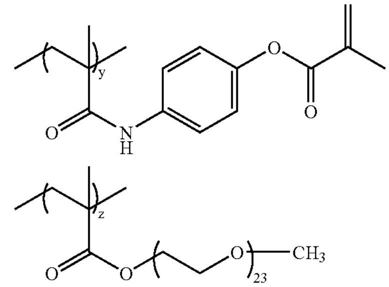
21
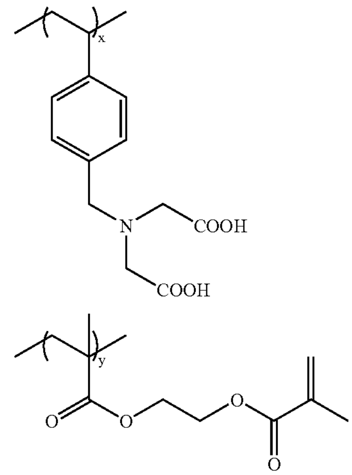
22
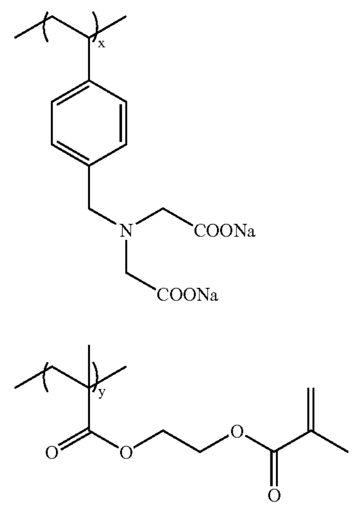
23
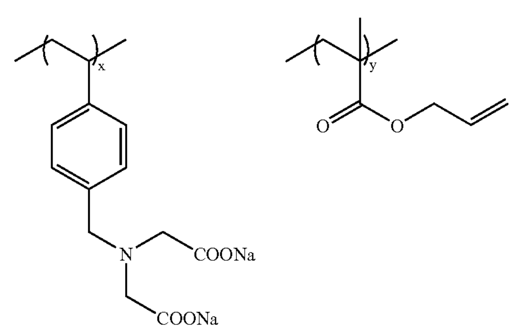

-continued
24
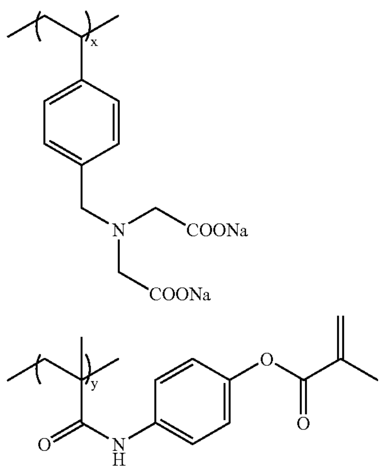
25
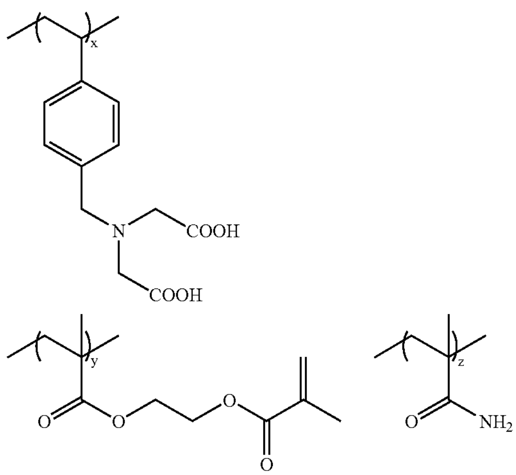
26
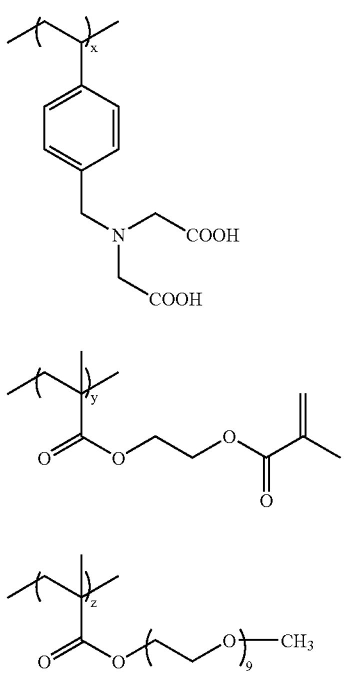
-continued
27
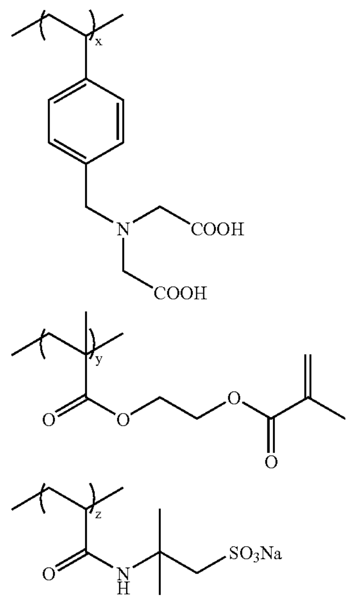
28
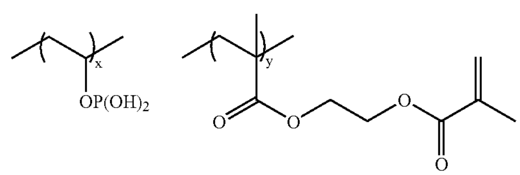
29
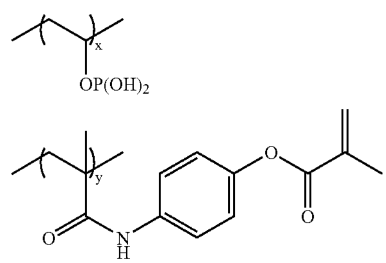
30
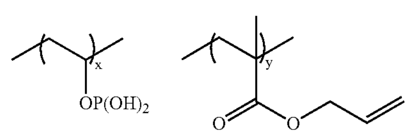
31
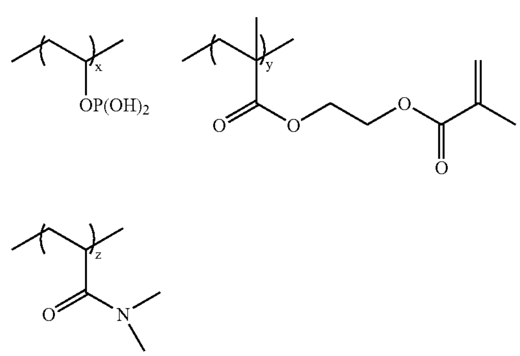

-continued
32
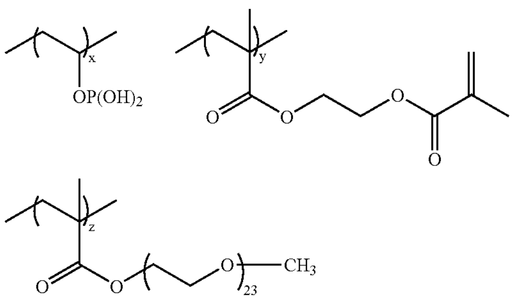
33
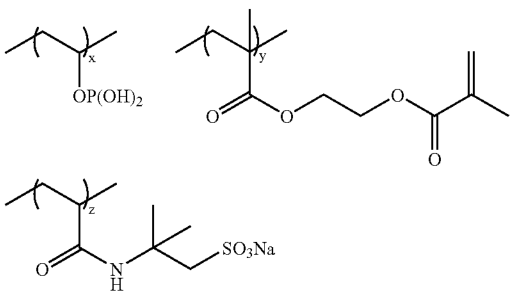
34
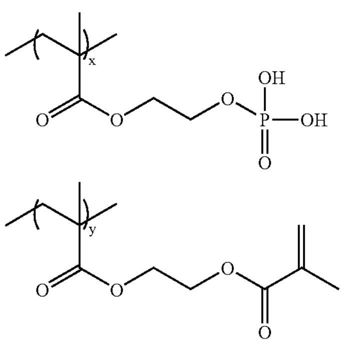
35
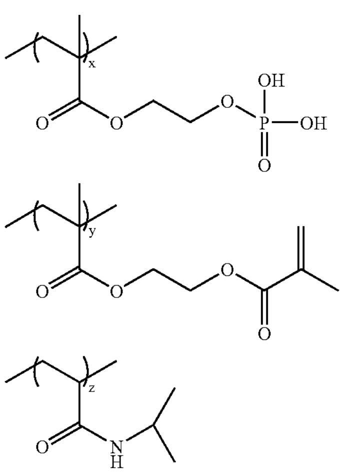
36
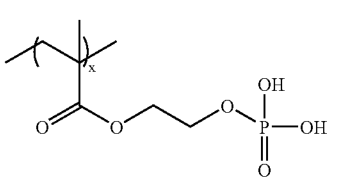
-continued
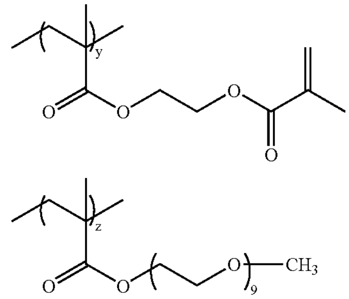
37
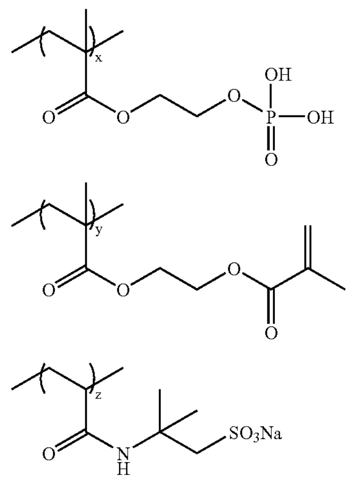
38
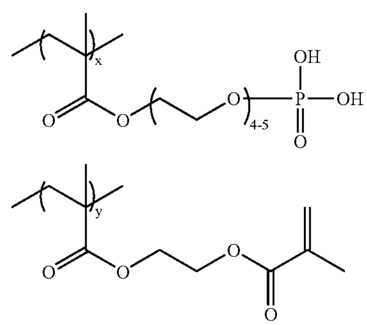
39
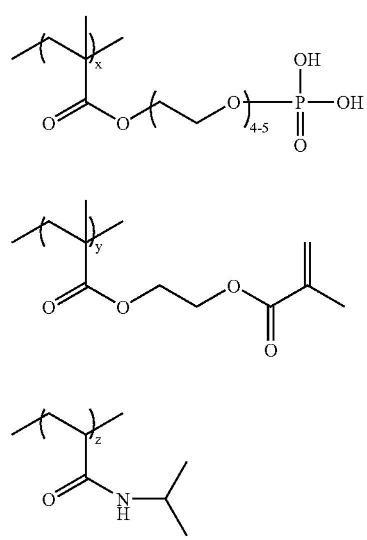

-continued
40
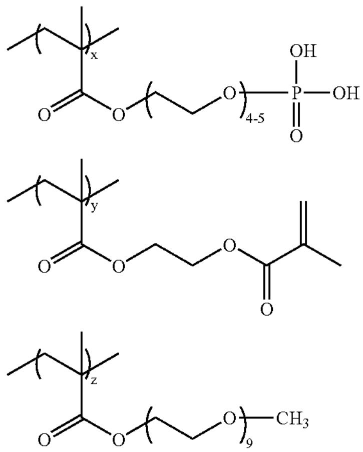
41
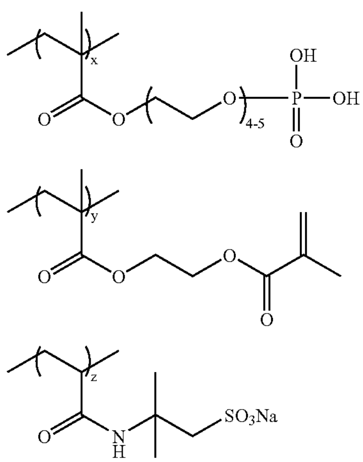
42
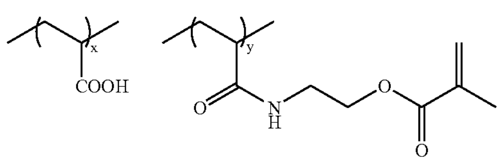
43
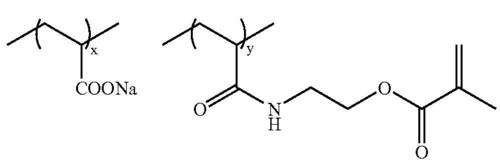
44
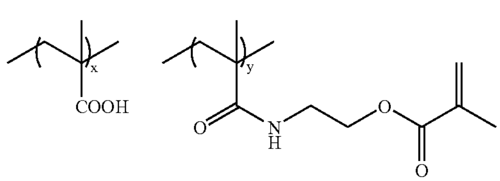
45
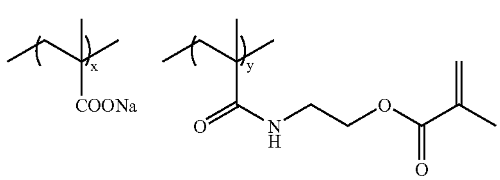
-continued
46
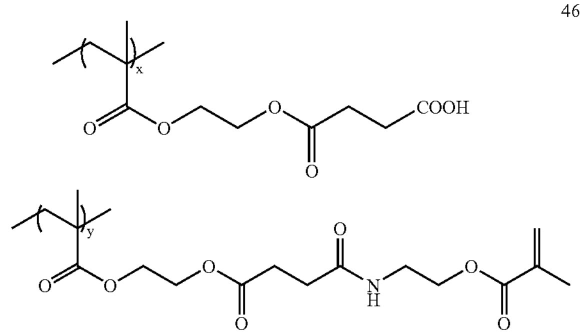
47
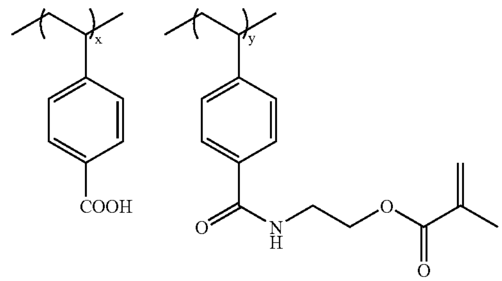
48
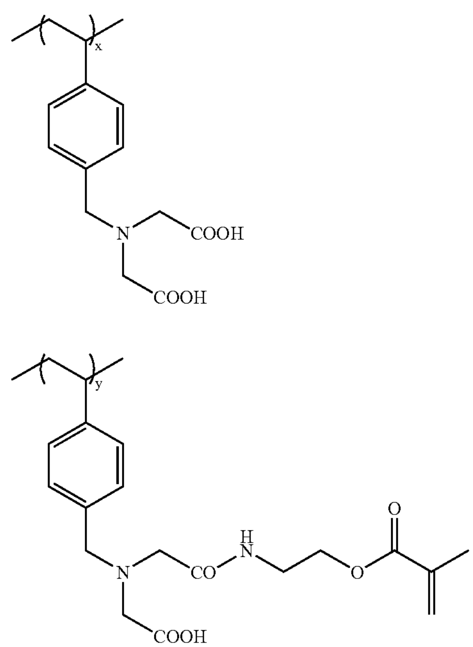
49
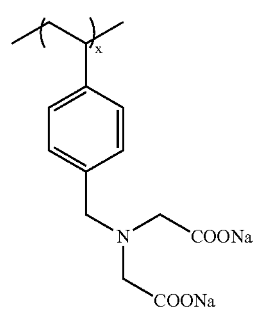

-continued
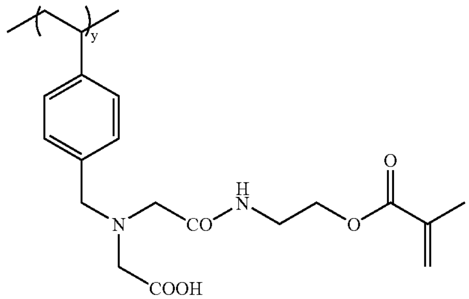
50
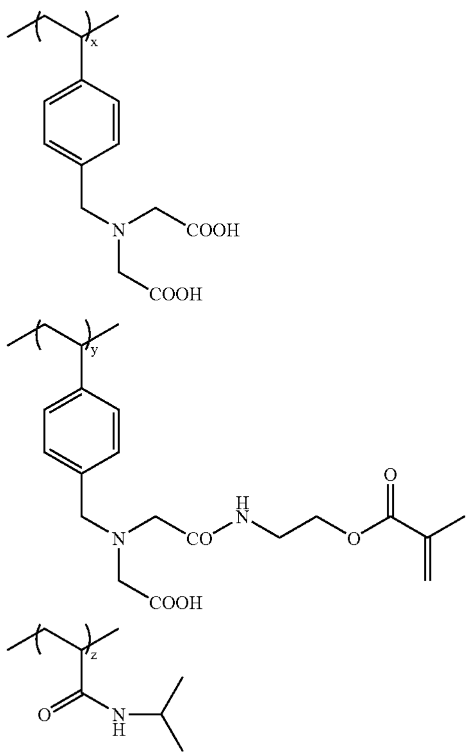
51
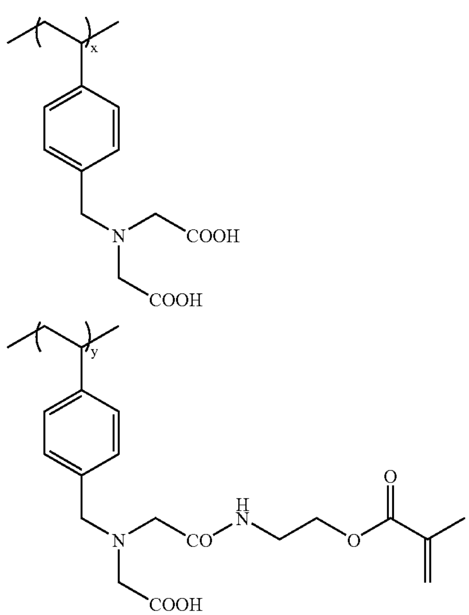
-continued
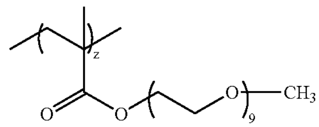
52
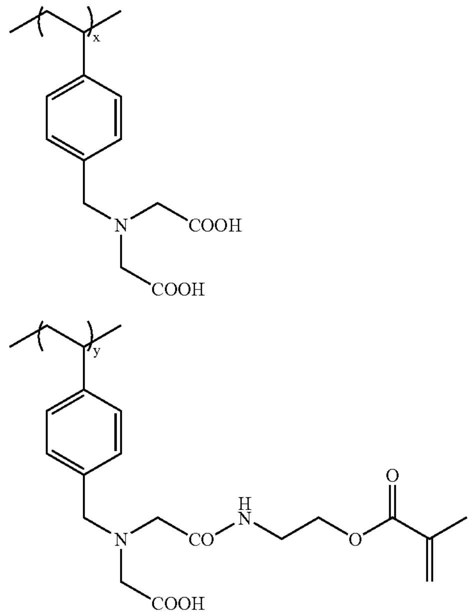
53
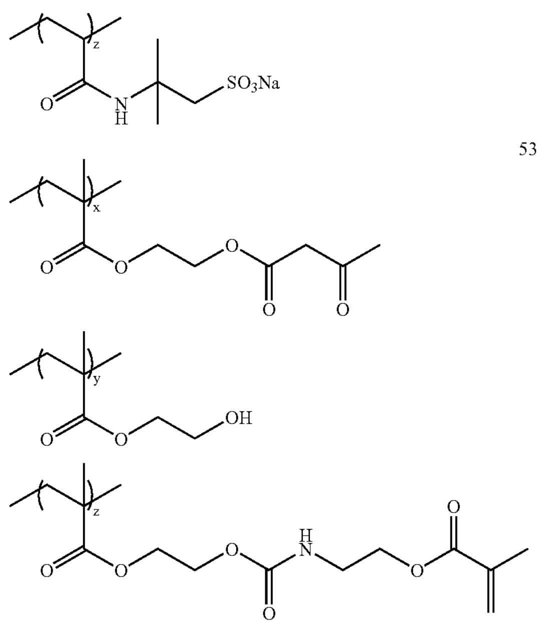
54
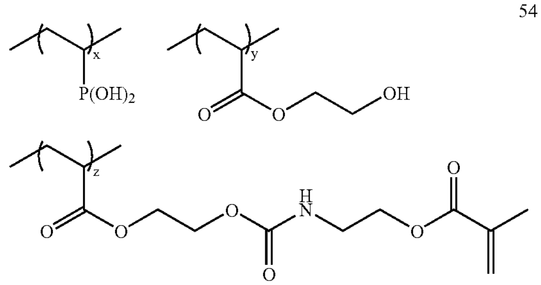

-continued
55
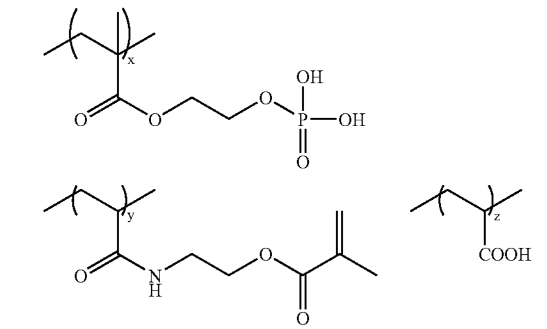
56
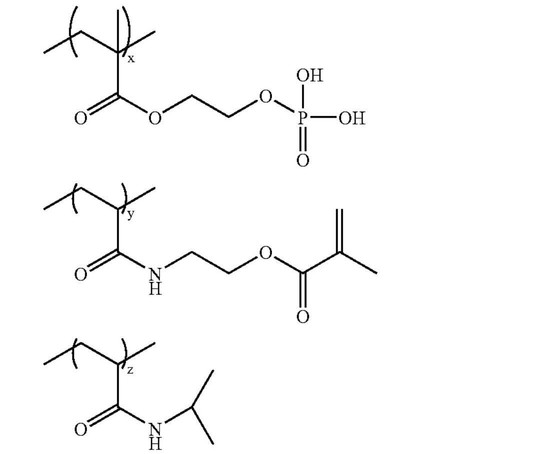
57
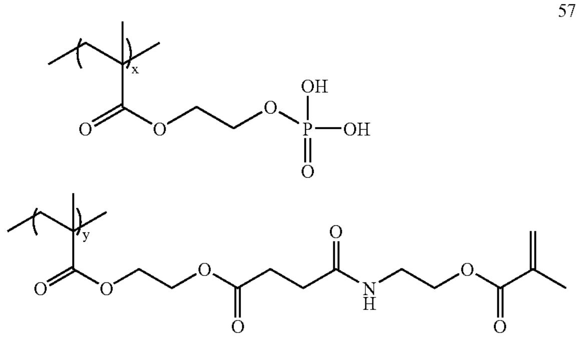
58
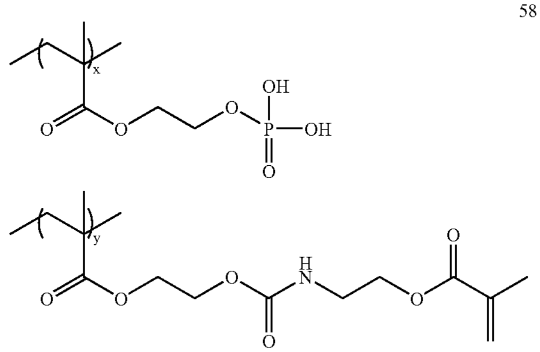
59
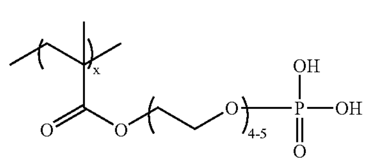
-continued
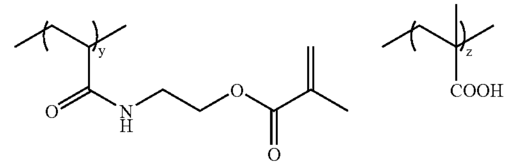
60
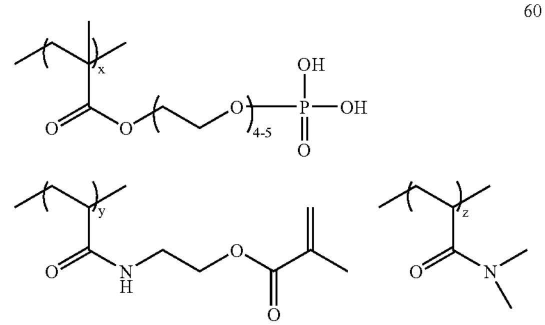
61
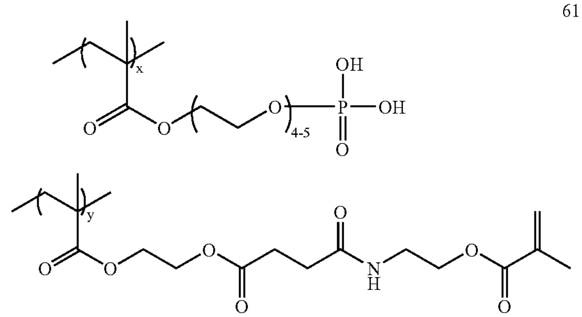
62
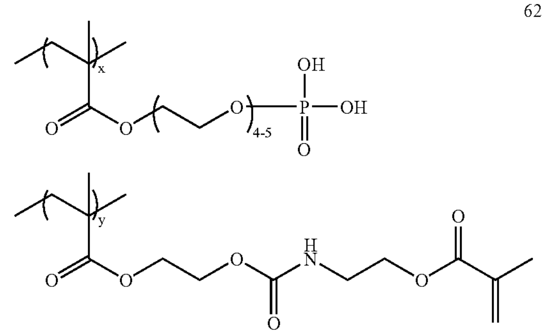
63
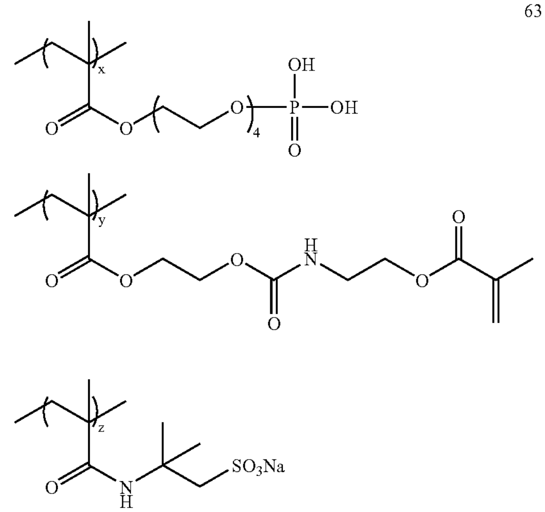

-continued
64
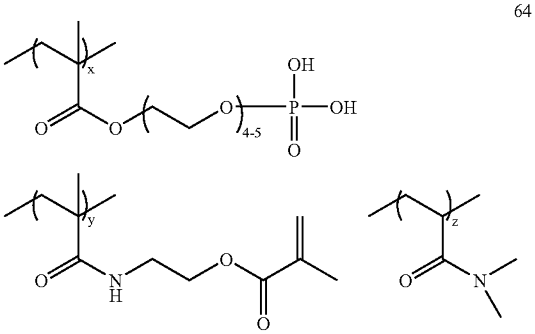
65
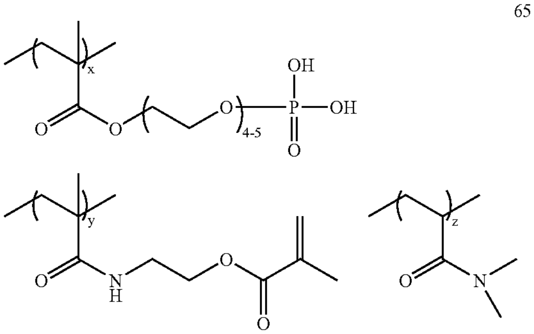
66
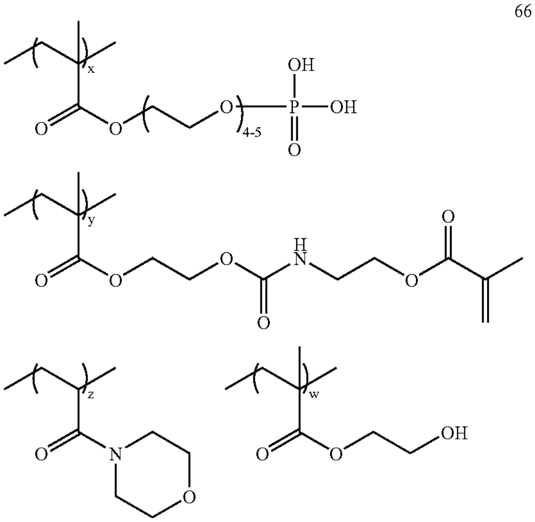
67
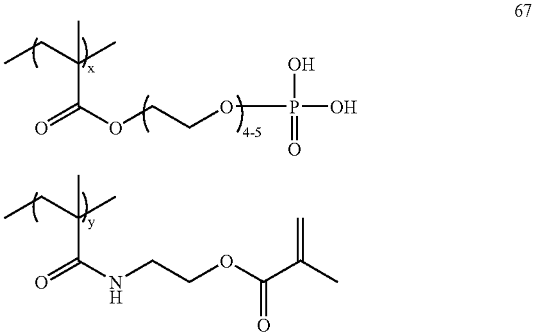
-continued
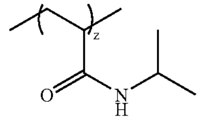
68
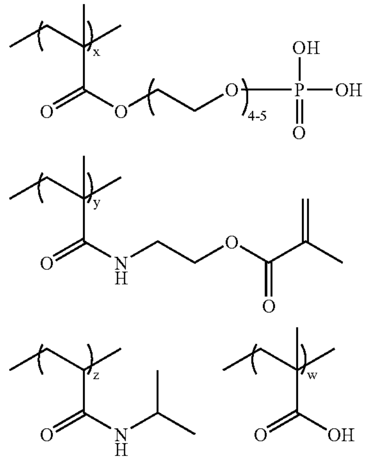
69
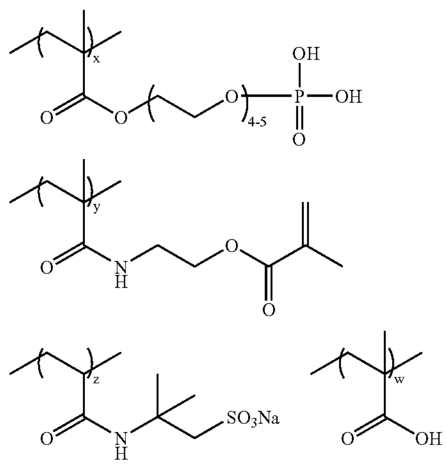
70
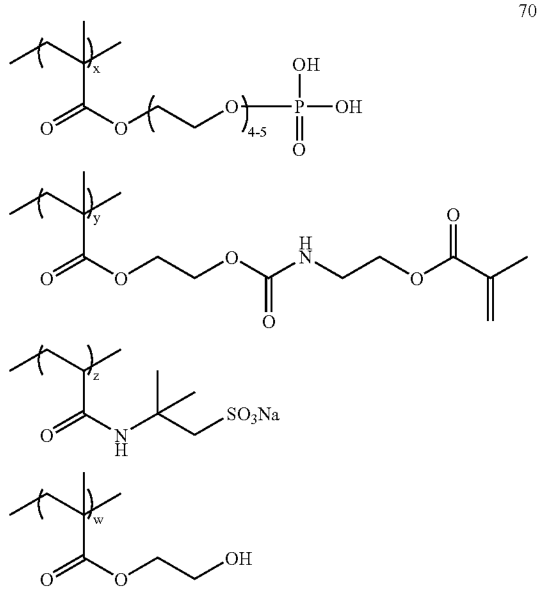

-continued

71

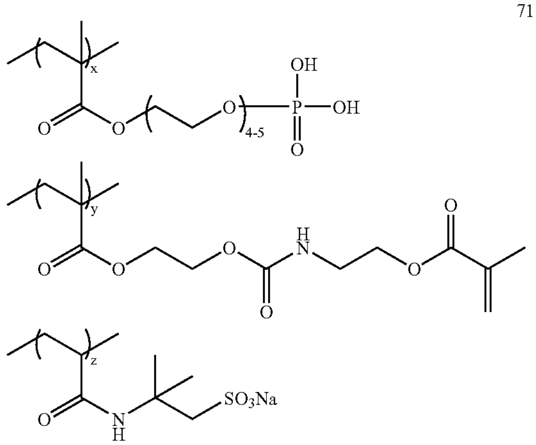

72

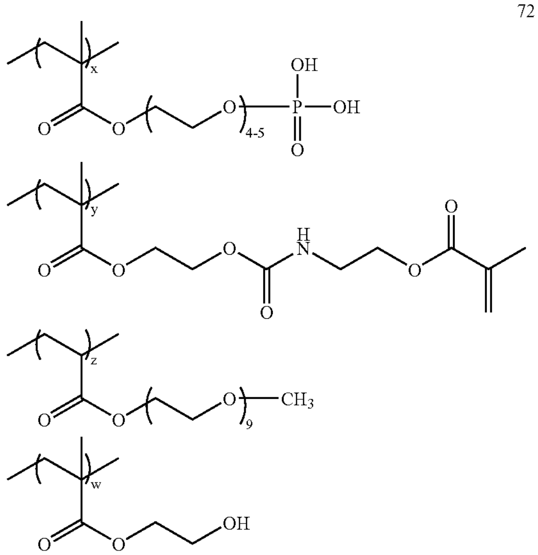

As the polymer resin for undercoat layer, known resins having a hydrophilic group can also be used. Specific examples of the resin include gum arabic, casein, gelatin, a starch derivative, carboxy methyl cellulose and a sodium salt thereof, cellulose acetate, sodium alginate, vinyl acetate-maleic acid copolymer, styrene-maleic acid copolymer, polyacrylic acid and a salt thereof, polymethacrylic acid and a salt thereof, a homopolymer or copolymer of hydroxyethyl methacrylate, a homopolymer or copolymer of hydroxyethyl acrylate, a homopolymer or copolymer of hydroxypropyl methacrylate, a homopolymer or copolymer of hydroxypropyl acrylate, a homopolymer or copolymer of hydroxybutyl methacrylate, a homopolymer or copolymer of hydroxybutyl acrylate, a polyethylene glycol, a hydroxypropylene polymer, a polyvinyl alcohol, a hydrolyzed polyvinyl acetate having a hydrolysis degree of 60% by mole or more, preferably 80% by mole or more, a polyvinyl formal, a polyvinyl butyral, polyvinyl pyrrolidone, a homopolymer or copolymer of acrylamide, a homopolymer or polymer of methacrylamide, a homopolymer or copolymer of N-methylolacrylamide, polyvinyl pyrrolidone, an alcohol-soluble nylon, a polyether of 2,2-bis-(4-hydroxyphenyl)propane and epichlorohydrin.

The polymer resins for undercoat layer may be used individually or as a mixture of two or more thereof.

In the undercoat layer according to the invention, it is preferred to use the polymer resin for undercoat layer together with a compound having a weight average molecular weight in a range of 100 to 10,000 and containing an ethylenically unsaturated bond group and a functional group capable of interacting with the surface of support. In this case, the weight average molecular weight of the polymer resin for undercoat layer used should be larger than that of the compound. The compound used together is also referred to as a compound (A) hereinafter.

The compound (A) is preferably represented by the following formula (I) or (II):

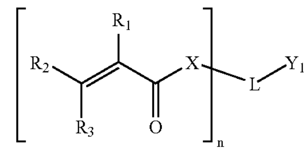

(I)

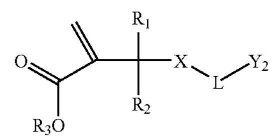

(II)

In formulae (I) and (II), $R^1$, $R^2$ and $R^3$ each independently represents a hydrogen atom, halogen atom or an alkyl group having from 1 to 6 carbon atoms; X represents an oxygen atom, a sulfur atom or an imino group; L represents a n+1 valent connecting group; n represents 1, 2 or 3; and $Y_1$ and $Y_2$ each represents a functional group adsorbing to a support.

In formulae (I) or (II), X is preferably an oxygen atom.

In formulae (I) or (II), when L represents a divalent connecting group, the divalent connecting group is preferably a divalent aliphatic group (for example, an alkylene group, a substituted alkylene group, an alkenylene group, a substituted alkenylene group, an alkinylene group or a substituted alkinylene group), a divalent aromatic group (for example, an arylene group or a substituted arylene group), a divalent heterocyclic group or a combination of each of the groups described above with an oxygen atom (—O—), a sulfur atom (—S—), an imino group (—NH—), a substituted imino group (—NR—, wherein R represents an aliphatic group, an aromatic group or a heterocyclic group) or a carbonyl group (—CO—).

When L represents a trivalent or tetravalent connecting group, the trivalent or tetravalent connecting group includes a trivalent or tetravalent aliphatic group, a trivalent or tetravalent aromatic group and a trivalent or tetravalent heterocyclic group.

The aliphatic group may form a cyclic structure or a branched structure. The number of carbon atoms of the aliphatic group is preferably from 1 to 20, more preferably from 1 to 15, and most preferably from 1 to 10. It is preferred that the aliphatic group is a saturated aliphatic group rather than an unsaturated aliphatic group. The aliphatic group may have a substituent. Examples of the substituent include a halogen atom, a hydroxy group, an aromatic group and a heterocyclic group.

The number of carbon atoms of the aromatic group is preferably from 6 to 20, more preferably from 6 to 15, and most preferably from 6 to 10. The aromatic group may have a substituent. Examples of the substituent include a halogen atom, a hydroxy group, an aliphatic group, an aromatic group and a heterocyclic group.

It is preferred that the heterocyclic group has a 5-membered or 6-membered ring as the hetero ring. Other heterocyclic ring, an aliphatic ring or an aromatic ring may be condensed to the heterocyclic ring. The heterocyclic group may have a substituent. Examples of the substituent include a halogen atom, a hydroxy group, an oxo group (═O), a thioxo group (═S), an imino group (═NH), a substituted imino group (═N—R, wherein R represents an aliphatic group, an aromatic group or a heterocyclic group), an aliphatic group, an aromatic group and a heterocyclic group.

It is preferred that L represents a divalent connecting group containing a plurality of polyoxyalkylene structures. It is more preferred that the polyoxyalkylene structure is a polyoxyethylene structure. Specifically, it is preferred that L contains $—(OCH_2CH_2)_n—$. n is preferably from 1 to 50, more preferably from 1 to 20.

In the formulae (I) and (II), $Y_1$ and $Y_2$ each represents an adsorbing group. The adsorpbing group is the same as that described above.

Specific examples of the compound represented by formula (I) include commercially available products set forth below, but the invention should not be construed as being limited thereto.

$$CH_2{=}C(CH_3)COO(C_2H_4O)_nP{=}O(OH)_2 \quad [A]$$

n=1: Phosmer M produced by Unichemical Co., Ltd.; Kayamer PM-1 produced by Nippon Kayaku Co., Ltd.; Light-Ester P-M produced by Kyoeisha Chemical Co., Ltd.; NK Ester SA produced by Shin-Nakamura Chemical Co., Ltd.; n=2: Phosmer PE2 produced by Unichemical Co., Ltd.; n=4-5: Phosmer PE produced by Unichemical Co., Ltd.; n=8: Phosmer PE8 produced by Unichemical Co., Ltd.

$$[CH_2{=}C(CH_3)COO(C_2H_4O)_n]_mP{=}O(OH)_{3-m} \quad [B]$$

Mixture of n=1, m=1 and 2: MR-200 produced by Daihachi Chemical Industry Co., Ltd.

$$CH_2{=}CHCOO(C_2H_4O)_nP{=}O(OH)_2 \quad [C]$$

n=1: Phosmer A produced by Unichemical Co., Ltd.; Light-Ester P-A produced by Kyoeisha Chemical Co., Ltd.

$$[CH_2{=}CHCOO(C_2H_4O)_n]_mP{=}O(OH)_{3-m} \quad [D]$$

Mixture of n=1, m=1 and 2: AR-200 produced by Daihachi Chemical Industry Co, Ltd.

$$CH_2{=}C(CH_3)COO(C_2H_4O)_nP{=}O(OC_4H_9)_2 \quad [E]$$

n=1: MR-204 produced by Daihachi Chemical Industry Co., Ltd.

$$CH_2{=}CHCOO(C_2H_4O)_nP{=}O(OC_4H_9)_2 \quad [F]$$

n=1: AR-204 produced by Daihachi Chemical Industry Co., Ltd.

$$CH_2{=}C(CH_3)COO(C_2H_4O)_nP{=}O(OC_8H_{17})_2 \quad [G]$$

n=1: MR-208 produced by Daihachi Chemical Industry Co., Ltd.

$$CH_2{=}CHCOO(C_2H_4O)_nP{=}O(OC_8H_{17})_2 \quad [H]$$

n=1: AR-208 produced by Daihachi Chemical Industry Co., Ltd.

$$CH_2{=}C(CH_3)COO(C_2H_4O)_nP{=}O(OH)(ONH_3C_2H_4OH) \quad [I]$$

n=1: Phosmer MH produced by Unichemical Co., Ltd.

$$CH_2{=}C(CH_3)COO(C_2H_4O)_nP{=}O(OH)(ONH(CH_3)_2C_2H_4OCOC(CH_3){=}CH_2) \quad [J]$$

n=1: Phosmer DM produced by Unichemical Co., Ltd.

$$CH_2{=}C(CH_3)COO(C_2H_4O)_nP{=}O(OH)(ONH(C_2H_5)_2C_2H_4OCOC(CH_3){=}CH_2) \quad [K]$$

n=1: Phosmer DE produced by Unichemical Co., Ltd.

$$CH_2{=}CHCOO(C_2H_4O)_nP{=}O(O\text{-}ph)_2 \text{ (ph represents a benzene ring)} \quad [L]$$

n=1: AR-260 produced by Daihachi Chemical Industry Co., Ltd.

$$CH_2{=}C(CH_3)COO(C_2H_4O)_nP{=}O(O\text{-}ph)_2 \text{ (ph represents a benzene ring)} \quad [M]$$

n=1: MR-260 produced by Daihachi Chemical Industry Co., Ltd.

$$[CH_2{=}CHCOO(C_2H_4O)_n]_2P{=}O(C_4H_9) \quad [N]$$

n=1: PS-A4 produced by Daihachi Chemical Industry Co., Ltd.

$$[CH_2{=}C(CH_3)COO(C_2H_4O)_n]_2P{=}O(OH) \quad [O]$$

n=1: MR-200 produced by Daihachi Chemical Industry Co., Ltd., Kayamer PM-2 produced by Nippon Kayaku Co., Ltd.; Kayamer PM-21 produced by Nippon Kayaku Co., Ltd.

$$[CH_2{=}CHCOO(C_2H_4O)_n]_3P{=}O \quad [P]$$

n=1: Viscote 3PA produced by Osaka Organic Chemical Industry Ltd.

These compounds can be synthesized by a dehydration reaction or ester exchange reaction between acrylic acid or methacrylic acid and a phosphorus compound in the same manner as conventional acrylic monomers as described, for example, in *Jikken Kagaku Koza* (*Courses in Experimental Chemistry*) or Kiyomi Kato, *Shigaisen Koka System* (*Ultraviolet Ray Irradiation System*). The phosphorus compound may be a mixture of phosphorus compounds at an appropriate ratio. With respect to the number (n) of ethylene oxide chain in formulae described above, as the number (n) increases, it becomes difficult to synthesis a pure product and the product is obtained as a mixture of the compounds having different numbers around the number (n). Specifically, the number (n) is 0, 1, 2, about 4 to 5, about 5 to 6, about 7 to 9, about 14, about 23, about 40 or about 50, but the invention should not be construed as being limited thereto.

Specific examples of the compound represented by formula (II) are set forth below.

(1)
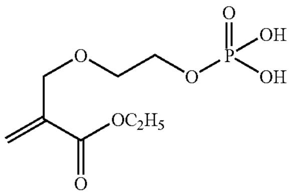
(2)
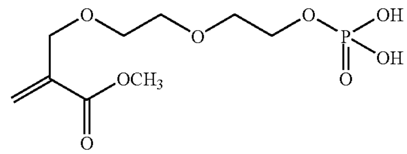
(3)
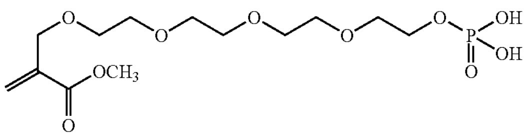
(4)
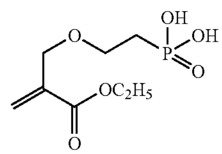
(5)
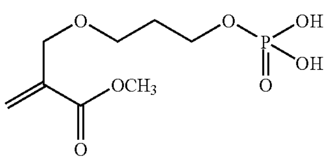
(6)
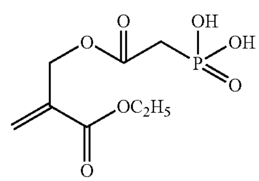
(7)
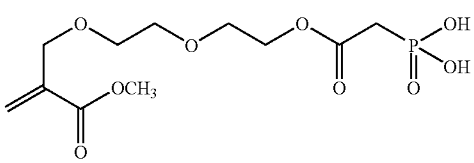
(8)
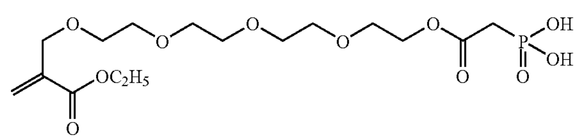
(9)
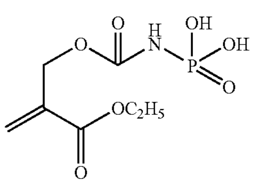
(10)
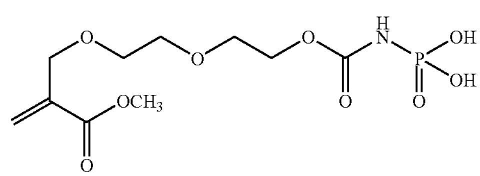
(11)
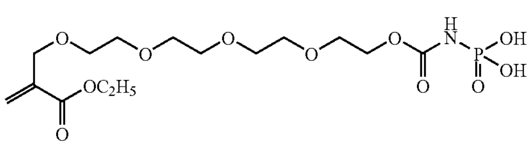
(12)
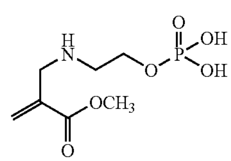
(13)
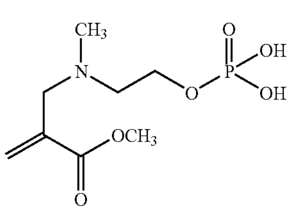
(14)
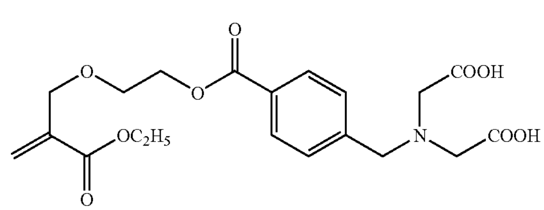
(15)
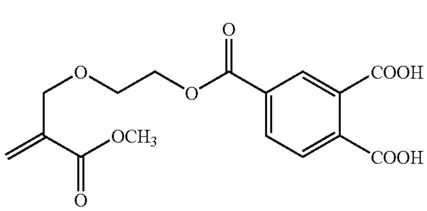

-continued
(16)
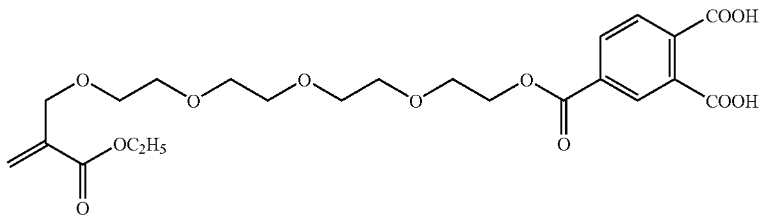
(17)
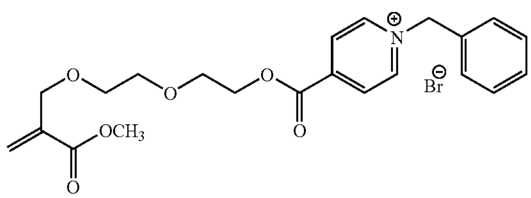
(18)
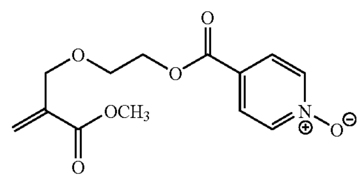
(19)
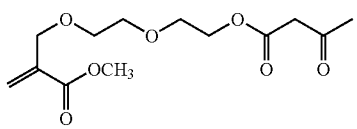
(20)
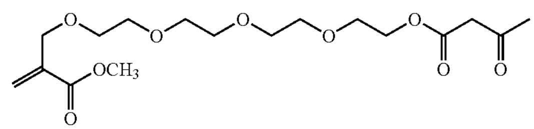
(21)
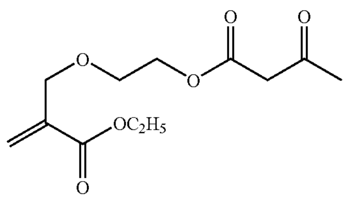
(22)
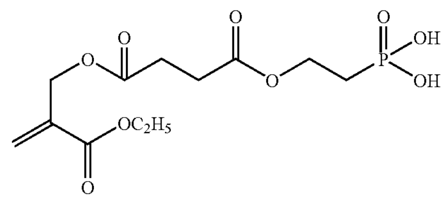
The compounds represented by formula (II) may be used as a mixture of two or more thereof.
Specific examples of the compound set forth below are also preferably exemplified as the compound having a functional group adsorbing to the surface of support.
(1)
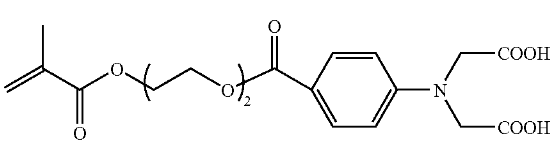
(2)
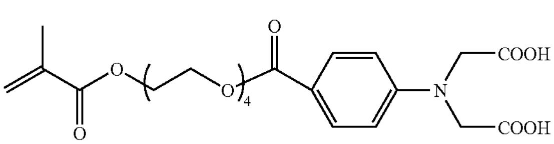
(3)
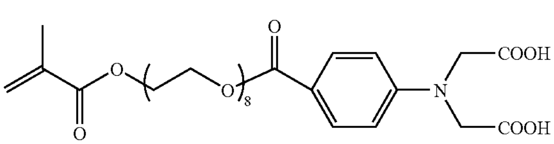
-continued
(4)
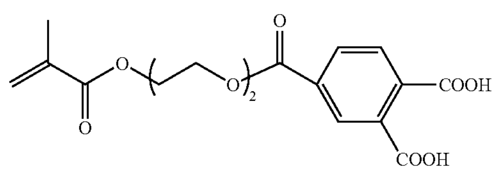
(5)
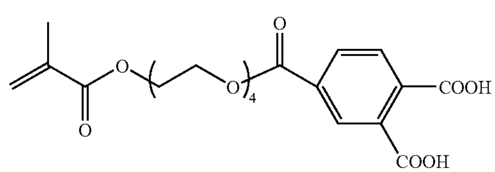
(6)
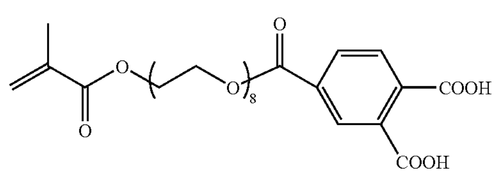
(7)
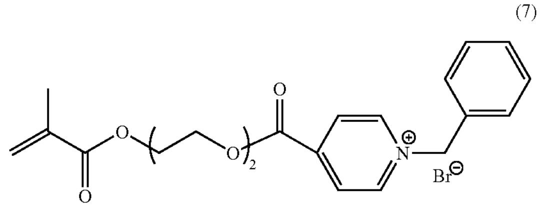

-continued
(8)
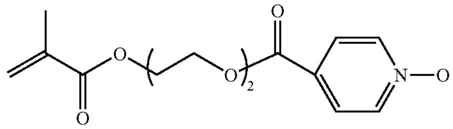
(9)
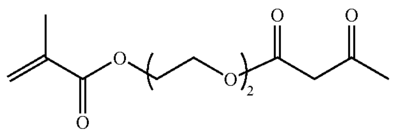
(10)
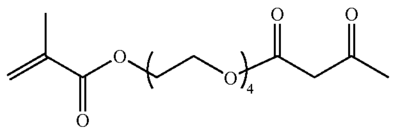
(11)
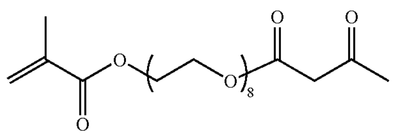
(12)
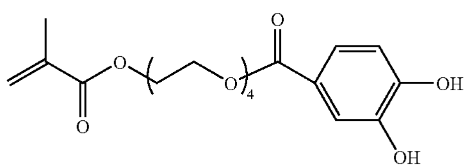
(13)
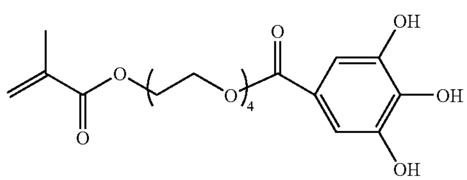
(14)
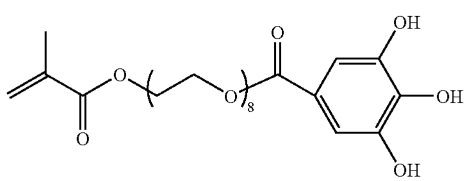
(15)
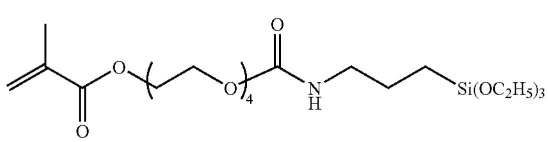
(16)
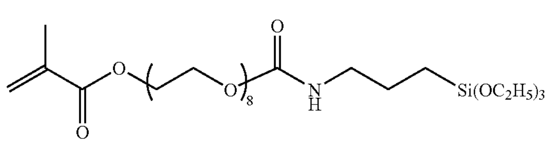
(17)
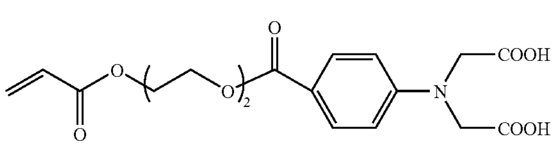
-continued
(18)
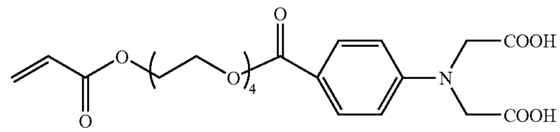
(19)
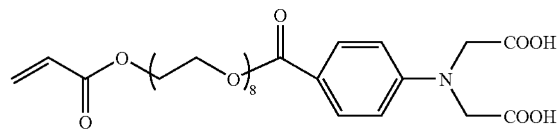
(20)
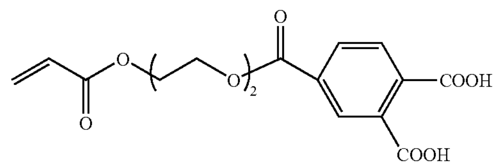
(21)
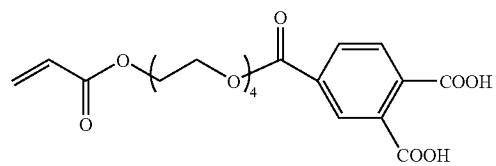
(22)
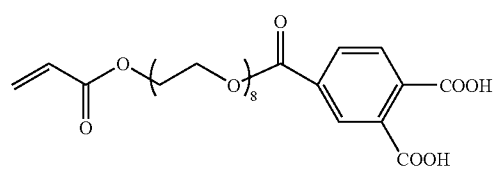
(23)
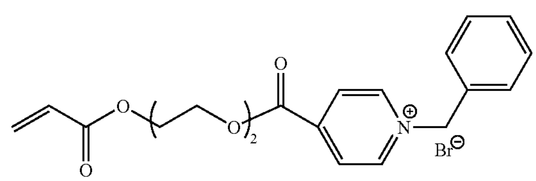
(24)
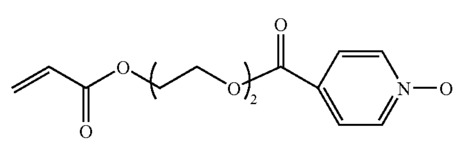
(25)
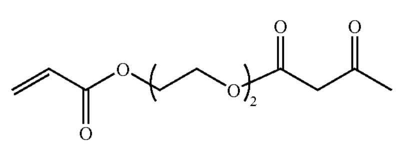
(26)
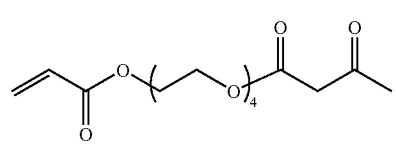

-continued (27)

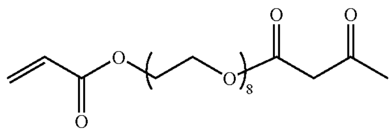

(28)

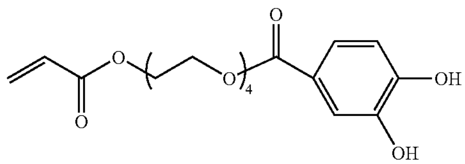

(29)

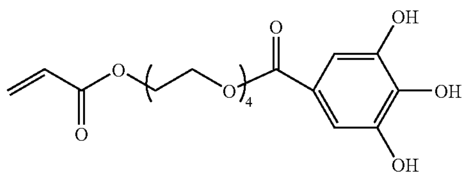

(30)

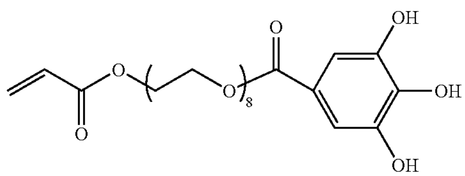

(31)

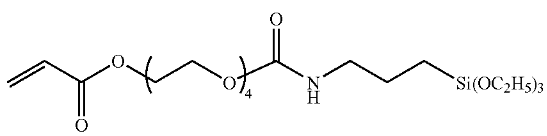

(32)

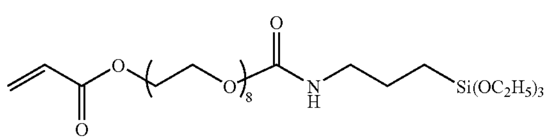

The weight average molecular weight of the compound (A) is preferably from 100 to 10,000, more preferably from 200 to 2,000.

A mixing ratio of the polymer resin for undercoat layer (hereinafter, also referred to as (B)) to the compound (A) is preferably in a range of 0.1 to 10, more preferably in a range of 0.1 to 5.0, particularly preferably in a range of 0.3 to 3.0, in terms of weight ratio of (A)/(B), from the standpoint of achieving a good balance between printing durability and developing property. The sum total of the compound (A) and the polymer resin for undercoat layer (B) is preferably in a range of 1 to 100 mg/m$^2$, more preferably in a range of 1.0 to 50 mg/m$^2$, still more preferably in a range of 5.0 to 20 mg/m$^2$.

In the invention, an embodiment where a polymerization initiator is added to the undercoat layer is preferable. According to the embodiment, the polymerization reaction in the vicinity of the interface between the undercoat layer and the photosensitive layer increases in frequency so that the crosslinkable group intensified with the compound (A) can effectively function. As the polymerization initiator, the polymerization initiator for use in the photosensitive layer can be exemplified. The amount of the polymerization initiator added to the undercoat layer is preferably from 5 to 80% by weight, more preferably from 10 to 50% by weight, based on the total solid content of the undercoat layer.

The undercoat layer can be provided by a method wherein a solution prepared by dissolving the compound described above in water, an organic solvent, for example, methanol, ethanol or methyl ethyl ketone, or a mixture thereof is coated on a support, followed by drying or a method wherein a support is immersed in the solution prepared by dissolving the compound described above in water, an organic solvent, for example, methanol, ethanol or methyl ethyl ketone, or a mixture thereof to adsorb the compound, followed by washing, for example, with water and drying. In the former method, the solution of the compound having concentration of 0.005 to 10% by weight is coated according to various methods. Any method, for example, bar coater coating, spin coating, spray coating or curtain coating can be used. In the latter method, the concentration of the solution is ordinarily from 0.01 to 20% by weight, preferably from 0.05 to 5% by weight, the immersion temperature is ordinarily from 20 to 90° C., preferably from 25 to 50° C., and the immersion time is ordinarily from 0.1 second to 20 minutes, preferably from 2 seconds to 1 minute.

A coating amount (solid content) of the undercoat layer is preferably from 0.1 to 100 mg/m$^2$, and more preferably from 3 to 30 mg/m$^2$.

(Backcoat Layer)

After applying the surface treatment to the support or forming the undercoat layer on the support, a backcoat layer can be provided on the back surface of the support, if desired.

The backcoat layer preferably includes, for example, a coating layer comprising an organic polymer compound described in JP-A-5-45885, and a coating layer comprising a metal oxide obtained by hydrolysis and polycondensation of an organic metal compound or an inorganic metal compound described in JP-A-6-35174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting material is inexpensive and easily available.

[Method for Preparation of Lithographic Printing Plate]

Now, the method for preparation of a lithographic printing plate according to the invention will be described in detail below.

According to the invention, a lithographic printing plate can be prepared by exposing the lithographic printing plate precursor for use in the invention with a laser and subjecting the exposed lithographic printing plate precursor to development processing with a developer having pH of 3 to 9 and containing a compound represented by formula <1>, <2> or <3> shown below to remove the unexposed area of the photosensitive layer. When the lithographic printing plate precursor has a protective layer, the protective layer is also removed with the development processing.

(Developer)

The developer (hereinafter, also referred to as a processing solution) is characterized by having pH of 3 to 9 and containing at least one compound represented by formula <1>, <2> or <3> shown below.

<1>

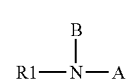

-continued

<2>

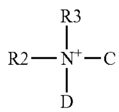

<3>

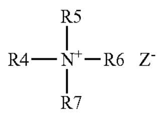

In formula <1>, R1 represents a hydrogen atom, an alkyl group or a substituent having a structure shown below.

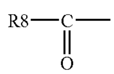

(wherein R8 represents a hydrogen atom or an alkyl group)

A represents a hydrogen atom, an alkyl group, a group containing an ethylene oxide group, a group containing a carboxylic acid group or a group containing a carboxylate; and B represents a group containing an ethylene oxide group, a group containing a carboxylic acid group or a group containing a carboxylate.

In formula <2>, R2 and R3 each represents a hydrogen atom or an alkyl group, provided that at least one of the alkyl groups may have a substituent or a connecting group; C represents an alkyl group or a group containing an ethylene oxide group; and D represents a group containing a carboxylic acid anion or a group containing an oxide anion ($O^-$).

In formula <3>, R4, R5, R6 and R7 each represents a hydrogen atom or an alkyl group; and $Z^-$ represents a counter anion.

The alkyl group represented by any one of R1 to R7 may have a substituent.

In formula <1> or <2>, the ethylene oxide group of the group containing an ethylene oxide group represents —$(CH_2CH_2O)_nH$ (wherein n represents an integer of 1 or more, preferably an integer of 2 to 20) and the group containing an ethylene oxide group includes a case of only the ethylene oxide group. In formula <1>, the group containing a carboxylic acid group includes a case of only the carboxylic acid group. In formula <1>, the carboxylate of the group containing a carboxylate represents —COOM (wherein M represents an alkali metal or an alkaline earth metal, preferably an alkali metal) and the group containing a carboxylate includes a case of only the carboxylate. In formula <2>, the group containing a carboxylic acid anion includes a case of only the carboxylic acid anion. In formula <2>, the group containing an oxide anion ($O^-$) includes a case of only the oxide anion.

The compound (hereinafter, also referred to as a surfactant) represented by formula <1>, <2> or <3> is not particularly restricted and representative compounds are set forth below.

(I)

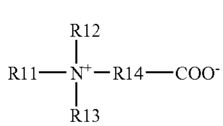

-continued (II)

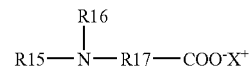

(III)

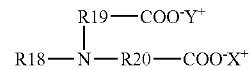

(IV)

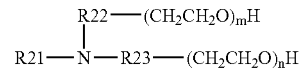

or (V)

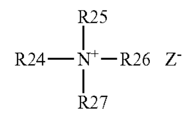

Further, surfactants represented by formula (VI) shown below are also exemplified.

(VI)

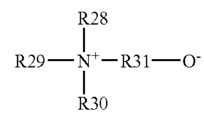

In formulae (I) to (VI), R11 represents a hydrogen atom, an alkyl group or an alkyl group having a connecting group. The connecting group includes an ester bond, a carbonyl bond or an amido bond and a number of carbon atoms connected to the N atom through the connecting group is from 8 to 20.

R12, R15, R18 and R24 to R29 each represents a hydrogen atom or an alkyl group.

R13 represents an alkyl group or a group containing an ethylene oxide group.

R16 represents a hydrogen atom, an alkyl group or a group containing an ethylene oxide group.

R21 represents a hydrogen atom, an alkyl group or a substituent having a structure shown below.

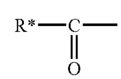

(wherein R* represents a hydrogen atom or an alkyl group)

R30 represents an alkyl group or a group containing an ethylene oxide group.

R14, R17, R19, R20, R22, R23 and R31 each represents an alkylene group or a single bond.

In the compound represented by formula (I), the N atom may be directly connected with the carboxyl group and in this case, R14 represents not an alkylene group but a single bond. In the compound represented by formula (I), as the total number of carbon atoms increases, the hydrophobic portion becomes large and dissolution of the compound in an aqueous developer becomes difficult. In such a case, the dissolution is improved by mixing with water an organic solvent for assisting the dissolution or a dissolution auxiliary agent, for example, an alcohol. However, when the total number of carbon atoms excessively increases, the surfactant can not be dissolved in a proper mixing range. The total number of carbon atoms included in R11 to R14 is preferably from 10 to 40, more preferably from 12 to 30.

When R11 to R13 each represents an alkyl group or R14 represents an alkylene group, the alkyl group or alkylene group may be a straight chain or branched structure.

The total number of carbon atoms included in R11 to R14 of the compound (surfactant) is influenced by a material, especially, a binder, used in the photosensitive layer. When a binder having high hydrophilicity is used, it tends to be preferable that the total number of carbon atoms included in R11 to R14 is relatively small. On the other hand, when a binder having low hydrophilicity is used, it is preferable that the total number of carbon atoms included in R11 to R14 is large.

Specific examples of the representative compound are set forth below.

I-a)

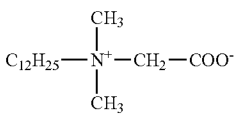

I-b)

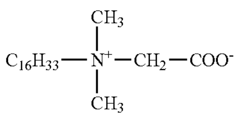

I-c)

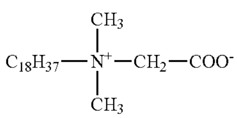

I-d)

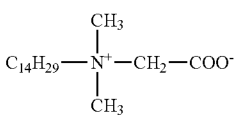

I-e)

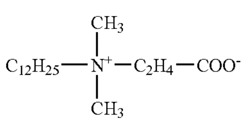

I-f)

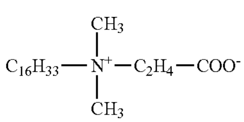

I-g)

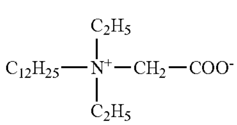

I-h)

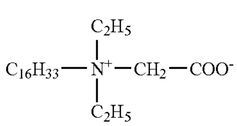

I-i)

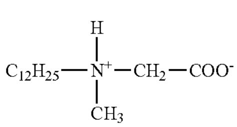

I-j)

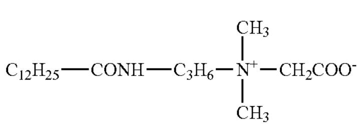

-continued

I-k)

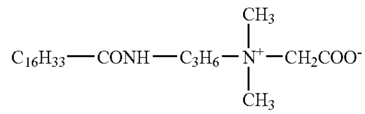

I-l)

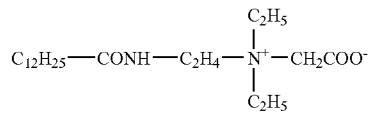

I-m)

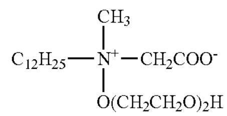

I-n)

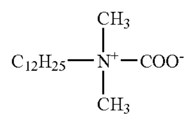

In the compound represented by formula (II), R15 represents a hydrogen atom or an alkyl group, R16 represents a hydrogen atom, an alkyl group or a group containing an ethylene oxide group, and R17 represents an alkylene group or a single bond. Similar to the compound represented by formula (I), in the compound represented by formula (II), as the total number of carbon atoms increases, the hydrophobic portion becomes large and dissolution of the compound in an aqueous developer becomes difficult. In such a case, the dissolution is improved by mixing with water an organic solvent for assisting the dissolution or a dissolution auxiliary agent, for example, an alcohol. However, when the total number of carbon atoms excessively increases, the surfactant can not be dissolved in a proper mixing range. The total number of carbon atoms included in R15 to R17 is preferably from 10 to 30, more preferably from 12 to 25.

When R15 and R16 each represents an alkyl group or R17 represents an alkylene group, the alkyl group or alkylene group may be a straight chain or branched structure.

The total number of carbon atoms included in R15 to R17 of the compound (surfactant) is influenced by a material, especially, a binder, used in the photosensitive layer. When a binder having high hydrophilicity is used, it tends to be preferable that the total number of carbon atoms included in R15 to R17 is relatively small. On the other hand, when a binder having low hydrophilicity is used, it is preferable that the total number of carbon atoms included in R15 to R17 is large.

In the compound described above, as $X^+$, a divalent metal ion, for example, a calcium ion or a magnesium ion, an ammonium ion or a hydrogen ion is used in addition to a monovalent metal ion, for example, a potassium ion or a sodium ion. In the compound represented by formula (II), among them, a sodium ion or a potassium ion is preferably used.

Specific examples of the representative compound are set forth below.

II-a)

$$C_{12}H_{25}\text{—NH—}CH_2\text{—}COO^-Na^+$$

II-b)

$$C_{14}H_{29}\text{—NH—}CH_2\text{—}COO^-Na^+$$

-continued

II-c) $C_{12}H_{25}—NH—C_2H_4—COO^-Na^+$

II-d) $C_{14}H_{29}—NH—C_2H_4—COO^-Na^+$

II-e) $C_{16}H_{33}—NH—CH_2—COO^-Na^+$

II-f) $C_{12}H_{25}—N(CH_3)—CH_2—COO^-Na^+$

II-g) $C_{16}H_{33}—N(CH_3)—CH_2—COO^-Na^+$

II-h) $C_{16}H_{33}—N(C_2H_5)—C_2H_4—COO^-Na^+$

II-i) $C_{12}H_{25}—N(CH_3)—C_4H_8—COO^-K^+$

II-j) $C_{12}H_{25}—N(CH_3)—COO^-Na^+$

In the compound represented by formula (III), R18 represents a hydrogen atom or an alkyl group, and R19 and R20 each represents an alkylene group or a single bond. Similar to the compound represented by formula (I) or (II), in the compound represented by formula (III), as the total number of carbon atoms increases, the hydrophobic portion becomes large and dissolution of the compound in an aqueous developer becomes difficult. In such a case, the dissolution is improved by mixing with water an organic solvent for assisting the dissolution or a dissolution auxiliary agent, for example, an alcohol. However, when the total number of carbon atoms excessively increases, the surfactant can not be dissolved in a proper mixing range. The total number of carbon atoms included in R18 to R20 is preferably from 10 to 30, more preferably from 12 to 28.

When R18 represents an alkyl group or R19 and R20 each represents an alkylene group, the alkyl group or alkylene group may be a straight chain or branched structure.

The total number of carbon atoms included in R18 to R20 of the compound (surfactant) is influenced by a material, especially, a binder, used in the photosensitive layer. When a binder having high hydrophilicity is used, it tends to be preferable that the total number of carbon atoms included in R18 to R20 is relatively small. On the other hand, when a binder having low hydrophilicity is used, it is preferable that the total number of carbon atoms included in R18 to R20 is large.

In the compound described above, as $X^+$ or $Y^+$, a divalent metal ion, for example, a calcium ion or a magnesium ion, an ammonium ion or a hydrogen ion is used in addition to a monovalent metal ion, for example, a potassium ion or a sodium ion. In the compound represented by formula (III), among them, a sodium ion or a potassium ion is preferably used.

Specific examples of the representative compound are set forth below.

III-a) $C_{12}H_{25}—N(C_2H_4—COO^-Na^+)—C_2H_4—COO^-H^+$

III-b) $C_{16}H_{33}—N(CH_2—COO^-Na^+)—CH_2—COO^-Na^+$

III-c) $C_{12}H_{25}—N(CH_2—COO^-Na^+)—C_3H_6—COO^-H^+$

III-d) $C_{14}H_{29}—N(C_2H_4—COO^-Na^+)—CH_2—COO^-Na^+$

III-e) $C_{12}H_{25}—N(C_3H_6—COO^-Na^+)—C_3H_6—COO^-Na^+$

III-f) $C_{12}H_{25}—N(COO^-Na^+)—C_2H_4—COO^-Na^+$

In the compound represented by formula (IV), the N atom may be directly connected with the ethylene oxide groups and in this case, R22 and R23 each represents a single bond. In the compound represented by formula (IV) also, as the total number of carbon atoms increases, the hydrophobic portion becomes large and dissolution of the compound in an aqueous developer becomes difficult. In such a case, the dissolution is improved by mixing with water an organic solvent for assisting the dissolution or a dissolution auxiliary agent, for example, an alcohol. However, when the total number of carbon atoms excessively increases, the surfactant can not be dissolved in a proper mixing range. The total number of carbon atoms included in R21 to R23 is preferably from 8 to 50, more preferably from 12 to 40.

When R21 represents an alkyl group or R22 and R23 each represents an alkylene group, the alkyl group or alkylene group may be a straight chain or branched structure.

The total number of carbon atoms included in R21 to R23 of the compound (surfactant) is influenced by a material, especially, a binder, used in the photosensitive layer. When a binder having high hydrophilicity is used, it tends to be preferable that the total number of carbon atoms included in R21 to R23 is relatively small. On the other hand, when a binder having low hydrophilicity is used, it is preferable that the total number of carbon atoms included in R21 to R23 is large.

With respect to m and n each representing a number of the ethylene oxide, as the number increases, the hydrophilicity increases and the stability in water is improved. m and n may be the same or different. The sum total of m and n is preferably from 3 to 40, more preferably from 5 to 20.

Specific examples of the representative compound are set forth below.

IV-a) $C_{12}H_{25}—N((CH_2CH_2O)_5H)—(CH_2CH_2O)_5H$

IV-b) $C_{12}H_{25}—N((CH_2CH_2O)_7H)—(CH_2CH_2O)_7H$

-continued

IV-c)

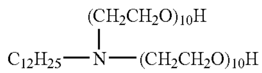

IV-d)

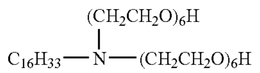

IV-e)

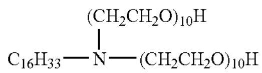

IV-f)

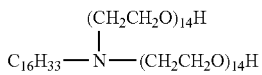

IV-g)

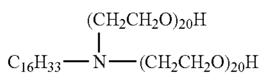

IV-h)

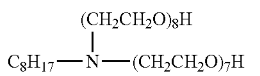

IV-i)

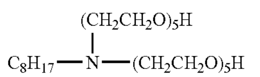

IV-j)

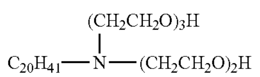

IV-K)

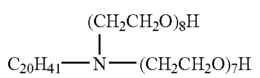

IV-l)

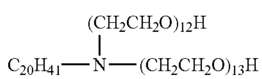

IV-m)

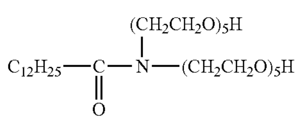

IV-n)

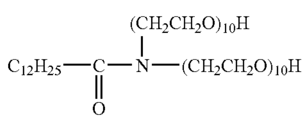

IV-o)

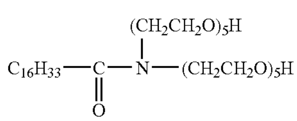

IV-p)

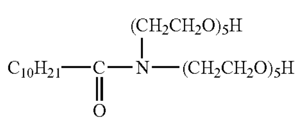

IV-m)

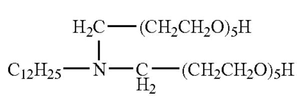

In the compound represented by formula (V), R24 to R27 each represents a hydrogen atom or an alkyl group.

In the compound represented by formula (V) also, as the total number of carbon atoms increases, the hydrophobic portion becomes large and dissolution of the compound in an aqueous developer becomes difficult. In such a case, the dissolution is improved by mixing with water an organic solvent for assisting the dissolution or a dissolution auxiliary agent, for example, an alcohol. However, when the total number of carbon atoms excessively increases, the surfactant can not be dissolved in a proper mixing range. The total number of carbon atoms included in R24 to R27 is preferably from 10 to 30, more preferably from 12 to 28.

When R24 to R27 each represents an alkyl group, the alkyl group may be a straight chain or branched structure.

The total number of carbon atoms included in R24 to R27 of the compound (surfactant) is influenced by a material, especially, a binder, used in the photosensitive layer. When a binder having high hydrophilicity is used, it tends to be preferable that the total number of carbon atoms included in R24 to R27 is relatively small. On the other hand, when a binder having low hydrophilicity is used, it is preferable that the total number of carbon atoms included in R24 to R27 is large.

$Z^-$ represents a counter anion. The counter anion is not restricted but, for example, $Cl^-$, $Br^-$ or $I^-$ is used in many cases.

Specific examples of the representative compound are set forth below.

V-a)

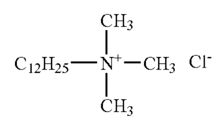

V-b)

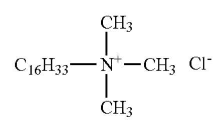

V-c)

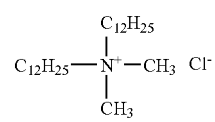

V-d)

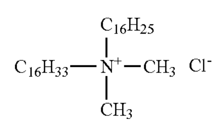

V-e)

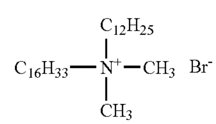

V-f)

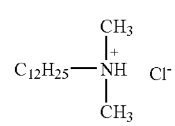

In the compound represented by formula (VI), R28 and R29 each represents a hydrogen atom or an alkyl group, and R30 represents an alkyl group or a group containing an ethylene oxide group.

In the compound represented by formula (VI) also, as the total number of carbon atoms increases, the hydrophobic portion becomes large and dissolution of the compound in an aqueous developer becomes difficult. In such a case, the dissolution is improved by mixing with water an organic solvent for assisting the dissolution or a dissolution auxiliary agent, for example, an alcohol. However, when the total number of carbon atoms excessively increases, the surfactant can not be dissolved in a proper mixing range. The total number of carbon atoms included in R28 to R30 is preferably from 8 to 30, more preferably from 10 to 28.

When R28 to R30 each represents an alkyl group, the alkyl group may be a straight chain or branched structure.

The total number of carbon atoms included in R28 to R30 of the compound (surfactant) is influenced by a material, especially, a binder, used in the photosensitive layer. When a binder having high hydrophilicity is used, it tends to be preferable that the total number of carbon atoms included in R28 to R30 is relatively small. On the other hand, when a binder having low hydrophilicity is used, it is preferable that the total number of carbon atoms included in R28 to R30 is large.

Specific examples of the representative compound are set forth below.

VI-a)

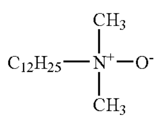

VI-b)

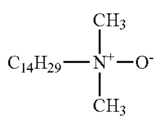

VI-c)

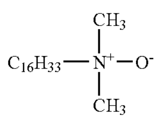

VI-d)

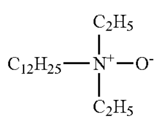

VI-e)

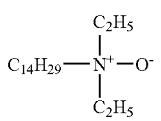

VI-f)

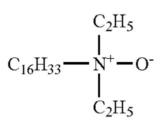

VI-g)

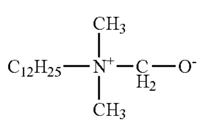

The above-described surfactant usually exhibits the effect in the total amount of 2% by weight in the developer according to the invention. According to the kind of the surfactant, it is an acceptable level but not a satisfactory level. Therefore, the amount of the surfactant added is preferably 5% by weight or more. On the other hand, when the developer having the concentration (effective component concentration) of surfactant exceeding 20% by weight is used in a developing bath, the component of the developing bath may be attacked by the developer to cause device failure in some cases. Accordingly, it is preferred that the effective component concentration of surfactant is 20% or less.

The surfactants for use in the invention are commercially available, for example, from Pionin Series produced by Takemoto Oil and Fat Co., Ltd.

The developer according to the invention may contain a water-soluble polymer compound in addition to the above-described specific surfactant. Using such a developer, an oil-desensitization treatment can be simultaneously conducted with the development processing.

The water-soluble polymer compound for use in the developer includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, those conventionally known can be used. For example, as a commercial product, Soyafive (trade name, produced by Fuji Oil Co., Ltd.) is available and various grade products can be used. The soybean polysaccharide preferably used has viscosity in a range of 10 to 100 mPa/sec in a 10% by weight aqueous solution thereof.

As the modified starch, those represented by formula (Y) shown below are preferable. As starch for the modified starch represented by formula (Y), any starch, for example, of corn, potato, tapioca, rice or wheat can be used. The modification of starch can be performed by a method wherein starch is decomposed, for example, with an acid or an enzyme to an extent that the number of glucose residue per molecule is from 5 to 30 and then oxypropylene is added thereto in an alkali.

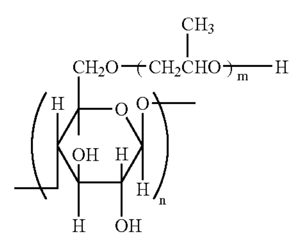

(Y)

In formula (Y), the etherification degree (substitution degree) is in a range of 0.05 to 1.2 per glucose unit, n represents an integer of 3 to 30, and m represents an integer of 1 to 3.

Of the water-soluble polymer compound, for example, soybean polysaccharide, modified starch, gum arabic, dextrin, carboxymethyl cellulose or polyvinyl alcohol is particularly preferable.

Two or more of the water-soluble polymer compounds may be used in combination. The content of the water-soluble polymer compound is preferably from 0.1 to 20% by weight, more preferably from 0.5 to 10% by weight, in the developer.

According to the invention, the water-soluble polymer compound is incorporated into the developer having the specific pH and containing the above-described specific surfactant to conduct an oil-desensitization treatment simultaneously with the development processing. Also, in order to further ensure the oil-desensitization treatment, after the development processing with the developer, the lithographic printing plate precursor can be brought into contact with an aqueous solution containing the water-soluble polymer compound.

The developer according to the invention may contain a wetting agent, an antiseptic agent, a chelating agent, a defoaming agent, an organic acid, an organic solvent, an inorganic acid, an inorganic salt or the like, in addition to the above components.

As the wetting agent, for example, ethylene glycol, propylene glycol, triethylene glycol, butylene glycol, hexylene glycol, diethylene glycol, dipropylene glycol, glycerin, trimethylol propane or diglycerin is preferably used. The wetting agents may be used individually or in combination of two or more thereof. The wetting agent is ordinarily used in an amount of 0.1 to 5% by weight based on the total weight of the developer.

As the antiseptic agent, for example, phenol or a derivative thereof, formalin, an imidazole derivative, sodium dehydroacetate, a 4-isothiazolin-3-one derivative, benzisothiazolin-3-one, 2-methyl-4-isothiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative or a nitrobromoalcohol-based compound, e.g., 2-bromo-2-nitropropane-1,3-diol, 1,1-dibromo-1-nitro-2-ethanol or 1,1-dibromo-1-nitro-2-propanol is preferably used.

The amount of the antiseptic agent added is an amount stably exerts the effect to bacterium, molds, yeast or the like. Although the amount of the antiseptic agent may be varied depending on the kind of the bacterium, molds, yeast or the like, it is preferably in a range of 0.01 to 4% by weight based on the processing solution at the time of use. Also, it is preferred to use two or more kinds of the antiseptic agents so as to exert the effect to various molds and bacteria.

As the chelating agent, for example, ethylenediaminetetraacetic acid, potassium salt thereof, sodium salt thereof; diethylenetriaminepentaacetic acid, potassium salt thereof, sodium salt thereof, triethylenetetraminehexaacetic acid, potassium salt thereof, sodium salt thereof; hydroxyethylethylenediaminetriacetic acid, potassium salt thereof, sodium salt thereof; nitrilotriacetic acid, sodium salt thereof; organic phosphonic acids, for example, 1-hydroxyethane-1,1-diphosphonic acid, potassium salt thereof, sodium salt thereof, aminotri(methylenephosphonic acid), potassium salt thereof, sodium salt thereof; and phosphonoalkanetricarboxylic acids are illustrated. A salt of an organic amine is also effectively used in place of the sodium salt or potassium salt in the chelating agent.

The chelating agent is so selected that it is stably present in the developer and does not impair the printing property. The amount of the chelating agent added is preferably from 0.001 to 1.0% by weight based on the developer at the time of use.

As the defoaming agent, for example, a conventional silicone-based self-emulsifying type or emulsifying type defoaming agent, or a nonionic surfactant having HLB of 5 or less is used. The silicone defoaming agent is preferably used. Any of emulsifying dispersing type and solubilizing type can be used.

The amount of the defoaming agent added is preferably from 0.001 to 1.0% by weight based on the developer at the time of use.

As the organic acid, for example, citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid or an organic phosphonic acid is illustrated. The organic acid can also be used in the form of an alkali metal salt or an ammonium salt. The amount of the organic acid added is preferably from 00.1 to 0.5% by weight based on the total weight of the developer.

The organic solvent which can be incorporated into the developer include, for example, an aliphatic hydrocarbon (e.g., hexane, heptane, Isopar E, Isopar H, Isopar G (produced by Esso Chemical Co., Ltd.), gasoline or kerosene), an aromatic hydrocarbon (e.g., toluene or xylene), a halogenated hydrocarbon (methylene dichloride, ethylene dichloride, trichlene or monochlorobenzene) and a polar solvent.

Examples of the polar solvent include an alcohol (e.g., methanol, ethanol, propanol, isopropanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine or N-phenyldiethanolamine).

Further, when the organic solvent is insoluble in water, it may be employed by being solubilized in water using a surfactant or the like. In the case where the developer contains the organic solvent, the concentration of the organic solvent is desirably less than 40% by weight in view of safety and inflammability.

As the inorganic acid or inorganic salt, for example, phosphoric acid, methaphosphoric acid, ammonium primary phosphate, ammonium secondary phosphate, sodium primary phosphate, sodium secondary phosphate, potassium primary phosphate, potassium secondary phosphate, sodium tripolyphosphate, potassium pyrophosphate, sodium hexamethaphosphate, magnesium nitrate, sodium nitrate, potassium nitrate, ammonium nitrate, sodium sulfate, potassium sulfate, ammonium sulfate, sodium sulfite, ammonium sulfite, sodium hydrogen sulfate or nickel sulfate is illustrated. The amount of the inorganic acid or inorganic salt added is preferably from 0.01 to 0.5% by weight based on the total weight of the developer.

The developer for use in the invention can be obtained by dissolving or dispersing the above-described components according to need in water. The solid concentration of the developer is preferably from 1 to 20% by weight. It is also possible to prepare a concentrated solution and to dilute the concentrated solution with water at the time of use.

The pH of the developer for use in the invention is from 3 to 9. From the standpoint of the developing property and dispersibility of the photosensitive layer, it is advantageous to set the pH higher. However, with respect to the printing property, particularly stain resistance, it is effective to set the pH lower. Therefore, as a result of balancing the both factors, the preferable pH is from 4 to 8.

The developer described above can be used as a developer and a development replenisher for an exposed lithographic printing plate precursor and it is preferably applied to an automatic processor described hereinafter. In the case of conducting the development processing using the automatic processor, the developer becomes fatigued in accordance with the processing amount, and hence the processing ability may be restored using a replenisher or a fresh developer. Such a replenishment system can be preferably applied to the method for preparation of a lithographic printing plate according to the invention.

The development processing using the developer having pH of 3 to 9 according to the invention is preferably performed by an automatic processor equipped with a supplying means for the developer and a rubbing member.

In particular, in the case of providing the protective layer containing polyvinyl alcohol described above on the photosensitive layer, the lithographic printing plate precursor is exposed with a laser and without undergoing a water washing step, and subjected to the development processing with the developer having pH of 3 to 9 thereby removing the protective layer and the unexposed area of the photosensitive layer.

In the case of removing the protective layer and the unexposed area of the photosensitive layer with a developer without undergoing preliminary removal of the protective layer with a water washing treatment, the removability of the unexposed area of the photosensitive layer ordinarily degrades (time for removing the protective layer increases and the developing property deteriorates), when the water solubility of the protective layer is low.

As for polyvinyl alcohol, in the range of the saponification degree of 70 to 100% by mole, as the saponification degree decreases, the water solubility becomes high. Thus, as described hereinbefore, when the saponification degree of polyvinyl alcohol contained in the protective layer is in the range of 70 to 93% by mole, since the water solubility of the protective later increases and the developing property is improved in the case of removing the protective layer and the unexposed area of the photosensitive layer with the developer without undergoing preliminary removal of the protective layer with a water washing treatment, it is a particularly preferable embodiment.

As the automatic processor for use in such a development processing, there are illustrated an automatic processor in which a lithographic printing plate precursor after image-recording is subjected to a rubbing treatment while it is transporting described in JP-A-2-220061 and JP-A-60-59351, and an automatic processor in which a lithographic printing plate precursor after image-recording placed on a cylinder is subjected to a rubbing treatment while rotating the cylinder described in U.S. Pat. Nos. 5,148,746 and 5,568,768 and British Patent 2,297,719. Among them, the automatic processor using a rotating brush roll as the rubbing member is particularly preferred.

The rotating brush roller which can be preferably used in the invention can be appropriately selected by taking account, for example, of scratch resistance of the image area and nerve strength of the support of the lithographic printing plate precursor. As for the rotating brush roller, a known rotating brush roller produced by implanting a brush material in a plastic or metal roller can be used. For example, a rotating brush roller described in JP-A-58-159533 and JP-A-3-100554, or a brush roller described in JP-UM-B-62-167253 (the term "JP-UM-B" as used herein means an "examined Japanese utility model publication"), in which a metal or plastic groove-type member having implanted therein in rows a brush material is closely radially wound around a plastic or metal roller acting as a core, can be used.

As the brush material, a plastic fiber (for example, a polyester-based synthetic fiber, e.g., polyethylene terephthalate or polybutylene terephthalate; a polyamide-based synthetic fiber, e.g., nylon 6.6 or nylon 6.10; a polyacrylic synthetic fiber, e.g., polyacrylonitrile or polyalkyl(meth)acrylate; and a polyolefin-based synthetic fiber, e.g., polypropylene or polystyrene) can be used. For instance, a brush material having a fiber bristle diameter of 20 to 400 μm and a bristle length of 5 to 30 mm can be preferably used.

The outer diameter of the rotating brush roller is preferably from 30 to 200 mm, and the peripheral velocity at the tip of the brush rubbing the plate surface is preferably from 0.1 to 5 m/sec.

Further, it is preferred to use a plurality, that is, two or more of the rotating brush rollers.

The rotary direction of the rotating brush roller for use in the invention may be the same direction or the opposite direction with respect to the transporting direction of the lithographic printing plate precursor of the invention, but when two or more rotating brush rollers are used in an automatic processor as shown in FIG. 1, it is preferred that at least one rotating brush roller rotates in the same direction and at least one rotating brush roller rotates in the opposite direction with respect to the transporting direction. By such arrangement, the photosensitive layer in the non-image area can be more steadily removed. Further, a technique of rocking the rotating brush roller in the rotation axis direction of the brush roller is also effective.

The developer can be used at an appropriate temperature, and the developer temperature is preferably from 10 to 50° C.

In the invention, the lithographic printing plate precursor after the rubbing treatment may be subsequently subjected to water washing, a drying treatment and an oil-desensitization treatment, if desired. In the oil-desensitization treatment, a known oil-desensitizing solution can be used. Further, it is possible if appropriate that prior to the development processing, the lithographic printing plate precursor is preliminarily subjected to the water washing treatment to remove the protective layer.

Further, in a plate-making process of the lithographic printing plate precursor to prepare a lithographic printing plate according to the invention, the entire surface of the lithographic printing plate precursor may be heated, if desired, before or during the exposure or between the exposure and the development. By the heating, the image-forming reaction in the photosensitive layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise, for example, in that the non-image area is also fogged. On the other hand, the heating after the development can be performed using a very strong condition. Ordinarily, the heat treatment is carried out in a temperature range of 200 to 500° C. When the temperature is too low, a sufficient effect of strengthening the image may not be obtained, whereas when it is excessively high, problems of deterioration of the support and thermal decomposition of the image area may occur.

The plate-making process is described in more detail below.

In the invention, although the development processing can be carried out just after the exposure step, the heat treatment step may intervene between the exposure step and the development step as described above. The heat treatment is effective for increasing the printing durability and improving uniformity of the image curing degree in the entire surface of printing plate precursor. The conditions of the heat treatment can be appropriately determined in a range for providing such effects. Examples of the heating means include a conventional convection oven, an IR irradiation apparatus, an IR laser, a microwave apparatus or a Wisconsin oven. For instance, the heat treatment can be conducted by maintaining the lithographic printing plate precursor at a plate surface temperature ranging from 70 to 150° C. for a period of one second to 5 minutes, preferably at 80 to 140° C. for 5 seconds to one minute, more preferably at 90 to 130° C. for 10 to 30 seconds. In the above-described range, the effects described above are efficiently achieved and an adverse affect, for example, change in shape of the lithographic printing plate precursor due to the heat can be preferably avoided.

According to the invention, the development step is conducted after the exposure step, preferably after the exposure step and the heat treatment step to prepare a lithographic printing plate. It is preferable that a plate setter used in the exposure step, a heat treatment means used in the heat treatment step and a development apparatus used in the development step are connected with each other and the lithographic printing plate precursor is subjected to automatically continuous processing. Specifically, a plate-making line wherein the plate setter and the development apparatus are connected with each other by transport means, for example, a conveyer is illustrated. Also, the heat treatment means may be placed between the plate setter and the development apparatus or the heat treatment means and the development apparatus may constitute a unit apparatus.

In case where the lithographic printing plate precursor used is apt to be influenced by surrounding light under a working environment, it is preferable that the plate-making line is blinded by a filter, a cover or the like.

After the image formation as described above, the entire surface of lithographic printing plate may be exposed to active ray, for example, ultraviolet light to accelerate curing of the image area. As a light source for the entire surface exposure, for example, a carbon arc lamp, a mercury lamp, a gallium lamp, a metal halide lamp, a xenon lamp, a tungsten lamp or various laser beams are exemplified. In order to obtain sufficient printing durability, the amount of the entire surface exposure is preferably 10 mJ/cm$^2$ or more, more preferably 100 mJ/cm$^2$ or more.

Heating may be performed at the same time with the entire surface exposure. By performing the heating, further improvement in the printing durability is recognized. Examples of the heating means include a conventional convection oven, an IR irradiation apparatus, an IR laser, a microwave apparatus or a Wisconsin oven. The plate surface temperature at the heating is preferably from 30 to 150° C., more preferably from 35 to 130° C., and still more preferably from 40 to 120° C.

In advance of the above-described development processing, the lithographic printing plate precursor is imagewise exposed through a transparent original having a line image, a halftone dot image or the like, or imagewise exposed, for example, by scanning of laser beam based on digital data.

The desirable wavelength of the light source is from 350 to 450 nm, and specifically, an InGaN semiconductor laser is preferably used. The exposure mechanism may be any of an internal drum system, an external drum system and a flat bed system.

As for the available laser light source of 350 to 450 nm, the followings can be used.

A gas laser, for example, Ar ion laser (364 nm, 351 nm, 10 mW to 1 W), Kr ion laser (356 nm, 351 nm, 10 mW to 1 W) and He—Cd laser (441 nm, 325 nm, 1 mW to 100 mW); a solid laser, for example, a combination of Nd:YAG ($YVO_4$) with SHG crystals×twice (355 nm, 5 mW to 1 W) and a combination of Cr:LiSAF with SHG crystal (430 nm, 10 mW); a semiconductor laser system, for example, a $KNbO_3$ ring resonator (430 nm, 30 mW), a combination of a waveguide-type wavelength conversion element with an AlGaAs or InGaAs semiconductor (380 nm to 450 nm, 5 mW to 100 mW), a combination of a waveguide-type wavelength conversion element with an AlGaInP or AlGaAs semiconductor (300 nm to 350 nm, 5 mW to 100 mW), and AlGaInN (350 nm to 450 nm, 5 mW to 30 mW); a pulse laser, for example, $N_2$ laser (337 nm, pulse 0.1 to 10 mJ) and XeF (351 nm, pulse 10 to 250 mJ) can be used. Among the light sources, the AlGaInN semiconductor laser (commercially available InGaN semiconductor laser, 400 to 410 nm, 5 to 30 mW) is particularly preferable in view of the wavelength characteristics and cost.

As for the exposure apparatus for the lithographic printing plate precursor of scanning exposure system, the exposure mechanism includes an internal drum system, an external drum system and a flat bed system. As the light source, among the light sources described above, those capable of conducting continuous oscillation can be preferably utilized. In practice, the exposure apparatuses described below are particularly preferable in view of the relationship between the sensitivity of the lithographic printing plate precursor and the time for plate-making.

- A single beam to triple beam exposure apparatus of internal drum system, using one or more gas or solid laser light sources so as to provide a semiconductor laser having a total output of 20 mW or more
- A multi-beam (from 1 to 10 beams) exposure apparatus of flat bed system, using one or more semiconductor, gas or solid lasers so as to provide a total output of 20 mW or more
- A multi-beam (from 1 to 9 beams) exposure apparatus of external drum system, using one or more semiconductor, gas or solid lasers so as to provide a total output of 20 mW or more
- A multi-beam (10 or more beams) exposure apparatus of external drum system, using one or more semiconductor or solid lasers so as to provide a total output of 20 mW or more In the laser direct drawing-type lithographic printing plate precursor, the following equation (eq 1) is ordinarily established among the sensitivity X (J/cm$^2$) of photosensitive material, the exposure area S (cm$^2$) of photosensitive material, the power q (W) of one laser light source, the number n of lasers and the total exposure time t (s):

$$X \cdot S = n \cdot q \cdot t \quad \text{(eq 1)}$$

i) In the case of the internal drum (single beam) system

The following equation (eq 2) is ordinarily established among the laser revolution number f (radian/s), the sub-scanning length Lx (cm) of photosensitive material, the resolution Z (dot/cm) and the total exposure time t (s):

$$f \cdot Z \cdot t = Lx \quad \text{(eq 2)}$$

ii) In the case of the external drum (multi-beam) system

The following equation (eq 3) is ordinarily established among the drum revolution number F (radian/s), the sub-scanning length Lx (cm) of photosensitive material, the resolution Z (dot/cm), the total exposure time t (s) and the number (n) of beams:

$$F \cdot Z \cdot n \cdot t = Lx \quad \text{(eq 3)}$$

iii) In the case of the flat bed (multi-beam) system

The following equation (eq 4) is ordinarily established among the revolution number H (radian/s) of polygon mirror, the sub-scanning length Lx (cm) of photosensitive material, the resolution Z (dot/cm), the total exposure time t (s) and the number (n) of beams:

$$H \cdot Z \cdot n \cdot t = Lx \quad \text{(eq 4)}$$

When the resolution (2,560 dpi) required for a practical printing plate, the plate size (A1/B1, sub-scanning length: 42 inch), the exposure condition of about 20 sheets/hour and the photosensitive characteristics (photosensitive wavelength, sensitivity: about 0.1 mJ/cm$^2$) of the lithographic printing plate precursor according to the invention are substituted for the above equations, it can be understood that the lithographic printing plate precursor according to the invention is preferably combined with a multi-beam exposure system using a laser having a total output of 20 mW or more, and on taking account of operability, cost and the like, most preferably combined with an external drum system semiconductor laser multi-beam (10 or more beams) exposure apparatus.

EXAMPLES

The present invention will be described in more detail with reference to the following examples, but the invention should not be construed as being limited thereto.

<Preparation of Lithographic Printing Plate Precursor (1)>

(Components Used)

(A) A solution containing 32.4% by weight of a methyl methacrylate/methacrylic acid-copolymer (weight ratio of methyl methacrylate/methacrylic acid=4:1; acid value=110 mg KOH/g) in 2-butanone (viscosity=105 mm$^2$/s at 25° C.)

(B) A solution containing 88.2% by weight of a reaction product of 1 mole of 2,2,4-trimethylhexamethylene diisocyanate and 2 moles of hydroxyethyl methacrylate (viscosity=3.30 mm$^2$/s at 25° C.)

(C) Mono Z1620, a solution containing 30.1% by weight of a reaction product of 1 mole of hexamethylene diisocyanate, 1 mole of 2-hydroxyethyl methacrylate and 0.5 moles of 2-(2-hydroxyethyl)piperidine in 2-butanone (viscosity=1.7 mm$^2$/s at 25° C.)

(D) 1,4-Distyryl-(3,5-trimethoxy-4-(2-butyl)oxy)benzene (E) Heliogene blue D7490® dispersion (9.9% by weight, viscosity=7.0 mm$^2$/s at 25° C.), trade name of BASF AG, as defined in European Patent 1 072 956

(F) 2,2'-Bis(2-chlorophenyl)-4,4',5,5'-tetraphenyl-1,2-bisimidazole (G) 2-Mercaptobenzothiazole (H) Edaplan LA411® (1% by weight in Dowanol PM®, trade mark of Dow Chemical Company)

(I) 2-Butanone (J) Propylene glycol monomethyl ether (Dowanol PM®, trade mark of Dow Chemical Company)

(K) Partially hydrolyzed polyvinyl alcohol (saponification degree=88% by mole, viscosity=4 mPa·s in a 4% by weight aqueous solution at 20° C.)

(L) Fully hydrolyzed polyvinyl alcohol (saponification degree=98% by mole, viscosity=6 mPa·s in a 4% by weight aqueous solution at 20° C.)

(M) Partially hydrolyzed polyvinyl alcohol (saponification degree=88% by mole, viscosity=8 mPa·s in a 4% by weight aqueous solution at 20° C.)

(N) Acticide LA1206: a biocide commercially available from Thor (O) Metolat FC355 (ethoxylated ethylenediamine commercially available from Munzing Chemie):

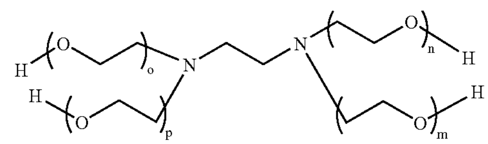

m, n, o, p = 11

(P) Lutensol A8 (90% by weight) (surfactant commercially available from BASF)

(Q) Water

A) Formation of Photosensitive Layer

An aluminum plate (material: 1050, refining: H16) having a thickness of 0.24 mm was immersed in an aqueous 5% by weight sodium hydroxide solution maintained at 65° C. to conduct a degreasing treatment for one minute, followed by washed with water. The degreased aluminum plate was immersed in an aqueous 10% by weight hydrochloric acid solution maintained at 25° C. for one minute to neutralize, followed by washed with water. Subsequently, the aluminum plate was subjected to an electrolytic surface-roughening treatment with alternating current under condition of current density of 100 A/dm$^2$ in an aqueous 0.3% by weight hydrochloric acid solution at 25° C. for 60 seconds and then subjected to a desmut treatment in an aqueous 5% by weight sodium hydroxide solution maintained at 60° C. for 10 seconds. The aluminum plate thus-treated was subjected to an anodizing treatment under condition of current density of 10 A/dm$^2$ and voltage of 15 V in an aqueous 15% by weight sulfuric acid solution at 25° C. for one minute and then subjected to a hydrophilization treatment using an aqueous 1% by weight polyvinyl phosphonic acid solution at 75° C. to prepare a support. A composition for photosensitive layer was prepared by mixing the components shown in Table 1. The composition was coated on the support and dried at 105° C. The thickness of the photosensitive layer obtained was 1.5 g/m$^2$.

TABLE 1

Composition of coating solution for photosensitive layer

| Component | Amount (g) |
|---|---|
| (A) | 181.70 |
| (B) | 36.14 |
| (C) | 381.23 |
| (D) | 10.97 |
| (E) | 207.11 |
| (F) | 16.58 |
| (G) | 0.77 |
| (H) | 25.50 |
| (I) | 650.07 |
| (J) | 1489.95 |

B) Formation of Protective Layer

An aqueous solution (content: 2.0% by weight) having the composition shown in Table 2 was coated on the photosensitive layer and dried at 120° C. for 2 minutes. The thickness of the protective layer after drying was 0.95 g/m$^2$.

TABLE 2

| Composition of coating solution for protective layer | |
|---|---|
| Component | Amount (g) |
| (K) | 550.67 |
| (L) | 475.82 |
| (M) | 237.91 |
| (N) | 2.56 |
| (O) | 12.11 |
| (P) | 1.03 |
| (Q) | 62719.90 |

<Preparation of Lithographic Printing Plate Precursors (2) to (5)>

(Components Used)

(B) A solution containing 88.2% by weight of a reaction product of 1 mole of 2,2,4-trimethylhexamethylene diisocyanate and 2 moles of hydroxyethyl methacrylate (viscosity=3.30 $mm^2/s$ at 25° C.)

(C) Mono Z1620, a solution containing 30.1% by weight of a reaction product of 1 mole of hexamethylene diisocyanate, 1 mole of 2-hydroxyethyl methacrylate and 0.5 moles of 2-(2-hydroxyethyl)piperidine in 2-butanone (viscosity=1.7 $mm^2/s$ at 25° C.)

(D) 1,4-Distyryl-(3,5-trimethoxy-4-(2-butyl)oxy)benzene (E) Heliogene blue D7490® dispersion (9.9% by weight, viscosity=7.0 $mm^2/s$ at 25° C.), trade name of BASF AG, as defined in European Patent 1 072 956

(F) Hostanox 03 (phenolic antioxidant commercially available from Clariant)

(G) 2,2'-Bis(2-chlorophenyl)-4,4',5,5'-tetraphenyl-1,2-bisimidazole (H) 2-Mercaptobenzothiazole (I) Edaplan LA411® (10% by weight in Dowanol PM®, trade mark of Dow Chemical Company)

(J) 2-Butanone (K) Propylene glycol monomethyl ether (Dowanol PM®, trade mark of Dow Chemical Company)

(L) Partially hydrolyzed polyvinyl alcohol (saponification degree=88% by mole, viscosity=4 mPa·s in a 4% by weight aqueous solution at 20° C.)

(M) Fully hydrolyzed polyvinyl alcohol (saponification degree=98% by mole, viscosity=6 mPa·s in a 4% by weight aqueous solution at 20° C.)

(N) Partially hydrolyzed polyvinyl alcohol (saponification degree=88% by mole, viscosity=8 mPa·s in a 4% by weight aqueous solution at 20° C.)

(O) Acticide LA1206: a biocide commercially available from Thor (P) Lupasol P (polyethylene imine 50% by weight in water, commercially available from BASF)

(Q) Lutensol A8 (90% by weight) (surfactant commercially available from BASF)

(R) Water

A) Formation of Photosensitive Layer

A composition for photosensitive layer was prepared by mixing the components shown in Table 3. The composition was coated on the support used in Preparation of Lithographic printing plate precursor (1) and dried at 105° C. The thickness of the photosensitive layer obtained was 1.5 $g/m^2$.

TABLE 3

Composition of coating solution for photosensitive layer (amount of component: g)

| | Lithographic Printing Plate Precursor | | | |
|---|---|---|---|---|
| Component | (2) | (3) | (4) | (5) |
| PVP/VA I-335 (1) | 138.34 | — | — | — |
| PVP/VA S-630 (2) | — | 345.84 | — | — |
| Luvitec K90 (3) | — | — | 345.84 | — |
| PVCB (4) | — | — | — | 345.84 |
| (B) | 36.22 | 36.22 | 36.22 | 36.22 |
| (C) | 282.50 | 282.50 | 282.50 | 282.50 |
| (D) | 10.97 | 10.97 | 10.97 | 10.97 |
| (E) | 209.88 | 209.88 | 209.88 | 209.88 |
| (F) | 1.28 | 1.28 | 1.28 | 1.28 |
| (G) | 16.58 | 16.58 | 16.58 | 16.58 |
| (H) | 0.77 | 0.77 | 0.77 | 0.77 |
| (I) | 2.55 | 2.55 | 2.55 | 2.55 |
| (J) | 682.07 | 682.07 | 682.07 | 682.07 |
| (K) | 1508.98 | 1508.98 | 1508.98 | 1508.98 |

(1): PVP/VA I-335 (50% in isopropyl alcohol) is vinyl pyrrolidone-vinyl acetate copolymer, available from ISP
(2): PVP/VA S-630 (20% in Dowanol) is vinyl pyrrolidone-vinyl acetate copolymer, available from ISP
(3): Luvitec K90 (20% in Dowanol) is polyvinyl pyrrolidone, available from BASF
(4): PVCB (20% in Dowanol) is a reaction product of POVAL 405 with phthalic anhydride, available from CLARIANT (Poval 405 is copolymer of vinyl acetate and vinyl alcohol, available from Kuraray Co., Ltd.)

B) Formation of Protective Layer

An aqueous solution (content: 2.0% by weight) having the composition shown in Table 4 was coated on the photosensitive layer and dried at 120° C. for 2 minutes. The thickness of the protective layer after drying was 1.75 $g/m^2$.

TABLE 4

| Composition of coating solution for protective layer | |
|---|---|
| Component | Amount (g) |
| (L) | 511.08 |
| (M) | 446.08 |
| (N) | 223.04 |
| (O) | 2.40 |
| (P) | 12.00 |
| (Q) | 11.40 |
| (R) | 28794.00 |

<Preparation of Lithographic Printing Plate Precursors (6) to (8)>

(Components Used)

(B) A solution containing 88.2% by weight of a reaction product of 1 mole of 2,2,4-trimethylhexamethylene diisocyanate and 2 moles of hydroxyethyl methacrylate (viscosity=3.30 $mm^2/s$ at 25° C.)

(C) Mono Z1620, a solution containing 30.1% by weight of a reaction product of 1 mole of hexamethylene diisocyanate, 1 mole of 2-hydroxyethyl methacrylate and 0.5 moles of 2-(2-hydroxyethyl)piperidine in 2-butanone (viscosity=1.7 $mm^2/s$ at 25° C.)

(D) 1,4-Distyryl-(3,5-trimethoxy-4-(2-butyl)oxy)benzene (E) Heliogene blue D7490® dispersion (9.9% by weight, viscosity=7.0 $mm^2/s$ at 25° C.), trade name of BASF AG, as defined in European Patent 1 072 956

(F) Hostanox 03 (phenolic antioxidant commercially available from Clariant)

(G) 2,2'-Bis(2-chlorophenyl)-4,4',5,5'-tetraphenyl-1,2-bisimidazole (H) 2-Mercaptobenzothiazole (I) Edaplan LA411® (10% by weight in Dowanol PM®, trade mark of Dow Chemical Company)

(J) 2-Butanone (K) Propylene glycol monomethyl ether (Dowanol PM®, trade mark of Dow Chemical Company)

(L) Partially hydrolyzed polyvinyl alcohol (saponification degree=88% by mole, viscosity=4 mPa·s in a 4% by weight aqueous solution at 20° C.)

(M) Fully hydrolyzed polyvinyl alcohol (saponification degree=98% by mole, viscosity=6 mPa·s in a 4% by weight aqueous solution at 20° C.)

(N) Partially hydrolyzed polyvinyl alcohol (saponification degree=88% by mole, viscosity=8 mPa·s in a 4% by weight aqueous solution at 20° C.)

(O) Acticide LA1206: a biocide commercially available from Thor (P) Lupasol P (polyethylene imine 50% by weight in water, commercially available from BASF)

(Q) Lutensol A8 (90% by weight) (surfactant commercially available from BASF)

(R) Water

A) Formation of Photosensitive Layer

A composition for photosensitive layer was prepared by mixing the components shown in Table 5. The composition was coated on the support used in Preparation of Lithographic printing plate precursor (1) and dried at 105° C. The thickness of the photosensitive layer obtained was 1.5 g/m$^2$.

TABLE 5

Composition of coating solution for photosensitive layer (amount of component: g)

| Component | Lithographic Printing Plate Precursor (6) | (7) | (8) |
|---|---|---|---|
| Gantrez ES425 (1) | 114.01 | — | — |
| Gantrez ES435 (2) | — | 114.01 | — |
| Gantrez A425 (3) | — | — | 114.01 |
| (B) | 36.22 | 36.22 | 36.22 |
| (C) | 382.50 | 382.50 | 382.50 |
| (D) | 10.97 | 10.97 | 10.97 |
| (E) | 209.88 | 209.88 | 209.88 |
| (F) | 1.28 | 1.28 | 1.28 |
| (G) | 16.58 | 16.58 | 16.58 |
| (H) | 0.77 | 0.77 | 0.77 |
| (I) | 2.55 | 2.55 | 2.55 |
| (J) | 771.00 | 771.00 | 771.00 |
| (K) | 1454.25 | 1454.25 | 1454.25 |

(1): Gantrez ES425 is half butyl ester of vinyl methyl ether-maleic anhydride copolymer, available form ISP
(2): Gantrez ES435 is half butyl ester of vinyl methyl ether-maleic anhydride copolymer, available form ISP
(3): Gantrez A425 is half butyl ester of vinyl methyl ether-maleic anhydride copolymer, available form ISP B) Formation of Protective Layer An aqueous solution (content: 2.0% by weight) having the composition shown in Table 6 was coated on the photosensitive layer and dried at 120° C. for 2 minutes. The thickness of the protective layer after drying was 1.75 g/m$^2$.

TABLE 6

Composition of coating solution for protective layer

| Component | Amount (g) |
|---|---|
| (L) | 511.08 |
| (M) | 446.08 |
| (N) | 223.04 |
| (O) | 2.40 |
| (P) | 12.00 |
| (Q) | 11.40 |
| (R) | 28794.00 |

<Preparation of Lithographic Printing Plate Precursors (9) to (14)>

(Components Used)

(B) A solution containing 88.2% by weight of a reaction product of 1 mole of 2,2,4-trimethylhexamethylene diisocyanate and 2 moles of hydroxyethyl methacrylate (viscosity=3.30 mm$^2$/s at 25° C.)

(C) Mono Z1620, a solution containing 30.1% by weight of a reaction product of 1 mole of hexamethylene diisocyanate, 1 mole of 2-hydroxyethyl methacrylate and 0.5 moles of 2-(2-hydroxyethyl)piperidine in 2-butanone (viscosity=1.7 mm$^2$/s at 25° C.)

(D) 1,4-Distyryl-(3,5-trimethoxy-4-(2-butyl)oxy)benzene (E) Heliogene blue D7490® dispersion (9.9% by weight, viscosity=7.0 mm$^2$/s at 25° C.), trade name of BASF AG, as defined in European Patent 1 072 956

(F) Hostanox 03 (phenolic antioxidant commercially available from Clariant)

(G) 2,2'-Bis(2-chlorophenyl)-4,4',5,5'-tetraphenyl-1,2-bisimidazole (H) 2-Mercaptobenzothiazole (I) Edaplan LA411® (10% by weight in Dowanol PM®, trade mark of Dow Chemical Company)

(J) 2-Butanone (K) Propylene glycol monomethyl ether (Dowanol PM®, trade mark of Dow Chemical Company)

(L) Partially hydrolyzed polyvinyl alcohol (saponification degree=88% by mole, viscosity=4 mPa·s in a 4% by weight aqueous solution at 20° C.)

(M) Fully hydrolyzed polyvinyl alcohol (saponification degree=98% by mole, viscosity=6 mPa·s in a 4% by weight aqueous solution at 20° C.)

(N) Partially hydrolyzed polyvinyl alcohol (saponification degree=88% by mole, viscosity=8 mPa·s in a 4% by weight aqueous solution at 20° C.)

(O) Acticide LA1206: a biocide commercially available from Thor (P) Lupasol P (polyethylene imine 50% by weight in water, commercially available from BASF)

(Q) Lutensol A8 (90% by weight) (surfactant commercially available from BASF)

(R) Water

A) Formation of Photosensitive Layer

A composition for photosensitive layer was prepared by mixing the components shown in Table 7. The composition was coated on the support used in Preparation of Lithographic printing plate precursor (1) and dried at 105° C. The thickness of the photosensitive layer obtained was 1.5 g/m$^2$.

TABLE 7

| Component | Composition of coating solution for photosensitive layer (amount of component: g) | | | | | |
|---|---|---|---|---|---|---|
| | Lithographic Printing Plate Precursor | | | | | |
| | (9) | (10) | (11) | (12) | (13) | (14) |
| (1) | 148.22 | — | — | — | — | — |
| (2) | — | 345.84 | — | — | — | — |
| (3) | — | — | 138.34 | — | — | — |
| (4) | — | — | — | 138.34 | — | — |
| (5) | — | — | — | — | 138.34 | — |
| (6) | — | — | — | — | — | 345.84 |
| (B) | 36.22 | 36.22 | 36.22 | 36.22 | 36.22 | 36.22 |
| (C) | 382.50 | 382.50 | 382.50 | 382.50 | 382.50 | 382.50 |
| (D) | 10.97 | 10.97 | 10.97 | 10.97 | 10.97 | 10.97 |
| (E) | 209.88 | 209.88 | 209.88 | 209.88 | 209.88 | 209.88 |
| (F) | 1.28 | 1.28 | 1.28 | 1.28 | 1.28 | 1.28 |
| (G) | 16.58 | 16.58 | 16.58 | 16.58 | 16.58 | 16.58 |
| (H) | 0.77 | 0.77 | 0.77 | 0.77 | 0.77 | 0.77 |
| (I) | 2.55 | 2.55 | 2.55 | 2.55 | 2.55 | 2.55 |
| (J) | 682.07 | 682.07 | 682.07 | 682.07 | 682.07 | 682.07 |
| (K) | 1508.98 | 1508.98 | 1508.98 | 1508.98 | 1508.98 | 1508.98 |

(1): Luvitec K43E (40% in ethanol) is polyvinyl caprolactam available from BASF
(2): Agrimer AL-IOLC (20% in Dowanol) is butylated polyvinyl pyrrolidone available from ISP
(3): Antaron V516 (50% in isopropanol) is polyvinyl pyrrolidone grafted with hexadecene available from MAPRIC
(4): PVP/VA I-535 (50% in isopropanol) is copolymer of vinyl pyrrolidone and vinyl acetate, available from ISP
(5): PVP/VA I-735 (50% isopropanol) is copolymer of vinyl pyrrolidone and vinyl acetate, available from ISP
(6): Luvitec K30 (20% in Dowanol) is polyvinyl pyrrolidone, available from BASF B) Formation of Protective Layer An aqueous solution (content: 2.0% by weight) having the composition shown in Table 8 was coated on the photosensitive layer and dried at 120° C. for 2 minutes. The thickness of the protective layer after drying was 1.75 g/m$^2$.

TABLE 8

| Composition of coating solution for protective layer | |
|---|---|
| Component | Amount (g) |
| (L) | 511.08 |
| (M) | 446.08 |
| (N) | 223.04 |
| (O) | 2.40 |
| (P) | 12.00 |
| (Q) | 11.40 |
| (R) | 28794.00 |

<Preparation of Lithographic Printing Plate Precursor (15)>

A composition for photosensitive layer was prepared by mixing the components shown in Table 9. The composition was coated on the support used in Preparation of Lithographic printing plate precursor (1) and dried in a circulating oven at 120° C. for one minute. The thickness of the photosensitive layer was 1.58 g/m$^2$.

TABLE 9

| Composition of coating solution for photosensitive layer | |
|---|---|
| Component | Amount (g) |
| Alcotex 552P (1) | 0.875 |
| 1,4-Di[3,5-dimethoxy-4-(1-methylpropoxy)styryl]benzene | 0.0479 |

TABLE 9-continued

| Composition of coating solution for photosensitive layer | |
|---|---|
| Component | Amount (g) |
| 2,2'-Bis(2-chlorophenyl)-4,4',5,5'-tetraphenyl-1,2-bisimidazole | 0.0794 |
| FST 426R (2) | 0.5375 |
| Edaplan LA411 (1% in Dowanol PM) | 0.1125 |
| 2-Mercaptobenzothiazole | 0.0034 |
| 2-Butanone | 4.00 |
| Dowanol PM | 5.00 |

(1): Alcotex 552P is an aqueous 40% solution of polyvinyl alcohol (hydrolysis degree = 55%), available from Synthomer
(2) FST 426R is a solution containing 88.2% by weight of a reaction product of 1 mole of 2,2,4-trimethylhexamethylene diisocyanate and 2 moles of hydroxyethyl methacrylate in 2-butanone (viscosity = 3.30 mm$^2$/s at 25° C.)

An aqueous solution having the composition shown in Table 10 was coated on the photosensitive layer and dried at 110° C. for 2 minutes. The protective layer had the thickness after drying of 2.0 g/m$^2$.

TABLE 10

| Composition of coating solution for protective layer | |
|---|---|
| Component | Amount (g) |
| Partially hydrolyzed polyvinyl alcohol (hydrolysis degree = 88%, viscosity = 4 mPa · s in a 4% by weight aqueous solution at 20° C.) | 17.03 |
| Partially hydrolyzed polyvinyl alcohol (hydrolysis degree = 88%, viscosity = 8 mPa · s in a 4% by weight aqueous solution at 20° C.) | 7.43 |
| Fully hydrolyzed polyvinyl alcohol (hydrolysis degree = 98%, viscosity = 6 mPa · s in a 4% by weight aqueous solution at 20° C.) | 14.87 |
| Acticide LA1206 (refer to Lithographic printing plate precursor (1)) | 0.26 |
| Metolat FC355 (refer to Lithographic printing plate Precursor (1)) | 0.38 |
| Lutensol A8 (90%) (refer to Lithographic printing plate precursor (1)) | 0.032 |
| Water | 960 |

<Preparation of Lithographic Printing Plate Precursor (16)>

Lithographic printing plate precursor (16) was prepared in the same manner as in Lithographic printing plate precursor (1) except for changing Component (A) used in the preparation of Lithographic printing plate precursor (1) to (A-1) shown below.

(A-1): A solution containing 32.4% by weight of a polymethyl methacrylate (acid value=0 mg KOH/g) in 2-butanone (viscosity=105 mm$^2$/s at 25° C.)

<Preparation of Lithographic Printing Plate Precursor (17)>

Lithographic printing plate precursor (17) was prepared in the same manner as in Lithographic printing plate precursor (1) except for changing Component (A) used in the preparation of Lithographic printing plate precursor (1) to (A-2) shown below.

(A-2): A solution containing 32.4% by weight of a methyl methacrylate/methacrylic acid copolymer (weight ratio of methyl methacrylate/methacrylic acid=91:9; acid value=50 mg KOH/g) in 2-butanone (viscosity=105 mm$^2$/s at 25° C.)1

<Preparation of Lithographic Printing Plate Precursor (18)>

Lithographic printing plate precursor (18) was prepared in the same manner as in Lithographic printing plate precursor (1) except for changing Component (A) used in the preparation of Lithographic printing plate precursor (1) to (A-3) shown below.

(A-3): A solution containing 32.4% by weight of a methyl methacrylate/methacrylic acid copolymer (weight ratio of methyl methacrylate/methacrylic acid=68:32; acid value=195 mg KOH/g) in 2-butanone (viscosity=105 $mm^2/s$ at 25° C.)

<Preparation of Lithographic Printing Plate Precursor (19)>

Lithographic printing plate precursor (19) was prepared in the same manner as in Lithographic printing plate precursor (1) except for changing Component (A) used in the preparation of Lithographic printing plate precursor (1) to (A-4) shown below.

(A-4): A solution containing 32.4% by weight of a methyl methacrylate/methacrylic acid copolymer (weight ratio of methyl methacrylate/methacrylic acid=54:46; acid value=300 mg KOH/g) in 2-butanone (viscosity=105 $mm^2/s$ at 25° C.)

<Preparation of Lithographic Printing Plate Precursors (20) to (21)>

Lithographic printing plate precursors (20) to (21) were prepared in the same manner as in Lithographic printing plate precursor (1) except for changing the amounts of Components (A), (B) and (C) used in the preparation of Lithographic printing plate precursor (1) to those shown in Table 11 below and the weight ratio of polymerizable compound/binder polymer in the photosensitive layer to those shown in Table 11 below, respectively.

TABLE 11

| | Amount (g) | | | Weight Ratio (solid content) of Polymerizable |
|---|---|---|---|---|
| | (A) | (B) | (C) | Compound/Binder Polymer |
| Lithographic printing plate precursor (1) | 181.70 | 36.14 | 381.23 | 2.5 |
| Lithographic printing plate precursor (20) | 318.67 | 26.11 | 266.53 | 1.0 |
| Lithographic printing plate precursor (21) | 115.90 | 42.72 | 436.13 | 4.5 |

Examples 1 to 3 and Comparative Examples 1 to 2

Exposure, Development and Printing

Lithographic printing plate precursor (1) was subjected to image exposure by a violet semiconductor laser plate setter Vx9600 (having InGaN semiconductor laser: emission: 405 nm±10 mm/output: 30 mW) produced by FUJIFILM Electronic Imaging, Ltd. As for the image, halftone dots of 50% were drawn using an FM screen (TAFFETA 20, produced by Fuji Film Co., Ltd.) in a plate surface exposure amount of 0.05 $mJ/cm^2$ and at resolution of 2,438 dpi.

The exposed lithographic printing plate precursor was subjected to preheat at 100° C. for 30 seconds and then subjected to development processing in an automatic development processor having a structure shown in FIG. 1 using each of Developers (1) to (5) having the composition shown below. The pH of each developer was adjusted to 7.0 using phosphoric acid and sodium hydroxide. The automatic development processor was an automatic processor having two rotating brush rollers. As for the rotating brush rollers used, the first brush roller was a brush roller having an outer diameter of 50 mm and being implanted with fiber of polybutylene terephthalate (bristle diameter: 200 μm bristle length: 17 mm), and the brush roller was rotated at 200 rpm in the same direction as the transporting direction (peripheral velocity at the tip of brush: 0.52 m/sec). The second brush roller was a brush roller having an outer diameter of 50 mm and being implanted with fiber of polybutylene terephthalate (bristle diameter: 200 μm, bristle length: 17 mm), and the brush roller was rotated at 200 rpm in the opposite direction to the transporting direction (peripheral velocity at the tip of brush: 0.52 m/sec). The transportation of the lithographic printing plate precursor was performed at transporting speed of 100 cm/min.

The developer was supplied on the surface of the lithographic printing plate precursor by showering from a spray pipe using a circulation pump. The tank volume for the developer was 10 liters.

| Developer (1) | |
|---|---|
| Water | 100 g |
| Polyoxyethylene laurylamino ether (Pionin D3110, produced by Takemoto Oil & Fat Co., Ltd.) | 10 g |

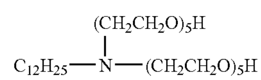

| | |
|---|---|
| Gum arabic | 10 g |
| Ammonium primary phosphate | 0.1 g |
| Citric acid | 0.1 g |
| Tetrasodium ethylenediaminetetraacetate | 0.1 g |
| 2-Bromo-2-nitropropane-1,3-diol | 0.001 g |
| 2-Methyl-4-isothiazolin-3-one | 0.001 g |

| Developer (2) | |
|---|---|
| Water | 100 g |
| N-Lauryl dimethyl betaine (Pionin C157K, produced by Takemoto Oil & Fat Co., Ltd.) | 10 g |

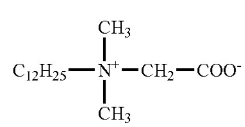

| | |
|---|---|
| Gum arabic | 10 g |
| Ammonium primary phosphate | 0.1 g |
| Citric acid | 0.1 g |
| Tetrasodium ethylenediaminetetraacetate | 0.1 g |
| 2-Bromo-2-nitropropane-1,3-diol | 0.001 g |
| 2-Methyl-4-isothiazolin-3-one | 0.001 g |

| Developer (3) | |
|---|---|
| Water | 100 g |
| Lauryl trimethyl ammonium chloride (Pionin B111, produced by Takemoto Oil & Fat Co., Ltd.) | 10 g |

-continued

| Developer (3) | |
|---|---|
| 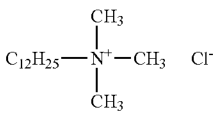 | |
| Gum arabic | 10 g |
| Ammonium primary phosphate | 0.1 g |
| Citric acid | 0.1 g |
| Tetrasodium ethylenediaminetetraacetate | 0.1 g |
| 2-Bromo-2-nitropropane-1,3-diol | 0.001 g |
| 2-Methyl-4-isothiazolin-3-one | 0.001 g |

| Developer (4) | |
|---|---|
| Water | 100 g |
| Alkyl diphenyloxide disulfonate (Dowfax 3B2, produced by Dow Chemical Co.) | 10 g |
| 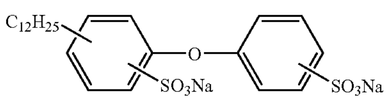 | |
| Gum arabic | 10 g |
| Ammonium primary phosphate | 0.1 g |
| Citric acid | 0.1 g |
| Tetrasodium ethylenediaminetetraacetate | 0.1 g |
| 2-Bromo-2-nitropropane-1,3-diol | 0.001 g |
| 2-Methyl-4-isothiazolin-3-one | 0.001 g |

| Developer (5) | |
|---|---|
| Water | 100 g |
| Gum arabic | 10 g |
| Ammonium primary phosphate | 0.1 g |
| Citric acid | 0.1 g |
| Tetrasodium ethylenediaminetetraacetate | 0.1 g |
| 2-Bromo-2-nitropropane-1,3-diol | 0.001 g |
| 2-Methyl-4-isothiazolin-3-one | 0.001 g |

The lithographic printing plate thus-obtained was mounted on a printing machine, SOR-M, produced by Heidelberg, and printing was performed at a printing speed of 6,000 sheets per hour using dampening water (EU-3 (etching solution, produced by Fuji Film Co., Ltd.))/water/isopropyl alcohol=1/89/10 (by volume ratio)) and TRANS-G(N) black ink (produced by Dai-Nippon Ink & Chemicals, Inc.).

(2) Evaluation

<Developing Property>

The lithographic printing plate precursor was subjected to the image exposure and development processing in the same manner as described above. After the development processing, the non-image area of the lithographic printing plate was visually observed and the residue of the photosensitive layer was evaluated. The evaluation was performed according to the following criteria:

O: No residue of the photosensitive layer and good developing property.

Δ: No problem in the developing property, although the slight residue of the photosensitive layer was present.

x: The photosensitive layer remained to cause development failure.

<Printing Image-Forming Property>

The lithographic printing plate was subjected to the printing in the same manner as described above. On the 1,000$^{th}$ printed material, stain in the non-image area and unevenness of halftone dot image (unevenness of ink density) were evaluated. The stain in the non-image area was evaluated according to the following criteria:

x: Case where ink stain occurred in the non-image area.

O: Case where no ink stain occurred in the non-image area.

The unevenness of halftone dot image was evaluated according to the following criteria:

x: Case where the unevenness of ink density occurred in the halftone dot image.

Δ: Case where although the slight unevenness of ink density occurred in the halftone dot image, it did not cause problem.

O: Case where no unevenness of ink density occurred in the halftone dot image and good image was obtained.

The results of the evaluation are shown in Table 12.

TABLE 12

| | | | | Printing Image-forming Property | |
|---|---|---|---|---|---|
| | Lithographic Printing Plate Precursor | Developer | Developing Property | Stain | Unevenness of Halftone Dot Image |
| Example 1 | (1) | (1) | ○ | ○ | ○ |
| Example 2 | (1) | (2) | ○ | ○ | ○ |
| Example 3 | (1) | (3) | ○ | ○ | ○ |
| Comparative Example 1 | (1) | (4) | X | X | Unable to perform evaluation |
| Comparative Example 2 | (1) | (5) | X | X | Unable to perform evaluation |

Example 4

Lithographic printing plate precursor (1) was subjected to image exposure by a violet semiconductor laser plate setter Vx9600 wherein the InGaN semiconductor laser (emission: 405 nm±10 mm/output: 30 mW) was replaced with a semiconductor laser having output of 100 mW. As for the image, halftone dots of 50% were drawn using an FM screen (TAFFETA 20, produced by Fuji Film Co., Ltd.) in a plate surface exposure amount of 0.25 mJ/cm$^2$ and at resolution of 2,438 dpi.

The exposed lithographic printing plate precursor was without performing the preheat, subjected to the development processing in the automatic development processor having a structure shown in FIG. 1 using Developer (1). The developing property and printing image-forming property were evaluated in the same manner as in Example 1 and the good results of the evaluation same as in Example 1 were obtained.

Examples 5 to 8 and Comparative Examples 3 to 4

The evaluation of developing property and printing image-forming property was conducted in the same manner as in Example 1 using each of Lithographic printing plate precursors (16) to (21). The results of the evaluation are shown in Table 13.

TABLE 13

| | Lithographic Printing Plate Precursor | Developer | Developing Property | Printing Image-forming Property: Stain | Printing Image-forming Property: Unevenness of Halftone Dot Image |
|---|---|---|---|---|---|
| Comparative Example 3 | (16) | (1) | X | X | Unable to perform evaluation |
| Example 5 | (17) | (1) | Δ | ○ | ○ |
| Example 6 | (18) | (1) | ○ | ○ | ○ |
| Comparative Example 4 | (19) | (1) | ○ | ○ | X |
| Example 7 | (20) | (1) | Δ | ○ | ○ |
| Example 8 | (21) | (1) | ○ | ○ | Δ |

Examples 9 to 22

The evaluation of developing property and printing image-forming property was conducted in the same manner as in Example 1 using each of Lithographic printing plate precursors (2) to (15). The results of the evaluation are shown in Table 14.

TABLE 14

| | Lithographic Printing Plate Precursor | Developer | Developing Property | Printing Image-forming Property: Stain | Printing Image-forming Property: Unevenness of Halftone Dot Image |
|---|---|---|---|---|---|
| Example 9 | (2) | (1) | ○ | ○ | ○ |
| Example 10 | (3) | (1) | ○ | ○ | ○ |
| Example 11 | (4) | (1) | ○ | ○ | Δ |
| Example 12 | (5) | (1) | ○ | ○ | ○ |
| Example 13 | (6) | (1) | ○ | ○ | ○ |
| Example 14 | (7) | (1) | ○ | ○ | ○ |
| Example 15 | (8) | (1) | ○ | ○ | ○ |
| Example 16 | (9) | (1) | ○ | ○ | Δ |
| Example 17 | (10) | (1) | ○ | ○ | ○ |
| Example 18 | (11) | (1) | ○ | ○ | ○ |
| Example 19 | (12) | (1) | ○ | ○ | ○ |
| Example 20 | (13) | (1) | ○ | ○ | Δ |
| Example 21 | (14) | (1) | ○ | ○ | Δ |
| Example 22 | (15) | (1) | ○ | ○ | Δ |

Examples 23 to 34 and Comparative Examples 5 to 10

The evaluation of developing property and printing image-forming property was conducted in the same manner as in Example 1 using each of the lithographic printing plate precursors and each of the developers shown in Table 15. The results of the evaluation are shown in Table 15.

TABLE 15

| | Lithographic Printing Plate Precursor | Developer | Developing Property | Printing Image-forming Property: Stain | Printing Image-forming Property: Unevenness of Halftone Dot Image |
|---|---|---|---|---|---|
| Example 23 | (5) | (2) | ○ | ○ | ○ |
| Example 24 | (8) | (2) | ○ | ○ | ○ |
| Example 25 | (9) | (2) | ○ | ○ | Δ |
| Example 26 | (11) | (2) | ○ | ○ | ○ |
| Example 27 | (12) | (2) | ○ | ○ | ○ |
| Example 28 | (15) | (2) | ○ | ○ | Δ |
| Example 29 | (5) | (3) | ○ | ○ | ○ |
| Example 30 | (8) | (3) | ○ | ○ | ○ |
| Example 31 | (9) | (3) | ○ | ○ | Δ |
| Example 32 | (11) | (3) | ○ | ○ | ○ |
| Example 33 | (12) | (3) | ○ | ○ | ○ |
| Example 34 | (15) | (3) | ○ | ○ | Δ |
| Comparative Example 5 | (5) | (4) | X | X | Unable to perform evaluation |
| Comparative Example 6 | (8) | (4) | X | X | Unable to perform evaluation |
| Comparative Example 7 | (9) | (4) | Δ | X | X |
| Comparative Example 8 | (11) | (4) | X | X | Unable to perform evaluation |
| Comparative Example 9 | (12) | (4) | Δ | X | X |
| Comparative Example 10 | (15) | (4) | Δ | X | X |

<Preparation of Lithographic Printing Plate Precursors (22) to (29)>

Lithographic printing plate precursors (22) to (29) were prepared in the same manner as in the preparation of Lithographic printing plate precursor (15) except for changing the composition of the coating solution for protective layer coated on the photosensitive layer to those shown in Table 16, respectively.

TABLE 16

Composition of coating solution for protective layer

| Component | (22) | (23) | (24) | (25) | (26) | (27) | (28) | (29) |
|---|---|---|---|---|---|---|---|---|
| | Lithographic Printing Plate Precursor | | | | | | | |
| PVA-205 | — | 2163.16 | 1778.16 | 1393.16 | 1063.16 | 678.16 | 293.16 | — |
| PVA-105 | — | — | 385.00 | 770.00 | 1100.00 | 1485.00 | 1870.00 | 2163.16 |
| PVA-405 | 2163.16 | — | — | — | — | — | — | — |
| Emalex 710 | 2.08 | 2.08 | 2.08 | 2.08 | 2.08 | 2.08 | 2.08 | 2.08 |

TABLE 16-continued

| Composition of coating solution for protective layer | | | | | | | | |
|---|---|---|---|---|---|---|---|---|
| | Lithographic Printing Plate Precursor | | | | | | | |
| Component | (22) | (23) | (24) | (25) | (26) | (27) | (28) | (29) |
| Water | 3333.14 | 3333.14 | 3333.14 | 3333.14 | 3333.14 | 3333.14 | 3333.14 | 3333.14 |
| Average Saponification Degree (value measured by $^{13}$C-NMR) | 81% by mole | 87.5% by mole | 89.5% by mole | 91.5% by mole | 93.5% by mole | 94.5% by mole | 97.0% by mole | 98.5% by mole |

PVA-205: Partially hydrolyzed polyvinyl alcohol produced by Kuraray Co., Ltd. (saponification degree = 86.5 to 89.5% by mole, viscosity = 4.6 to 5.4 mPa · s in a 4% by weight aqueous solution at 20° C.)
PVA-105: Fully hydrolyzed polyvinyl alcohol produced by Kuraray Co., Ltd. (saponification degree = 98.0 to 99.0% by mole, viscosity = 5.2 to 6.0 mPa · s in a 4% by weight aqueous solution at 20° C.)
PVA-405: Partially hydrolyzed polyvinyl alcohol produced by Kuraray Co., Ltd. (saponification degree = 88.0 to 83.0% by mole, viscosity = 4.4 to 5.2 mPa · s in a 4% by weight aqueous solution at 20° C.)
Emalex 710: Surfactant, polyxyethylene lauryl ether, produced by Nihon-Emulsion Co., Ltd.

Examples 35 to 42

The evaluation of the developing property and printing image-forming property was performed in the same manner as in Example 1 except for using Lithographic printing plate precursors (22) to (29) and varying the transporting speed of the lithographic printing plate precursor in the automatic development processor to 150 cm/min. The results of the evaluation are shown in Table 17.

TABLE 17

| | | | Printing Image-forming Property | |
|---|---|---|---|---|
| | Lithographic Printing Plate Precursor | Developing Property | Stain | Unevenness of Halftone Dot Image |
| Example 35 | (22) | ○ | ○ | ○ |
| Example 36 | (23) | ○ | ○ | ○ |
| Example 37 | (24) | ○ | ○ | ○ |
| Example 38 | (25) | ○ | ○ | ○ |
| Example 39 | (26) | ○ | ○ | Δ |
| Example 40 | (27) | ○ | ○ | Δ |
| Example 41 | (28) | ○ | ○ | Δ |
| Example 42 | (29) | Δ | ○ | Δ |

<Preparation of Lithographic Printing Plate Precursors (30) to (33)>

Lithographic printing plate precursors (30) to (33) were prepared in the same manner as in the preparation of Lithographic printing plate precursor (15) except for coating each of Undercoat solutions (1) to (4) having the composition shown below on the support using a bar and drying in an oven at 80° C. for 10 seconds to prepare a support provided with an undercoat layer having a dry coating amount of 10 mg/m², respectively.

| <Undercoat solution (1)> | |
|---|---|
| Undercoat compound (1) | 0.017 g |
| Methanol | 9.00 g |
| Water | 1.00 g |

| <Undercoat solution (2)> | |
|---|---|
| Undercoat compound (1) | 0.015 g |
| Undercoat compound (2) | 0.002 g |
| Methanol | 9.00 g |
| Water | 1.00 g |

| <Undercoat solution (3)> | |
|---|---|
| Undercoat compound (3) | 0.017 g |
| Methanol | 9.00 g |
| Water | 1.00 g |

| <Undercoat solution (4)> | |
|---|---|
| Undercoat compound (4) | 0.017 g |
| Methanol | 9.00 g |
| Water | 1.00 g |

Undercoat compound (1):

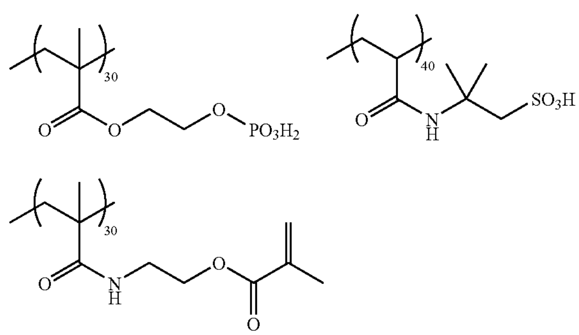

-continued

<Undercoat solution (4)>

Undercoat compound (2):

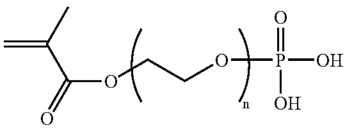

(n ≒ 4.5)

Undercoat compound (3):

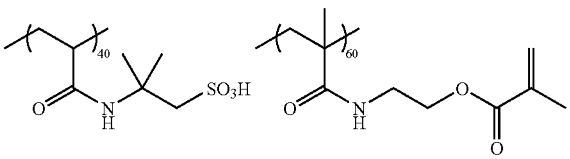

Undercoat compound (4):

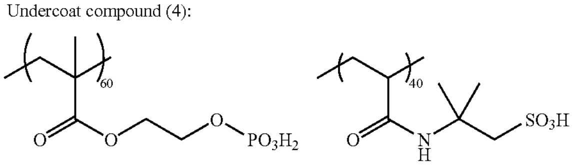

Examples 43 to 46

The evaluation of the developing property and printing image-forming property was performed in the same manner as in Example 1 except for using Lithographic printing plate precursors (30) to (33). Further, the printing was continued and a number of printed materials obtained until the ink density (reflection density) decreased by 0.1 from that at the initiation of printing was determined to evaluate printing durability. The results of evaluation are shown in Table 18.

TABLE 18

| | Lithographic Printing Plate Precursor | Developing Property | Printing Image-forming Property: Stain | Printing Image-forming Property: Unevenness of Halftone Dot Image | Printing Durability (sheets) |
|---|---|---|---|---|---|
| Example 43 | (30) | ○ | ○ | ○ | $12 \times 10^4$ |
| Example 44 | (31) | ○ | ○ | ○ | $15 \times 10^4$ |
| Example 45 | (32) | ○ | ○ | ○ | $10 \times 10^4$ |
| Example 46 | (33) | ○ | ○ | ○ | $10 \times 10^4$ |
| Example 22 | (15) | ○ | ○ | Δ | $10 \times 10^4$ |

<Preparation of Lithographic Printing Plate Precursor (34)>

Lithographic printing plate precursor (34) was prepared in the same manner as in the preparation of Lithographic printing plate precursor (15) except for changing the coating solution for protective layer to Coating solution (a) for protective layer shown below.

| <Coating solution (a) for protective layer> | |
|---|---|
| Dispersion of Mica (1) shown below | 0.6 g |
| Sulfonic acid-modified polyvinyl alcohol (Goseran CKS-50, produced by Nippon Synthetic Chemical Industry Co., Ltd., [saponification degree: 99% by mole, average polymerization degree: 300, modification degree: about 0.4% by mole]) | 0.8 g |
| Vinyl pyrrolidone/vinyl acetate (1/1) copolymer (molecular weight: 70,000) | 0.001 g |
| Surfactant (Emalex 710, produced by Nihon-Emulsion Co., Ltd.) | 0.002 g |
| Water | 13 g |

(Preparation of Dispersion of Mica (1))

In 368 g of water was added 32 g of synthetic mica (SOMASIF ME-100, produced by CO-OP Chemical Co., Ltd., aspect ratio: 1,000 or more) and dispersed using a homogenizer until the average particle diameter (measured by a laser scattering method) became 0.5 μm to obtain Dispersion of Mica (1).

<Preparation of Lithographic Printing Plate Precursors (35) to (37)>

Lithographic printing plate precursors (35) to (37) were prepared in the same manner as in the preparation of Lithographic Printing Plate Precursor (34) except for changing Coating solution (a) for protective layer to Coating solutions (b) to (d) for protective layer shown below, respectively.

| <Coating solutions (b) to (d) for protective layer> | |
|---|---|
| Sulfonic acid-modified polyvinyl alcohol (Goseran CKS-50, produced by Nippon Synthetic Chemical Industry Co., Ltd., [saponification degree: 99% by mole, average polymerization degree: 300, modification degree: about 0.4% by mole]) | Amount shown in Table 19 |
| Unmodified polyvinyl alcohol (PVA 105, produced by Kuraray Co., Ltd., [saponification degree: 98% by mole, average polymerization degree: 500]) | Amount shown in Table 19 |
| Vinyl pyrrolidone/vinyl acetate (1/1) copolymer (molecular weight: 70,000) | 0.001 g |
| Surfactant (Emalex 710, produced by Nihon-Emulsion Co., Ltd. | 0.002 g |
| Water | 13 g |

TABLE 19

| Lithographic Printing Plate Precursor | Coating Solution for Protective Layer | Sulfonic Acid-modified Polyvinyl Alcohol | Unmodified Polyvinyl Alcohol |
|---|---|---|---|
| (35) | (b) | 0.6 g | 0.2 g |
| (36) | (c) | 0.45 g | 0.35 g |
| (37) | (d) | 0.2 g | 0.6 g |

<Preparation of Lithographic Printing Plate Precursor (38)>

Lithographic printing plate precursor (38) was prepared in the same manner as in the preparation of Lithographic printing plate precursor (34) except for changing the sulfonic acid-modified polyvinyl alcohol in Coating solution (a) for protective layer to carboxy-modified polyvinyl alcohol (SK- 5102, produced by Kuraray Co., Ltd., [saponification degree: 98% by mole, average polymerization degree: 200, modification degree: 3% by mole]).

Examples 47 to 51

The evaluation of the developing property and printing image-forming property was performed in the same manner as in Example 1 except for using Lithographic printing plate precursors (34) to (38) and varying the transporting speed of the lithographic printing plate precursor in the automatic development processor to 150 cm/min. The results of the evaluation are shown in Table 20.

TABLE 20

| | Lithographic Printing Plate Precursor | Developing Property | Printing Image-forming Property: Stain | Printing Image-forming Property: Unevenness of Halftone Dot Image |
|---|---|---|---|---|
| Example 47 | (34) | ○ | ○ | ○ |
| Example 48 | (35) | ○ | ○ | ○ |
| Example 49 | (36) | ○ | ○ | ○ |
| Example 50 | (37) | ○ | ○ | Δ |
| Example 51 | (38) | ○ | ○ | ○ |

From the results shown above, it can be seen that according to the method for preparation of a lithographic printing plate of the invention wherein the binder polymer used in the photosensitive layer of the lithographic printing plate precursor and the surfactant used in the developer are used in combination, a lithographic printing plate can be obtained which provides a good printed material having no satin in the non-image area and no unevenness in the image area in spite of performing development with an aqueous near-neutral solution.

Reference Examples 1 to 4

Lithographic printing plate precursor (1) was subjected to image exposure in the same manner as in Example 1 and then subjected to development processing using an automatic processor (LP1250PLX, produced by Fuji Film Co., Ltd.). The automatic processor was composed of a heating unit, a water-washing unit, a developing unit, a rinsing unit and a finishing unit in this order. The heating condition in the heating unit was set to reach plate surface temperature 110° C. In the water-washing unit and the rinsing unit, water was supplied. In the developing unit, any one of Alkali Developers (i) to (iv) shown below was supplied. In the finishing unit, gum coating was carried out using a solution prepared by diluting a gum solution (FP-2W, produced by Fuji Film Co., Ltd.) twice with water, followed by drying with hot air, whereby a lithographic printing plate was obtained. The temperature of the developer was 28° C., the pH of the developer was 12, and the transportation of the lithographic printing plate precursor was performed at a transporting speed of 110 cm/min.

With the lithographic printing plate thus-obtained, the evaluation of developing property was performed in the same manner as in Example 1. The results of evaluation are shown in Table 22. The results indicate that in the alkali development, the alkali agent acts as the base agent for development and good developing property can be achieved regardless of the kind of surfactant.

| (Composition of alkali developer) | |
|---|---|
| Potassium hydroxide | 0.15 g |
| Surfactant shown in Table 21 | 5.0 g |
| Tetrasodium ethylenediaminetetraacetate | 0.1 g |
| Water | 94.75 g |

TABLE 21

| | Surfactant |
|---|---|
| Alkali Developer (i) | Polyoxyethylene laurylamino ether (Pionin D3110, produced by Takemoto Oil & Fat Co., Ltd.) |
| Alkali Developer (ii) | N-Lauryl dimethyl betaine (Pionin C157K, produced by Takemoto Oil & Fat Co., Ltd.) |
| Alkali Developer (iii) | Lauryl trimethyl ammonium chloride (Pionin B111, produced by Takemoto Oil & Fat Co., Ltd.) |
| Alkali Developer (iv) | Alkyl diphenyloxide disulfonate (Dowfax 3B2, produced by Dow Chemical Co.) |

TABLE 22

| | Lithographic Printing Plate Precursor | Alkali Developer | Developing Property |
|---|---|---|---|
| Reference Example 1 | (1) | (i) | ○ |
| Reference Example 2 | (1) | (ii) | ○ |
| Reference Example 3 | (1) | (iii) | ○ |
| Reference Example 4 | (1) | (iv) | ○ |

This application is based on Japanese Patent application JP 2006-355082, filed Dec. 28, 2006, and Japanese Patent application JP 2007-250070, filed Sep. 26, 2007, the entire contents of which are hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A method for preparation of a lithographic printing plate comprising:

exposing with a laser a lithographic printing plate precursor comprising a support and a photosensitive layer containing a sensitizing dye, a radical polymerization initiator, a radical polymerizable compound and a binder polymer; and subjecting the exposed lithographic printing plate precursor to development processing with a developer having pH of from 3 to 9 to remove an unexposed area of the photosensitive layer, wherein the binder polymer is a polymer having an acid value of from 20 to 200mg-KOH/g and the developer comprises a compound represented by one of the following formulae <1> and <2>:

<1>

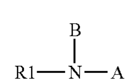

-continued

<2>

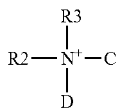

in the formula <1>, R1 represents a substituent having the following structure:

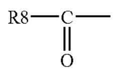

wherein R8 represents a hydrogen atom or an alkyl group; A represents a hydrogen atom, an alkyl group, a group containing an ethylene oxide group, a group containing a carboxylic acid group or a group containing a carboxylate; and B represents a group containing an ethylene oxide group, a group containing a carboxylic acid group or a group containing a carboxylate; and in the formula <2>, R2 and R3 each independently represents a hydrogen atom or an alkyl group, provided that at least one of the alkyl groups may have a substituent or a connecting group; C represents an alkyl group or a group containing an ethylene oxide group; and D represents a group containing an oxide anion.

2. A method for preparation of a lithographic printing plate comprising:

exposing with a laser a lithographic printing plate precursor comprising a support and a photosensitive layer containing a sensitizing dye, a radical polymerization initiator, a radical polymerizable compound and a binder polymer, wherein the amount of the binder polymer is from 20 to 80 % by weight based on the total weight of the nonvolatile components of the photosensitive layer; and subjecting the exposed lithographic printing plate precursor to development processing with a developer having pH of from 3 to 9 to remove an unexposed area of the photosensitive layer, wherein the binder polymer is a polymer having an aliphatic hydroxy group or an aromatic hydroxy group and the developer comprises a compound represented by one of the following formulae <1> and <2>:

<1>

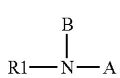

<2>

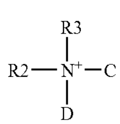

in the formula <1>, R1 represents a substituent having the following structure:

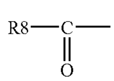

wherein R8 represents a hydrogen atom or an alkyl group; A represents a hydrogen atom, an alkyl group, a group containing an ethylene oxide group, a group containing a carboxylic acid group or a group containing a carboxylate; and B represents a group containing an ethylene oxide group, a group containing a carboxylic acid group or a group containing a carboxylate; and in the formula <2>, R2 and R3 each independently represents a hydrogen atom or an alkyl group, provided that at least one of the alkyl groups may have a substituent or a connecting group; C represents an alkyl group or a group containing an ethylene oxide group; and D represents a group containing an oxide anion.

3. The method for preparation of a lithographic printing plate as claimed in claim 2, wherein the polymer having an aliphatic hydroxy group or an aromatic hydroxy group is a polymer comprising at least one monomer unit selected from a group consisting of a hydroxyalkyl (meth)acrylate, allyl alcohol, hydroxystyrene and vinyl alcohol.

4. A method for preparation of a lithographic printing plate comprising:

exposing with a laser a lithographic printing plate precursor comprising a support and a photosensitive layer containing a sensitizing dye, a radical polymerization initiator, a radical polymerizable compound and a binder polymer, wherein the amount of the binder polymer is from 20 to 80 % by weight based on the total weight of the nonvolatile components of the photosensitive layer; and subjecting the exposed lithographic printing plate precursor to development processing with a developer having pH of from 3 to 9 to remove an unexposed area of the photosensitive layer, wherein the binder polymer is a polymer comprising at least one monomer unit selected from a group consisting of vinyl caprolactam, vinyl pyrrolidone and an alkylated vinyl pyrrolidone and the developer comprises a compound represented by one of the following formulae <1> and <2>:

<1>

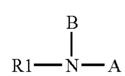

<2>

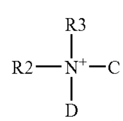

<3>

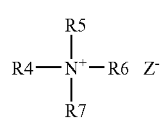

in the formula <1>, R1 represents a substituent having the following structure:

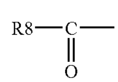

wherein R8 represents a hydrogen atom or an alkyl group; A represents a hydrogen atom, an alkyl group, a group containing an ethylene oxide group, a group containing a carboxylic acid group or a group containing a carboxylate; and B represents a group containing an ethylene oxide group, a group containing a carboxylic acid group or a group containing a carboxylate; and in the formula <2>, R2 and R3 each independently represents a hydrogen atom or an alkyl group, provided that at least one of the alkyl groups may have a substituent or a connecting group; C represents an alkyl group or a group containing an ethylene oxide group; and D represents a group containing an oxide anion.

5. The method for preparation of a lithographic printing plate as claimed in claim 1, 2 or 4, wherein a ratio of weight of the radical polymerizable compound to weight of the binder polymer contained in the photosensitive layer is from 2 to 4.

6. The method for preparation of a lithographic printing plate as claimed in claim 1, 2 or 4, wherein the radical polymerization initiator is a hexaarylbiimidazole compound.

7. The method for preparation of a lithographic printing plate as claimed in claim 1, 2 or 4, wherein the sensitizing dye has an absorption maximum in a wavelength range of from 350 to 450 nm.

8. The method for preparation of a lithographic printing plate as claimed in claim 1, 2 or 4, wherein the sensitizing dye is a compound represented by the following formula (I) or (II):

(I)

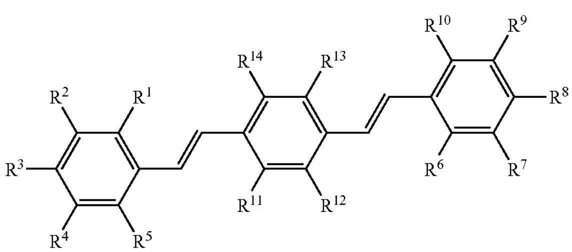

(II)

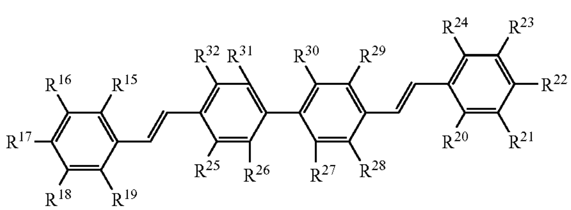

in the formula (I), $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms; and in the formula (II), $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

9. The method for preparation of a lithographic printing plate as claimed in claim 1, 2 or 4, wherein the pH of the developer is from 4 to 8.

10. The method for preparation of a lithographic printing plate as claimed in claim 1, 2 or 4, wherein the lithographic printing plate precursor further comprises a protective layer containing at least one polyvinyl alcohol so that the support, the photosensitive layer and the protective layer are provided in this order, and an average saponification degree of the whole polyvinyl alcohol contained in the protective layer is in a range of from 70 to 93% by mole.

11. The method for preparation of a lithographic printing plate as claimed in claim 1, 2 or 4, wherein the lithographic printing plate precursor further comprises a protective layer containing at least one polyvinyl alcohol so that the support, the photosensitive layer and the protective layer are provided in this order, and the lithographic printing plate precursor is exposed with a laser and without undergoing a water washing step, subjected to development processing with a developer having pH of from 3 to 9 to remove the protective layer and an unexposed area of the photosensitive layer.

12. The method for preparation of a lithographic printing plate as claimed in claim 1, 2 or 4, wherein the lithographic printing plate precursor further comprises an undercoat layer so that the support, the undercoat layer and the photosensitive layer are provided in this order, and the undercoat layer contains a polymer compound including an ethylenically unsaturated bond group, a functional group capable of interacting with a surface of the support and a hydrophilic group.

13. A method for preparation of a lithographic printing plate comprising:

exposing with a laser a lithographic printing plate precursor comprising a support and a photosensitive layer containing a sensitizing dye, a radical polymerization initiator, a radical polymerizable compound and a binder polymer; and subjecting the exposed lithographic printing plate precursor to development processing with a developer having pH of from 3 to 9 to remove an unexposed area of the photosensitive layer, wherein the binder polymer is a polymer having an acid value of from 10 to 250 mg-KOH/g and the developer comprises a compound represented by one of the following formulae <1> and <2>:

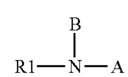

<1>

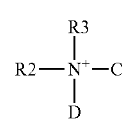

<2> in the formula <1>, R1 represents a substituent having the following structure:

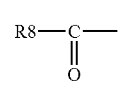

wherein R8 represents a hydrogen atom or an alkyl group; A represents a hydrogen atom, an alkyl group, a group containing an ethylene oxide group, a group containing a carboxylic acid group or a group containing a carboxylate; and B represents a group containing an ethylene oxide group, a group containing a carboxylic acid group or a group containing a carboxylate; and in the formula <2>, R2 and R3 each independently represents a hydrogen atom or an alkyl group, provided that at least one of the alkyl groups may have a substituent or a connecting group; C represents an alkyl group or a group containing an ethylene oxide group; and D represents a group containing a carboxylic acid anion.

14. A method for preparation of a lithographic printing plate comprising:

exposing with a laser a lithographic printing plate precursor comprising a support and a photosensitive layer containing a sensitizing dye, a radical polymerization initiator, a radical polymerizable compound and a binder polymer; and subjecting the exposed lithographic printing plate precursor to development processing with a developer having pH of from 3 to 9 to remove an unexposed area of the photosensitive layer, wherein the binder polymer is a polymer having an aliphatic hydroxy group or an aromatic hydroxy group and the developer comprises a compound represented by one of the following formulae <1> and <2>:

<1>

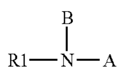

<2>

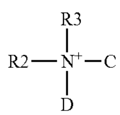

in the formula <1>, R1 represents a substituent having the following structure:

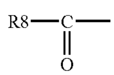

wherein R8 represents a hydrogen atom or an alkyl group; A represents a hydrogen atom, an alkyl group, a group containing an ethylene oxide group, a group containing a carboxylic acid group or a group containing a carboxylate; and B represents a group containing an ethylene oxide group, a group containing a carboxylic acid group or a group containing a carboxylate; and in the formula <2>, R2 and R3 each independently represents a hydrogen atom or an alkyl group, provided that at least one of the alkyl groups may have a substituent or a connecting group; C represents an alkyl group or a group containing an ethylene oxide group; and D represents a group containing a carboxylic acid anion.

15. A method for preparation of a lithographic printing plate comprising:

exposing with a laser a lithographic printing plate precursor comprising a support and a photosensitive layer containing a sensitizing dye, a radical polymerization initiator, a radical polymerizable compound and a binder polymer; and subjecting the exposed lithographic printing plate precursor to development processing with a developer having pH of from 3 to 9 to remove an unexposed area of the photosensitive layer, wherein the binder polymer is a polymer comprising at least one monomer unit selected from a group consisting of vinyl caprolactam, vinyl pyrrolidone and an alkylated vinyl pyrrolidone and the developer comprises a compound represented by one of the following formulae <1> and <2>:

<1>

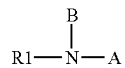

<2>

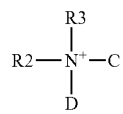

in the formula <1>, R1 represents a substituent having the following structure:

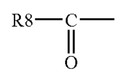

wherein R8 represents a hydrogen atom or an alkyl group; A represents a hydrogen atom, an alkyl group, a group containing an ethylene oxide group, a group containing a carboxylic acid group or a group containing a carboxylate; and B represents a group containing an ethylene oxide group, a group containing a carboxylic acid group or a group containing a carboxylate; and in the formula <2>, R2 and R3 each independently represents a hydrogen atom or an alkyl group, provided that at least one of the alkyl groups may have a substituent or a connecting group; C represents an alkyl group or a group containing an ethylene oxide group; and D represents a group containing a carboxylic acid anion.

16. The method for preparation of a lithographic printing plate as claimed in claim 12, 14 or 15, wherein the lithographic printing plate precursor further comprises a protective layer containing at least one acid-modified polyvinyl alcohol on the photosensitive layer.

17. The method for preparation of a lithographic printing plate as claimed in claim 16, wherein a content of the acid-modified polyvinyl alcohol is 50% by weight or more of a total solid content of the protective layer.

18. The method for preparation of a lithographic printing plate as claimed in claim 16, wherein the acid-modified polyvinyl alcohol is a carboxy-modified polyvinyl alcohol or a sulfonic acid-modified polyvinyl alcohol.

* * * * *